United States Patent
Tanaka et al.

(10) Patent No.: US 10,833,096 B2
(45) Date of Patent: Nov. 10, 2020

(54) SEMICONDUCTOR DEVICE

(71) Applicant: Toshiba Memory Corporation, Minato-ku (JP)

(72) Inventors: Ryo Tanaka, Yokkaichi (JP); Hiroyuki Yamasaki, Nagoya (JP); Hideaki Harakawa, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 169 days.

(21) Appl. No.: 16/118,583

(22) Filed: Aug. 31, 2018

(65) Prior Publication Data

US 2019/0287994 A1  Sep. 19, 2019

(30) Foreign Application Priority Data

Mar. 19, 2018 (JP) ................. 2018-051485

(51) Int. Cl.
| | |
|---|---|
| *H01L 27/11582* | (2017.01) |
| *H01L 29/10* | (2006.01) |
| *H01L 29/06* | (2006.01) |
| *H01L 29/04* | (2006.01) |
| *H01L 27/11565* | (2017.01) |
| *H01L 29/16* | (2006.01) |

(Continued)

(52) U.S. Cl.
CPC .... *H01L 27/11582* (2013.01); *H01L 27/1157* (2013.01); *H01L 27/11565* (2013.01); *H01L 29/04* (2013.01); *H01L 29/0649* (2013.01); *H01L 29/1037* (2013.01); *H01L 29/16* (2013.01); *H01L 21/0262* (2013.01); *H01L 21/02532* (2013.01); *H01L 21/02595* (2013.01); *H01L 21/02636* (2013.01); *H01L 21/26513* (2013.01); *H01L 21/31116* (2013.01)

(58) Field of Classification Search
None
See application file for complete search history.

(56) References Cited

U.S. PATENT DOCUMENTS

| | | |
|---|---|---|
| 8,198,667 B2 | 6/2012 | Kuniya et al. |
| 8,330,216 B2 | 12/2012 | Komori et al. |

(Continued)

FOREIGN PATENT DOCUMENTS

| | | |
|---|---|---|
| JP | 2008-72051 | 3/2008 |
| JP | 2009-135324 | 6/2009 |

(Continued)

*Primary Examiner* — Mounir S Amer
(74) *Attorney, Agent, or Firm* — Oblon, McClelland, Maier & Neustadt, L.L.P.

(57) ABSTRACT

According to one embodiment, a semiconductor device includes: a first pillar penetrating a first stack and including a first insulator, a first portion of a first semiconductor provided on an upper and an outer side surface of the first insulator, a second insulator provided on an outer side surface of the first portion, and a second portion being provided above the first stack, being coupled to an upper surface of the first portion, and including a lower surface greater than the upper surface of the first portion; an oxide film provided on a side surface of the second portion; and a second pillar penetrating a second stack and including a second semiconductor electrically coupled to the first semiconductor, and a third insulator on an outer side surface of the second semiconductor.

9 Claims, 48 Drawing Sheets

(51) Int. Cl.
  *H01L 27/1157* (2017.01)
  *H01L 21/265* (2006.01)
  *H01L 21/02* (2006.01)
  *H01L 21/311* (2006.01)

(56) References Cited

U.S. PATENT DOCUMENTS

| | | | |
|---|---|---|---|
| 9,431,419 | B2 | 8/2016 | Fukuzumi et al. |
| 10,290,650 | B1 * | 5/2019 | Iwai ................. H01L 27/11556 |
| 2008/0067583 | A1 | 3/2008 | Kidoh et al. |
| 2009/0146190 | A1 | 6/2009 | Fukuzumi et al. |
| 2009/0146206 | A1 | 6/2009 | Fukuzumi et al. |
| 2010/0276743 | A1 | 11/2010 | Kuniya et al. |
| 2012/0241866 | A1 | 9/2012 | Yamasaki |
| 2015/0255486 | A1 | 9/2015 | Kameoka et al. |
| 2017/0133397 | A1 | 5/2017 | Lee |
| 2019/0027489 | A1 * | 1/2019 | Orimoto ........... H01L 27/11575 |
| 2019/0057975 | A1 * | 2/2019 | Kim ................. H01L 27/11524 |
| 2020/0066749 | A1 * | 2/2020 | Yamasaki ......... H01L 27/11582 |

FOREIGN PATENT DOCUMENTS

| | | |
|---|---|---|
| JP | 2009-135328 | 6/2009 |
| JP | 2010-21191 | 1/2010 |
| JP | 2012-204838 | 10/2012 |

* cited by examiner

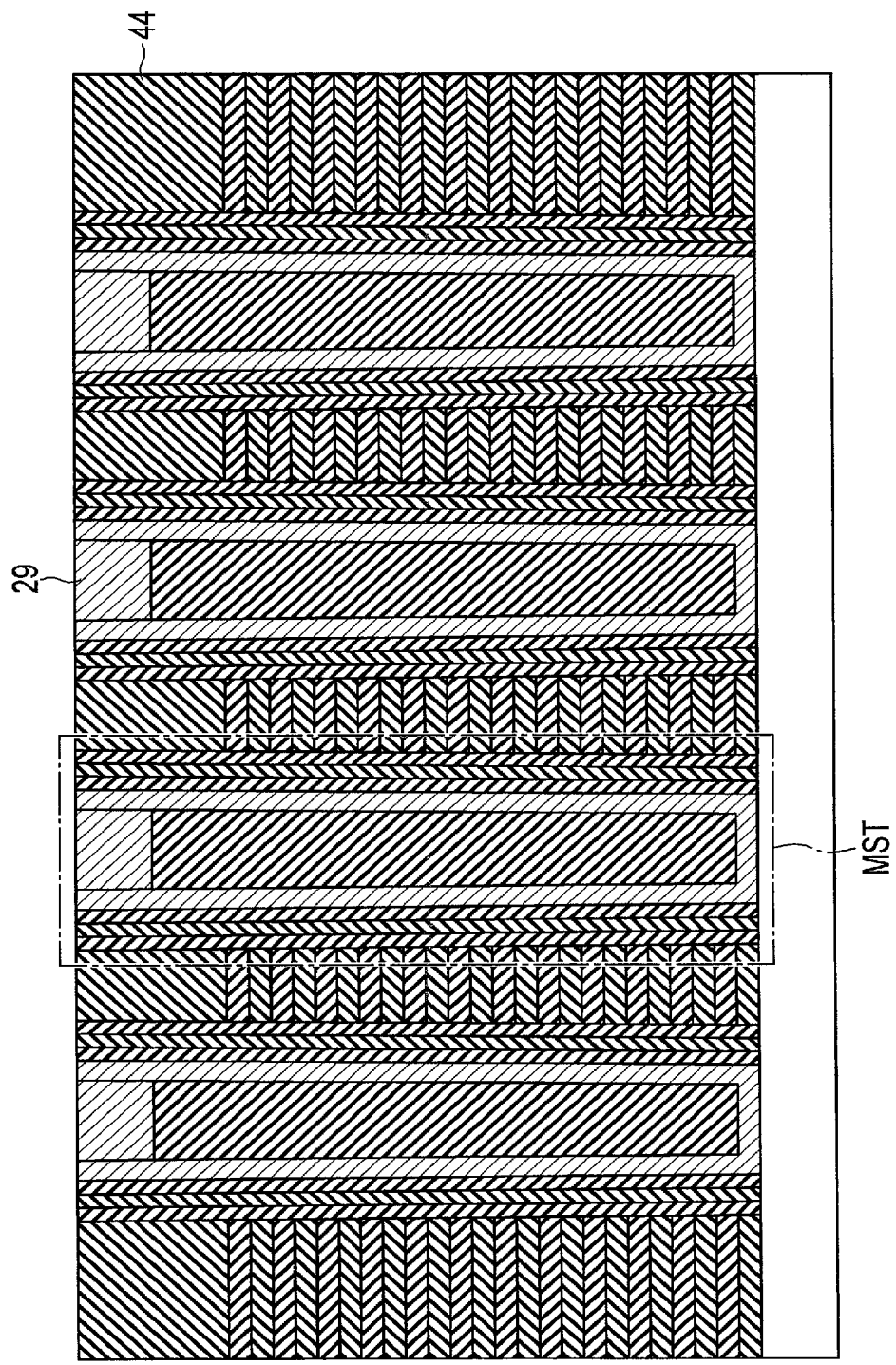
F I G. 7

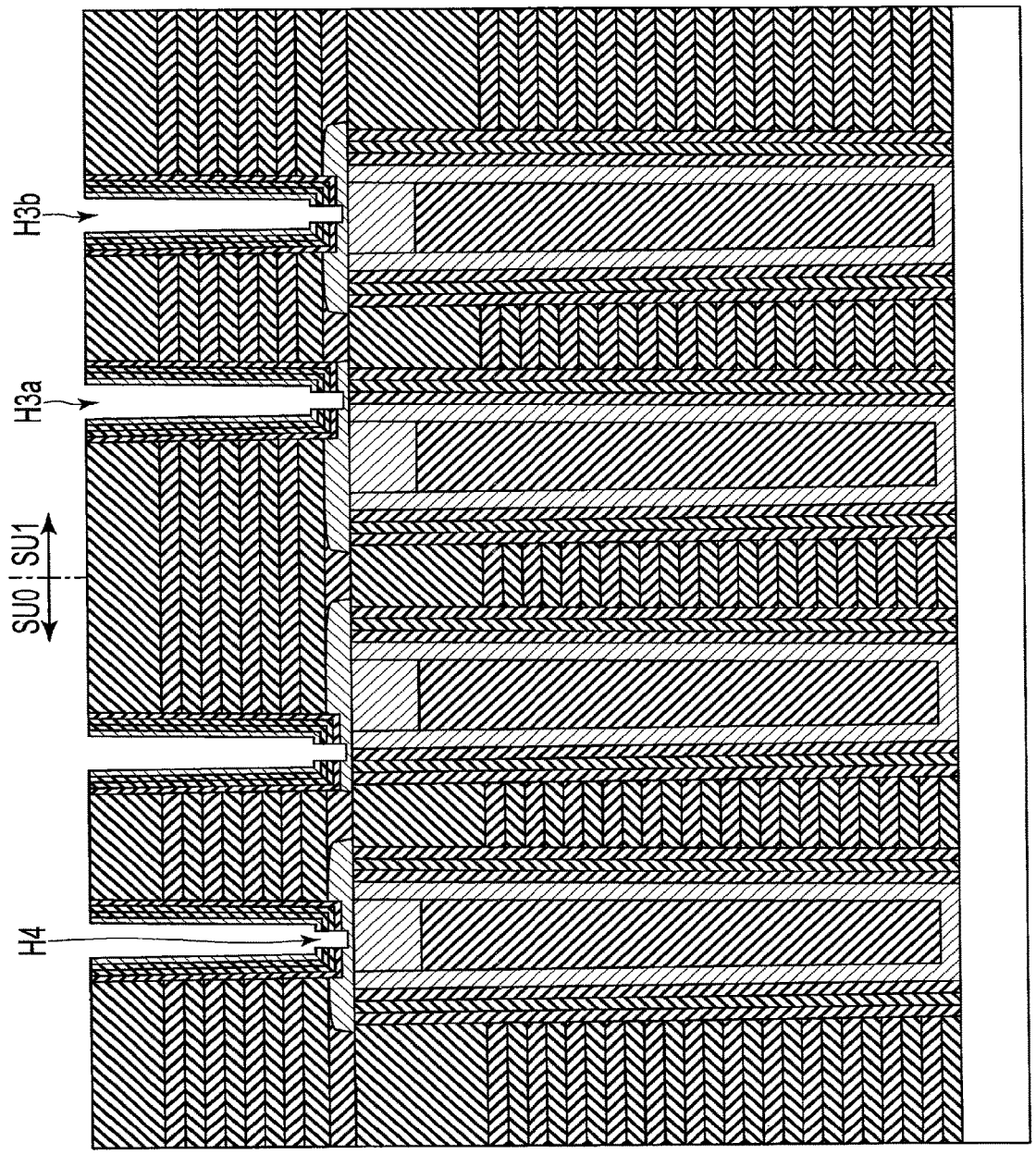
F I G. 14

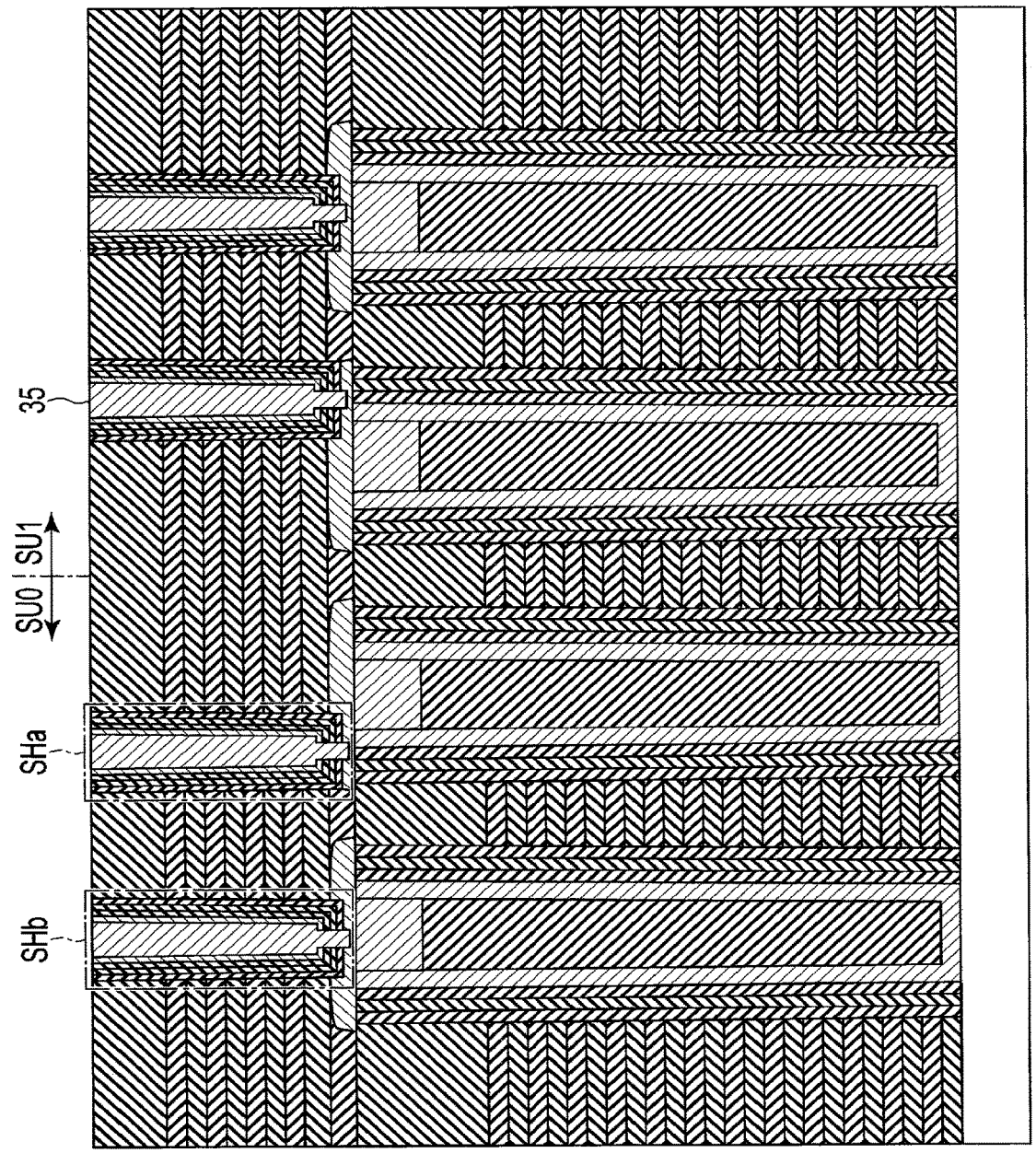
F I G. 15

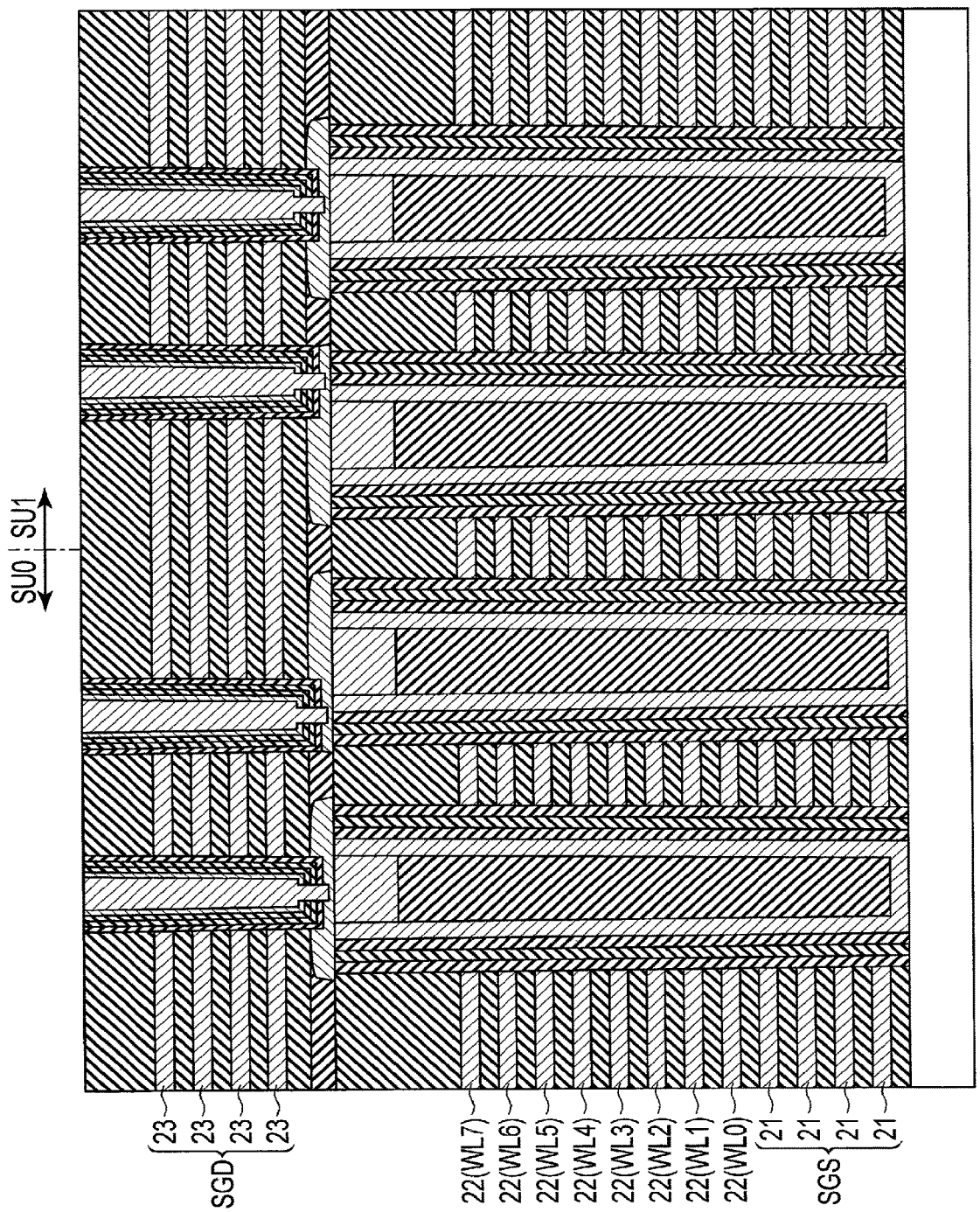
F I G. 16

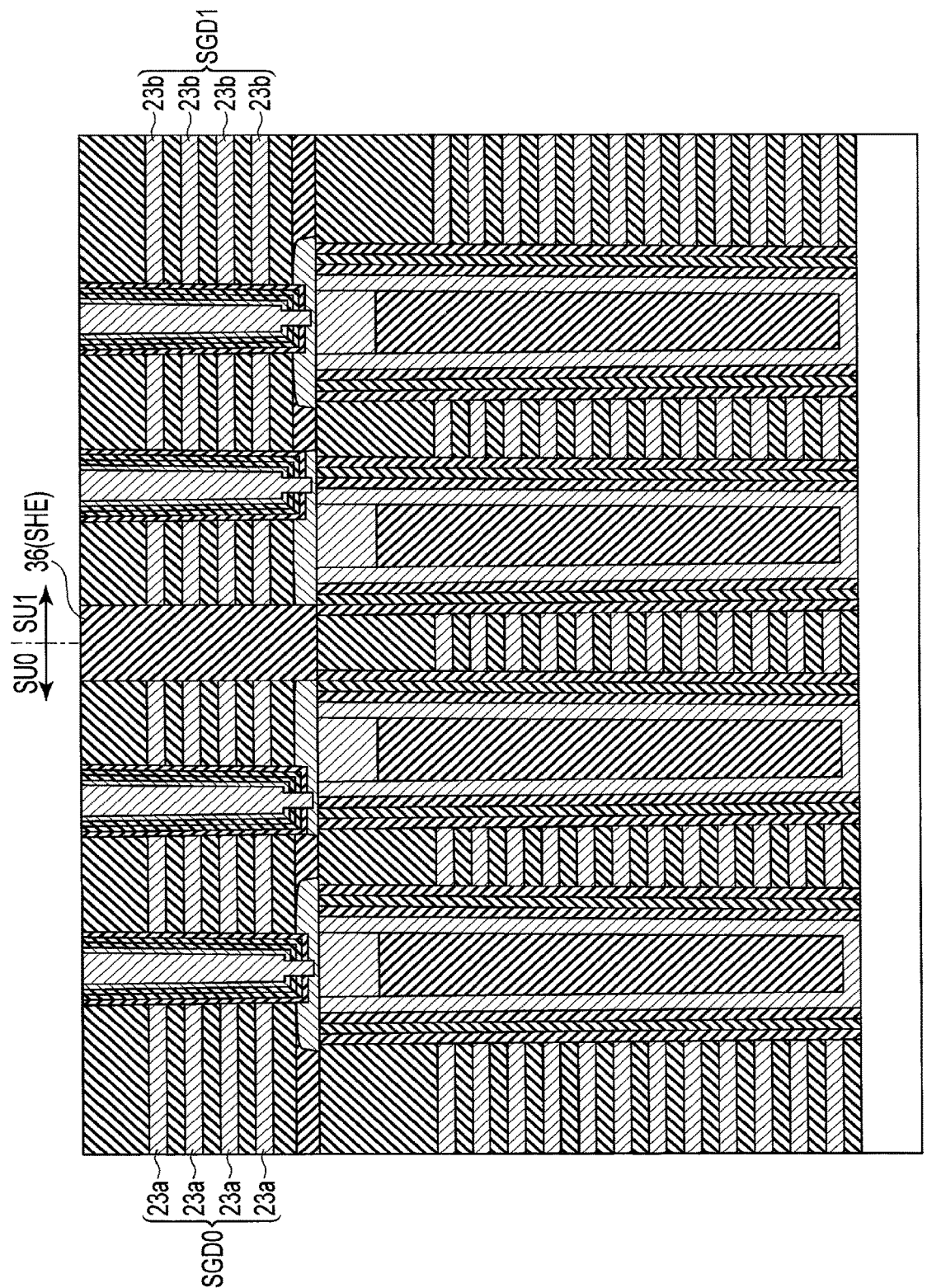
F I G. 17

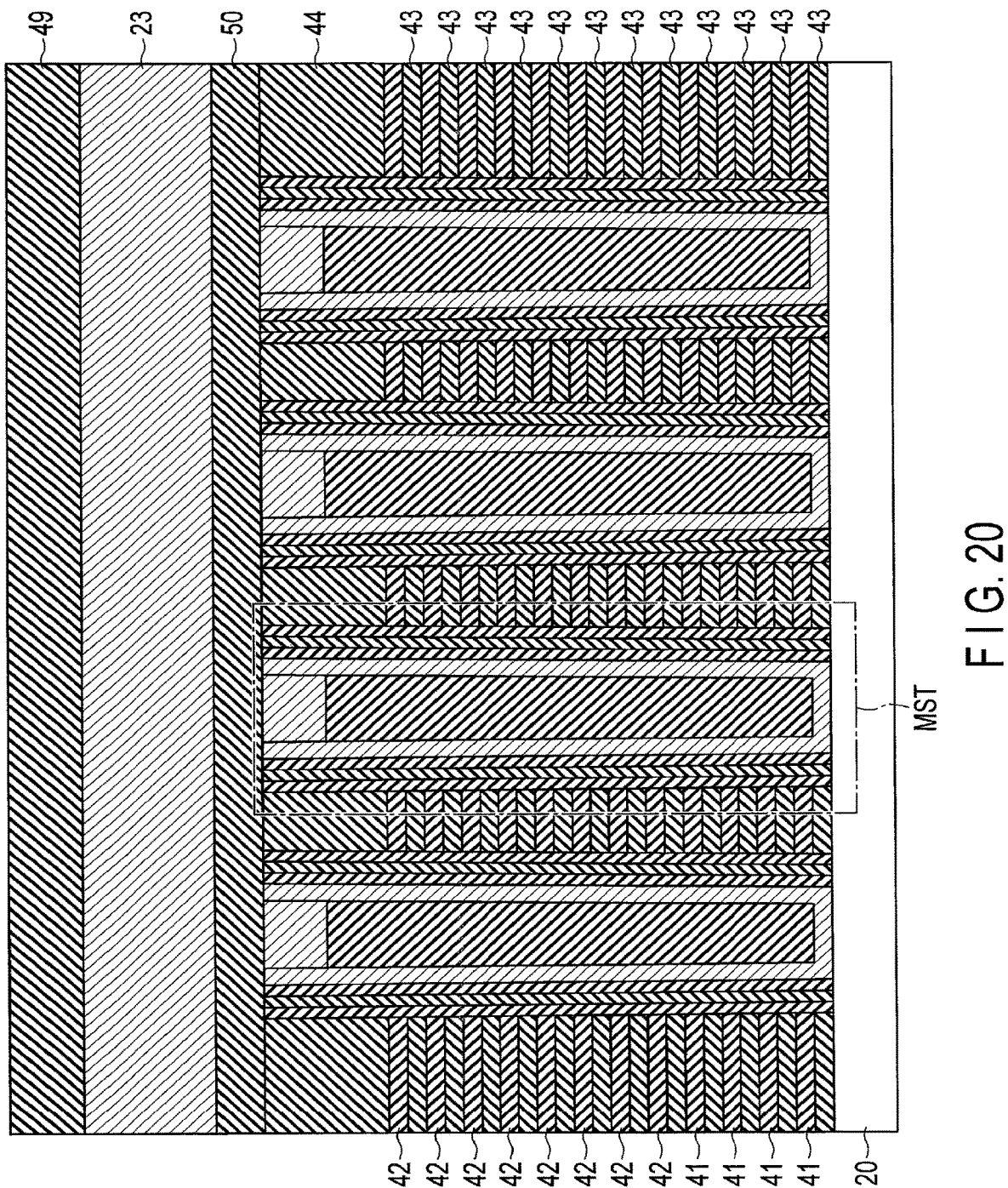
F I G. 20

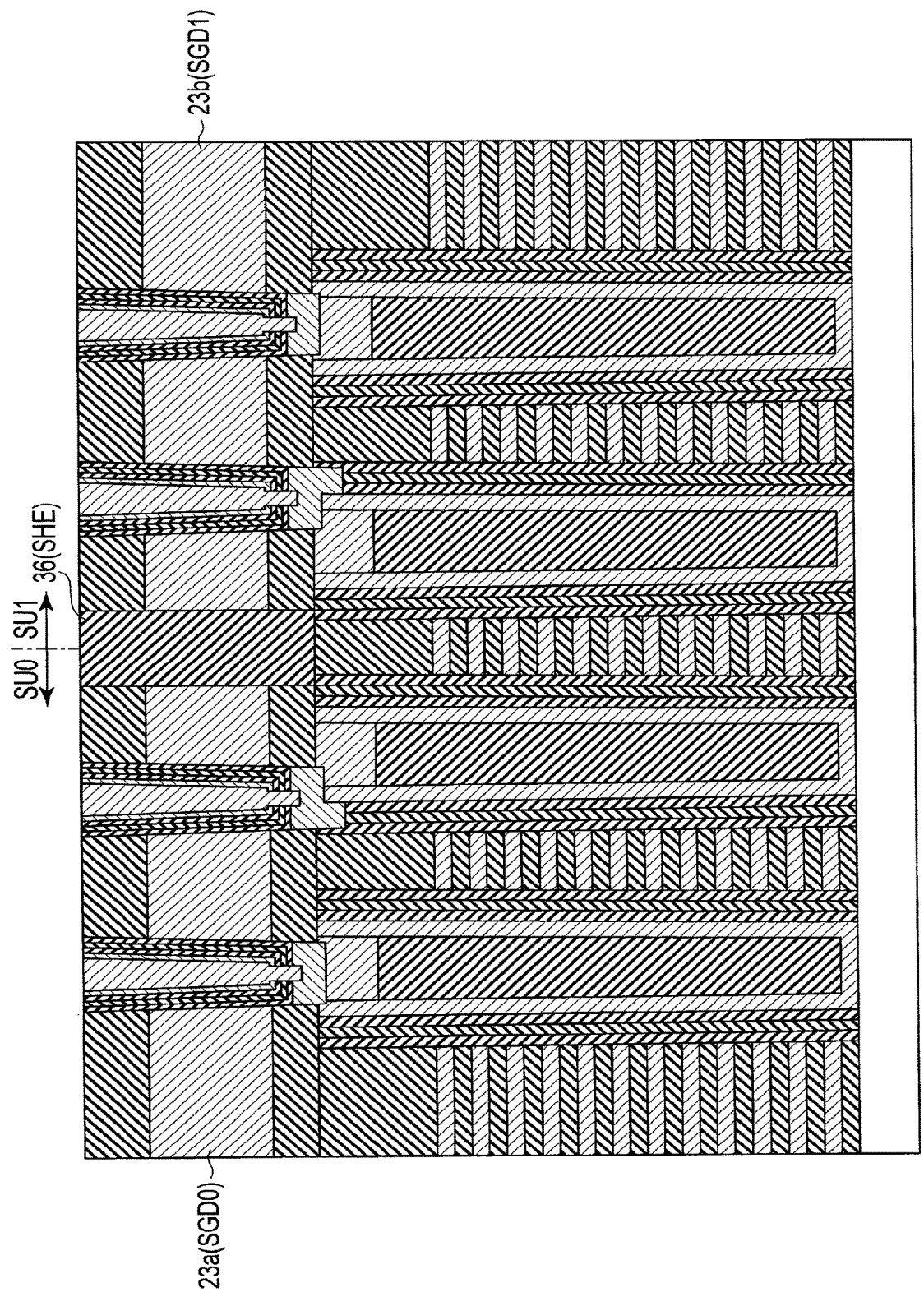
F I G. 29

SEMICONDUCTOR DEVICE

CROSS-REFERENCE TO RELATED APPLICATIONS

This application is based upon and claims the benefit of priority from Japanese Patent Application No. 2018-051485, filed Mar. 19, 2018, the entire contents of which are incorporated herein by reference.

FIELD

Embodiments described herein relate generally to a semiconductor device.

BACKGROUND

A NAND-type flash memory including memory cells that are stacked three-dimensionally is known.

BRIEF DESCRIPTION OF THE DRAWINGS

FIG. 7 is a cross-sectional view for explaining a manufacturing method of the memory cell array of the semiconductor memory according to the first embodiment.

FIG. 14 is a cross-sectional view for explaining a manufacturing method of the memory cell array of the semiconductor memory according to the first embodiment.

FIG. 15 is a cross-sectional view for explaining a manufacturing method of the memory cell array of the semiconductor memory according to the first embodiment.

FIG. 16 is a cross-sectional view for explaining a manufacturing method of the memory cell array of the semiconductor memory according to the first embodiment.

FIG. 17 is a cross-sectional view for explaining a manufacturing method of the memory cell array of the semiconductor memory according to the first embodiment.

FIG. 20 is a cross-sectional view for explaining a manufacturing method of the memory cell array of the semiconductor memory according to the second embodiment.

FIG. 29 is a cross-sectional view for explaining a manufacturing method of the memory cell array of the semiconductor memory according to the second embodiment.

DETAILED DESCRIPTION

In general, according to one embodiment, a semiconductor device includes: a substrate; a first stack body which is provided above the substrate and in which a first insulation layer and a first conductive film are alternately stacked; a first pillar provided to penetrate the first stack body in a direction in which the first insulation layer and the first conductive film are stacked, the first pillar including a first insulator, a first portion of a first semiconductor provided on an upper surface and an outer side surface of the first insulator, a second insulator provided on an outer side surface of the first portion of the first semiconductor, and a second portion of the first semiconductor that is provided above the first stack body, that is coupled to an upper surface of the first portion of the first semiconductor, and that includes a lower surface greater than the upper surface of the first portion of the first semiconductor; an oxide film provided on a side surface of the second portion of the first semiconductor; a second stack body which is provided above the second portion of the first semiconductor and the oxide film and in which a second insulation layer and a second conductive film are stacked; and a second pillar provided to penetrate the second stack body in a direction in which the second insulation layer and the second conductive film are stacked, the second pillar including a second semiconductor electrically coupled to the first semiconductor and a third insulator provided on an outer side surface of the second semiconductor.

Hereinafter, embodiments will be described with reference to the accompanying drawings. The drawings are schematic. Each embodiment is an example of an apparatus or a method to embody the technical idea of the invention. In the explanation that follows, constituent elements having the same functions and configurations will be denoted by the same reference symbols. The numbers after the letters constituting the reference symbols are used to discriminate elements which are denoted by the reference symbols including the same letters and which have similar configurations. If there is no need of mutually distinguishing the elements which are denoted by the reference symbols that include the same letters, the same elements are denoted by the reference symbols that include only the same letters.

1. First Embodiment

A semiconductor memory according to a first embodiment will be described below.

1. 1 Configuration 1. 1. 1 Configuration of Semiconductor Memory

Figure 1:
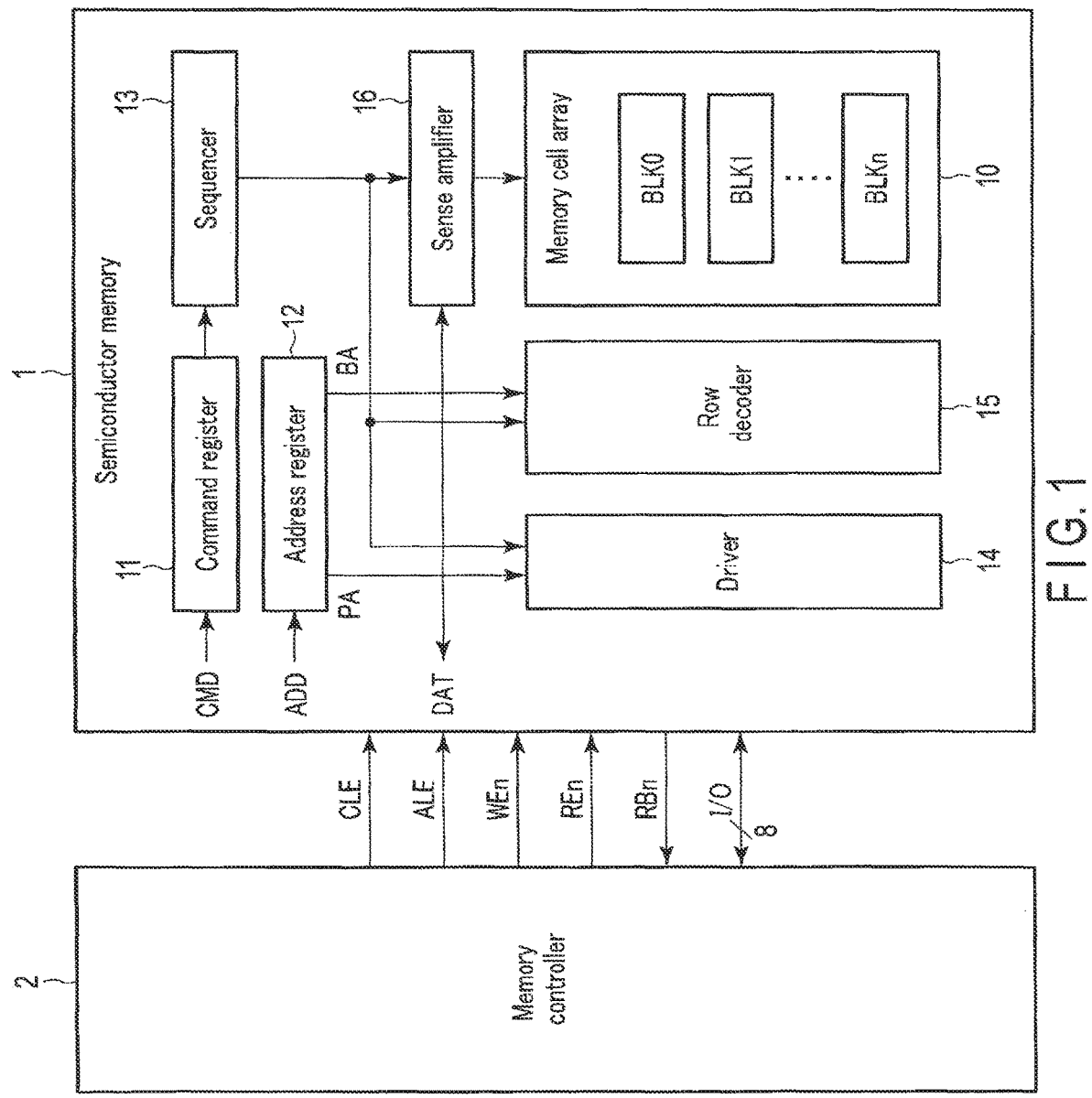
FIG. 1 is a block diagram for explaining a configuration of a semiconductor memory according to a first embodiment.

FIG. 1 is a block diagram for explaining a configuration of the semiconductor memory according to the first embodiment. As shown in FIG. 1, a semiconductor memory 1 is a NAND-type flash memory that is capable of storing data in a non-volatile manner, for example. The semiconductor memory 1 includes, for example, a memory cell array 10, a command register 11, an address register 12, a sequencer 13, a driver 14, a row decoder 15, and a sense amplifier 16.

The memory cell array 10 includes a plurality of blocks BLK0 to BLKn (n is an integer equal to or greater than 1). A block BLK is a set of non-volatile memory cells, and is, for example, a unit of data erasure. In the memory cell array 10, a plurality of bit lines and a plurality of word lines are provided, and each memory cell is associated with one bit line and one word line. The configuration of the memory cell array 10 will be described later in detail.

The command register 11 retains a command CMD that is received by the semiconductor memory 1 from an external memory controller 2. The command CMD includes instructions to cause the sequencer 13 to execute a read operation and a write operation, for example.

The address register 12 retains address information ADD that is received by the semiconductor memory 1 from the memory controller 2. The address information ADD includes, for example, a block address BA and a page address PA. The block address BA is used to select a block BLK that includes a memory cell that is a target for various types of operations. The page address PA is used to select a word line associated with a memory cell that is a target for various types of operations.

The sequencer 13 controls the operation of the entire semiconductor memory 1 based on the command CMD retained in the command register 11. For example, the sequencer 13 controls the driver 14, the row decoder 15, and the sense amplifier 16 to perform a write operation for data DAT received from the memory controller 2.

The driver 14 generates a desired voltage based on the control of the sequencer 13. Subsequently, the driver 14 respectively applies, to corresponding signal lines, a voltage to be applied to a word line that is selected, for example, based on a page address PA retained in the address register 12, and a voltage to be applied to word lines that are not selected.

The row decoder 15 selects one block BLK based on a block address BA retained in the address register 12. The row decoder 15 then applies the voltage that is applied to each signal line by the driver 14 to each of the selected word line and the unselected word lines, for example.

The sense amplifier 16 applies a desired voltage to each bit line in accordance with write data DAT received from the memory controller 2. The sense amplifier 16 determines data stored in a memory cell based on the voltage of the bit line, and transmits the determined read data DAT to the memory controller 2.

In the communications between the semiconductor memory 1 and the memory controller 2 are supported by, for example, a NAND interface standard. For example, the memory controller 2 transmits a command latch enable signal CLE, an address latch enable signal ALE, a write enable signal WEn, and a read enable signal REn, receives a ready/busy signal RBn, and transmits and receives an input/output signal I/O. The signal CLE is a signal notifying the semiconductor memory 1 that the received signal I/O is a command CMD. The signal ALE is a signal notifying the semiconductor memory 1 that the received signal I/O is address information ADD. The signal WEn is a signal instructing the semiconductor memory 1 to input the signal I/O. The signal REn is a signal instructing the semiconductor memory 1 to output the signal I/O. The signal RBn is a signal notifying the memory controller 2 of whether the semiconductor memory 1 is in a ready state in which a command from the memory controller 2 can be received, or in a busy state in which a command cannot be received. The signal I/O is, for example, an 8-bit signal, and may include a command CMD, address information ADD, write data DAT, read data DAT, etc.

The semiconductor memory 1 and the memory controller 2 as explained above may constitute one semiconductor device by a combination thereof. Examples of such a semiconductor device may include a memory card, such as an SD™ card, a solid state drive (SSD), etc.

1. 1. 2 Circuit Configuration of Memory Cell Array

Figure 2:
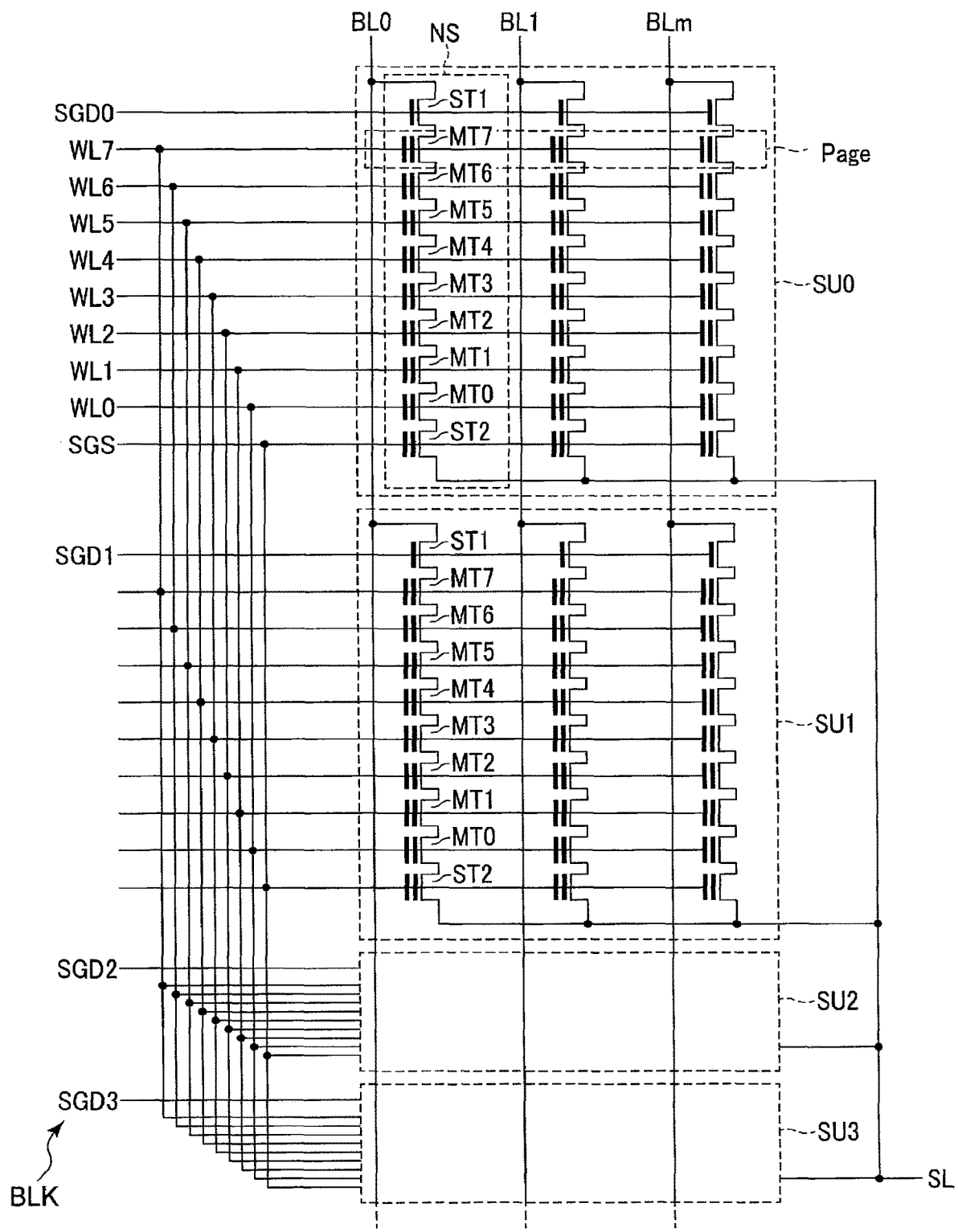
FIG. 2 is a circuit diagram for explaining a configuration of a memory cell array of the semiconductor memory according to the first embodiment.

FIG. 2 shows an example of a circuit configuration of the memory cell array 10 according to the first embodiment. The circuit configuration of the memory cell array 10 according to the first embodiment will be explained below, focusing on one block BLK.

A block BLK includes, for example, four string units, SU0 to SU3, as shown in FIG. 2 as an example. Each string unit SU includes a plurality of NAND strings NS that are respectively associated with the bit lines BL0 to BLm (m is an integer equal to or greater than 1). A NAND string NS includes, for example, eight memory cell transistors MT0 to MT7 and selection transistors ST1 and ST2.

Each memory cell transistor MT is provided with a control gate and a charge storage layer, and stores data in a nonvolatile manner. The memory cell transistors MT0 to MT7 included in each NAND string NS are coupled in series between a source of the selection transistor ST1 and a drain of the selection transistor ST2. The control gates of the memory cell transistors MT0 to MT7 in the same block BLK are respectively coupled to the word lines WL0 to WL7 in common. A set of one-bit data that is stored in the plurality of memory cell transistors MT coupled in common to a word line WL in each string unit SU is called a "page".

The selection transistors ST1 and ST2 are used to select a string unit SU at the time of various types of operations. The gates of the selection transistors ST1 included in the string units SU0 to SU3 in the same block BLK are respectively coupled in common to the selection gate lines SGD0 to SGD3. The drains of the selection transistors ST1 in the same column in each block BLK are coupled in common to the corresponding bit line BL. The gates of the selection transistors ST2 in the same block BLK are coupled in common to a selection gate line SGS. The sources of the selection transistors ST2 in the each block BLK are coupled in common to a source line SL between multiple blocks BLK.

The circuit configuration of the memory cell array 10 is not limited to the configuration described above. For example, the number of string units SU included in each block BLK and the number of memory cell transistors MT and selection transistors ST1 and ST2 included in each NAND string NS can be designed to an optional number. The number of word lines WL and the number of selection gate lines SGD and SGS can be changed based on the number of the memory cell transistors MT and the number of the selection transistors ST1 and ST2.

1. 1. 3 Configuration of Memory Cell Array

Figure 3:
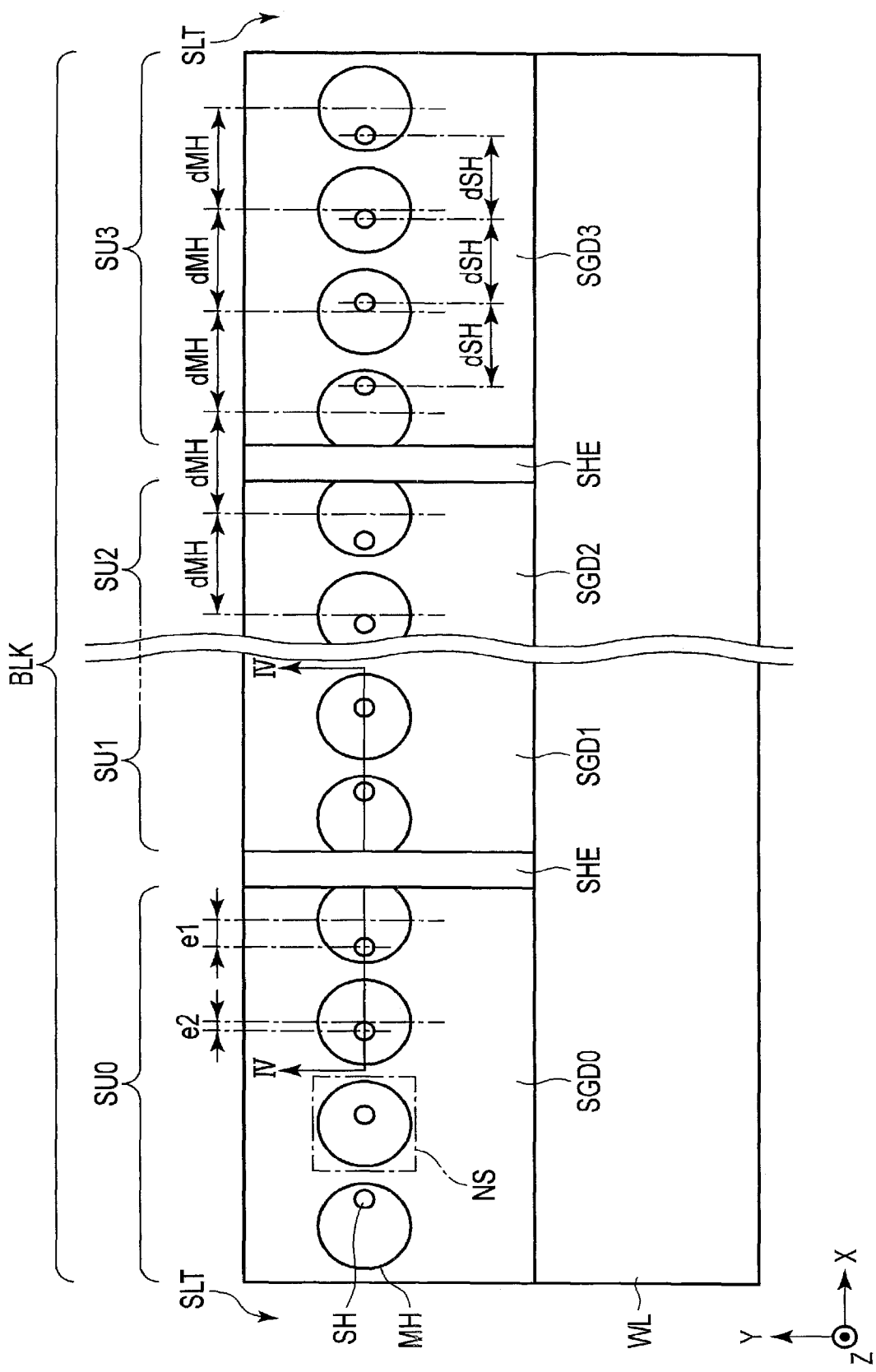
FIG. 3 is a plan view for explaining a configuration of the memory cell array of the semiconductor memory according to the first embodiment.

FIG. 3 is a plan view for explaining a structure of the memory cell array of the semiconductor memory according to the first embodiment. FIG. 3 shows a part of a NAND string NS included in each of the string units SU0 to SU3 in a block BLK. More specifically, in FIG. 3, a case is shown where four, two, two, and four NAND strings NS in the string units SU0 to SU3, respectively, are arranged in a line, as an example, and the illustration of some of the string units SU1 and SU2 is omitted. In the explanation that follows, a plane parallel to the semiconductor substrate is referred to as an XY plane, and a direction vertical to the XY plane (stacking direction) is referred to as a Z direction. Let us assume that the X direction and the Y direction intersect with each other on the XY plane.

As shown in FIG. 3, the block BLK includes a stack body in which selection gate lines SGD (SGD0 to SGD3) are stacked, for example, along the Z direction, via interlayer insulation films (not shown) above the word lines WL. The stack body is electrically decoupled from another block BLK (not shown in the drawings) by a slit SLT extending along the Y direction.

The string units SU0 to SU3 are arranged in this order along the X direction, for example. Two adjacent string units SU interpose a slit SHE extending along the Y direction, for example. The slit SHE is provided above the word lines WL, and electrically decouples two selection gate lines SGD that are adjacent to each other along the Z direction. That is, the string units SU0 to SU3 are respectively coupled to the selection gate lines SGD0 to SGD3 that are electrically decoupled from one another, and share the word lines WL.

The NAND strings NS provided along the X direction are arranged at a substantially equal distance, regardless of, for example, the presence or absence of the slit SHE. More specifically, the NAND string NS includes a memory pillar MH and a selection transistor pillar SH formed on the memory pillar MH. The memory pillar MH corresponds to, for example, memory cell transistors MT, and penetrates the word lines WL along the Z direction. The selection transistor pillar SH corresponds to, for example, a selection transistor ST1, and penetrates the selection gate lines SGD along the Z direction.

The memory pillars MH are arranged at an equal distance dMH along the X direction, regardless of, for example, the presence or absence of the slit SHE. On the other hand, the selection transistor pillars SH are arranged at an equal distance dSH along the X direction between the slit SLT and the slit SHE, or between two adjacent slits SHE, for example. The lengths of the memory pillar MH and the selection transistor pillar SH that can be arranged along the X direction are different according to the presence or absence of the slit SHE. Accordingly, the distance dSH is smaller than the distance dMH.

Also, the central positions of the diameters of the memory pillar MH and the selection transistor pillar SH may be deviated from each other. More specifically, a deviation e1 in a NAND string NS adjacent to a slit SHE or SLT may be greater than a deviation e2 (e1>e2) in a NAND string NS interposed between two other NAND strings NS along the X direction.

For convenience in explanation, a plurality of NAND strings NS in the string units SU0 to SU3 are shown in FIG. 3 as being arranged in a line along the X direction; however, the arrangement of the NAND strings NS is not limited thereto. For example, a plurality of NAND strings NS in each of the string units SU0 to SU3 may be formed in such a manner so that the selection transistor pillars SH are deviated from one another in the Y direction, so as to be coupled to different bit lines BL. Similarly, the memory pillars MH may be formed in positions deviated from one another in the Y direction in each of the string units SU0 to SU3.

Figure 4:
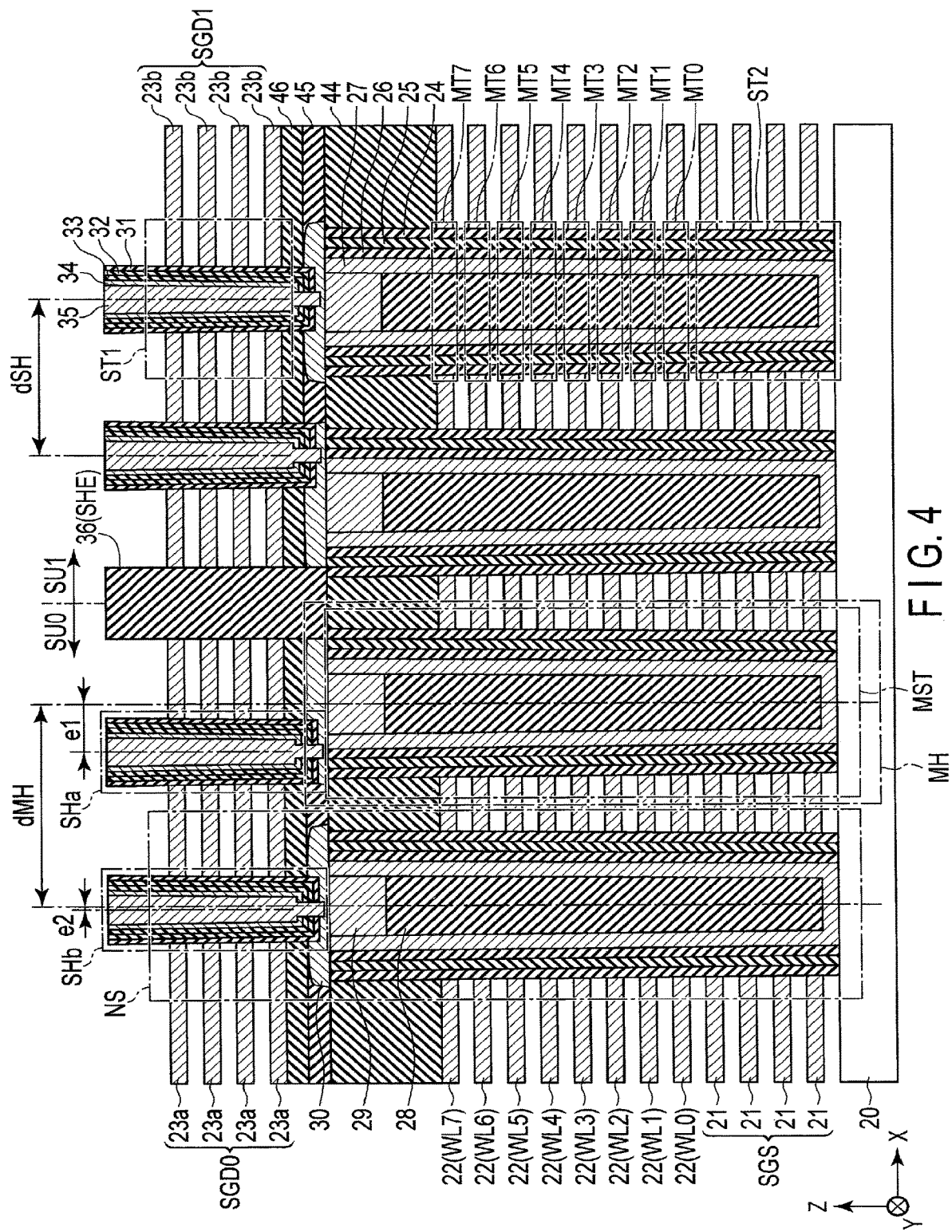
FIG. 4 is a cross-sectional view for explaining a configuration of the memory cell array of the semiconductor memory according to the first embodiment.

FIG. 4 is a cross-sectional view for explaining a configuration of the memory cell array of the semiconductor memory according to the first embodiment. FIG. 4 shows an example of a cross-sectional structure taken along line IV-IV shown in FIG. 3. More specifically, FIG. 4 shows an example of a cross-sectional configuration of a part (two NAND strings NS in a string unit SU0 and two NAND strings NS in a string unit SU1) of two string units SU0 and SU1 in the same block BLK. In FIG. 4, the illustration of the interlayer insulation films is suitably omitted, except for the interlayer insulation films between the word line WL and the selection gate line SGD.

As shown in FIG. 4, a p-type well area 20 is formed on the semiconductor substrate. Four-layer conductors 21, eight-layer conductors 22, and four-layer conductors 23 (23a and 23b), for example, are stacked in this order via interlayer insulation films above the p-type well area 20.

The conductors 23a and 23b correspond to string units SU0 and SU1, respectively. Of the interlayer insulation films, insulation films 44 and 46, and an oxide film 45 provided between the conductor 22 and the conductor 23 are shown in FIG. 4. The conductors 21 to 23 are formed in a plate shape extending along the XY plane. The conductors 21 to 23 respectively function as the selection gate line SGS, the word lines WL0 to WL7, and the selection gate line SGD.

A memory structure MST, which is a portion of the memory pillar MH, is provided to penetrate the conductors 22 and 21, so as to reach the p-type well area 20 from above the conductors 22. The memory structure MST includes, for example, at least a block insulation film 24, an insulation film 25, a tunnel oxide film 26, and a conductive semiconductor film 27. The block insulation film 24 is provided on an inner wall of a memory hole in which the memory structure MST is to be formed, the insulation film 25 is provided on an inner wall of the block insulation film 24, the tunnel oxide film 26 is provided on an inner wall of the insulation film 25, and the conductive semiconductor film 27 is provided on an inner wall of the tunnel oxide film 26. The block insulation film 24 and the tunnel oxide film 26 include, for example, an oxide. The insulation film 25 includes, for example, a nitride.

The inside of the semiconductor film 27 is filled with another film. Specifically, an insulation film 28 is provided at least in an area corresponding to a portion of the semiconductor film 27 at which the memory structure MST and the conductors 21 and 22 intersect with each other. The insulation film 28 includes, for example, an oxide (e.g., silicon dioxide ($SiO_2$)). In a portion of the semiconductor film 27 above the insulation film 28, a conductive semiconductor film 29 is provided. The semiconductor film 29 includes multi-crystalline silicon (polysilicon) doped with $N^+$-type impurities, and is buried to the upper surface of the semiconductor film 27.

In the above-described configuration of the memory structure MST, the insulation film 25 functions as a charge storage layer of the memory cell transistors MT, and a channel region is formed in the semiconductor film 27. The portion at which the memory structure MST and the conductors 21 intersect with each other functions as the selection transistor ST2, and the portion at which the memory structure MST and the conductors 22 intersect with each other functions as the memory cell transistors MT0 to MT7.

A conductive semiconductor film 30, which is an additional portion of the memory pillar MH, is provided on the memory structure MST. The semiconductor film 30 includes polysilicon doped with, for example, $N^+$-type impurities, and is coupled at least to the upper surface of the semiconductor films 27 and 29 above the conductors 22 and 21 stacked via interlayer insulation films. Also, the semiconductor film 30 covers the outside of the semiconductor film 27 along the XY plane, to an extent that does not contact another semiconductor film 30 adjacent thereto. That is, the diameter (area) of the lower surface of the semiconductor film 30 is greater than the diameter (area) of the upper surface of the semiconductor film 27. As will be described later, the semiconductor film 30 is formed by selective growth from the semiconductor films 27 and 29, and can therefore be regarded as a part of the semiconductor films 27 and 29. The oxide film 45 is provided in the same layer as the semiconductor film 30, so as to fill in the gaps between the semiconductor films 30 formed for the respective memory pillars MH. The oxide film 45 includes, for example, an oxide (e.g., silicon dioxide ($SiO_2$)).

Each of selection transistor pillars SH (SHa and SHb) is provided on the corresponding memory pillar MH. Each selection transistor pillar SH is provided to penetrate the conductors 23, so as to reach the semiconductor film 30 from above the conductors 23, for example. In the example shown in FIG. 4, a lower surface of the selection transistor pillar SH is positioned below the upper surface of the semiconductor film 30. The selection transistor pillar SH includes, for example, a block insulation film 31, an insulation film 32, a tunnel oxide film 33, and conductive semiconductor films 34 and 35.

More specifically, a hole in which the selection transistor pillar SH is to be formed reaches, for example, the semiconductor film 30. In the example shown in FIG. 4, the selection transistor pillar SHa has a relatively large deviation (deviation e1) from the center of the memory pillar MH. Accordingly, the lower end of a hole in which the selection transistor pillar SHa is to be formed is positioned not only immediately above the semiconductor films 27 and 29, but also immediately above the block insulation film 24, the insulation film 25, and the tunnel oxide film 26. On the other hand, the selection transistor pillar SHb has a relatively small deviation (deviation e2) from the center of the memory pillar MH. Accordingly, the lower end of a hole in which the selection transistor pillar SHb is to be formed is not positioned immediately above the block insulation film 24, the insulation film 25, and the tunnel oxide film 26, and are positioned immediately above the semiconductor films 27 and 29.

A block insulation film 31 is provided on an inner wall of the hole in which the selection transistor pillar SH is to be formed, an insulation film 32 is provided on an inner wall of the block insulation film 31, a tunnel oxide film 33 is provided on an inner wall of the insulation film 32, and a semiconductor film 34 is provided on an inner wall of the tunnel oxide film 33. The block insulation film 31 and the tunnel oxide film 33 include, for example, an oxide. The insulation film 32 includes, for example, a nitride. The inside of the semiconductor film 34 may be filled with another film. In the example shown in FIG. 4, the inside of the semiconductor film 34 is filled with a semiconductor film 35 including, for example, amorphous silicon.

In the portion in which the semiconductor film 34, the tunnel oxide film 33, the insulation film 32, and the block insulation film 31 are stacked along the Z direction, a hole that penetrates the films 34 to 31 and reaches the semiconductor film 30 is formed, and the hole is filled with the semiconductor film 35. Thereby, the semiconductor films 34 and 35 are electrically coupled to the semiconductor films 27 and 29 via the semiconductor film 30. That is, the semiconductor film 30 functions as a contact that electrically couples the memory pillar MH and the selection transistor pillar SH.

In the configuration of the above-described selection transistor pillar SH, the insulation film 32 functions as a charge storage layer of the selection transistor ST1, and a channel region is formed in the semiconductor film 34. The portion at which the selection transistor pillar SH and the conductors 23 intersect with each other functions as the selection transistor ST1. Thus, since the selection transistor ST1 is formed to have a configuration capable of trapping charges in the charge storage layer in a manner similar to the configuration of the memory cell transistor MT, the threshold voltage of the selection transistor ST1 can be adjusted.

An insulation film may be provided in a part of the inside of the semiconductor film 34, instead of the semiconductor film 35. In this case as well, a semiconductor film 35 is buried on the inner wall of the hole that penetrates the films 34 to 31 and reaches the semiconductor film 30. Thereby, the semiconductor films 34 and 35 are electrically coupled to the semiconductor films 27 and 29 via the semiconductor film 30.

The conductors 23a and 23b are electrically decoupled from an insulation film 36 at a boundary between the string units SU0 and SU1. The insulation film 36 is provided to penetrate the conductors 23, so as to reach the layer positioned below the conductors 23 and above the memory pillars MH, for example. Thus, since the insulation film 36 is provided above the memory pillar MH, the memory pillars MH can be provided at an equal distance dMH above the semiconductor substrate, regardless of the arrangement of the insulation film 36.

The above-described configuration shown in FIG. 4 is merely an example, and other configurations may be suitably adopted. For example, a conductor (not shown in the drawings) that functions as a source line SL may be further provided between the semiconductor substrate and the conductors 21 shown in FIG. 4. Also, a stacked structure (not shown in the drawings) which forms a peripheral circuit that functions as a row decoder 15 or a sense amplifier 16 may be further provided between the conductors and the semiconductor substrate.

In the example of FIG. 4, the conductors 21 to 23 are respectively explained as four-layer, eight-layer, and four-layer conductors. However, the conductors 21 to 23 are not limited thereto, and a given number of layers may be adopted. Additionally, additional conductors may be stacked as a dummy electrode between the conductors 21 and 22, and between the conductors 22 and 23.

1. 2 Manufacturing Method of Memory Cell Array

Next, a manufacturing method of the semiconductor memory according to the first embodiment will be described with reference to FIGS. 5 to 17. FIGS. 5 to 8 and 10 to 17 are cross-sectional views for explaining the manufacturing method of the semiconductor memory according to the first embodiment, in which a mainly process of forming memory pillars MH and selection transistor pillars SH is shown. FIG. 9 is a plan view of the semiconductor memory in the manufacturing process shown in FIG. 8, as viewed from above.

Figure 5:
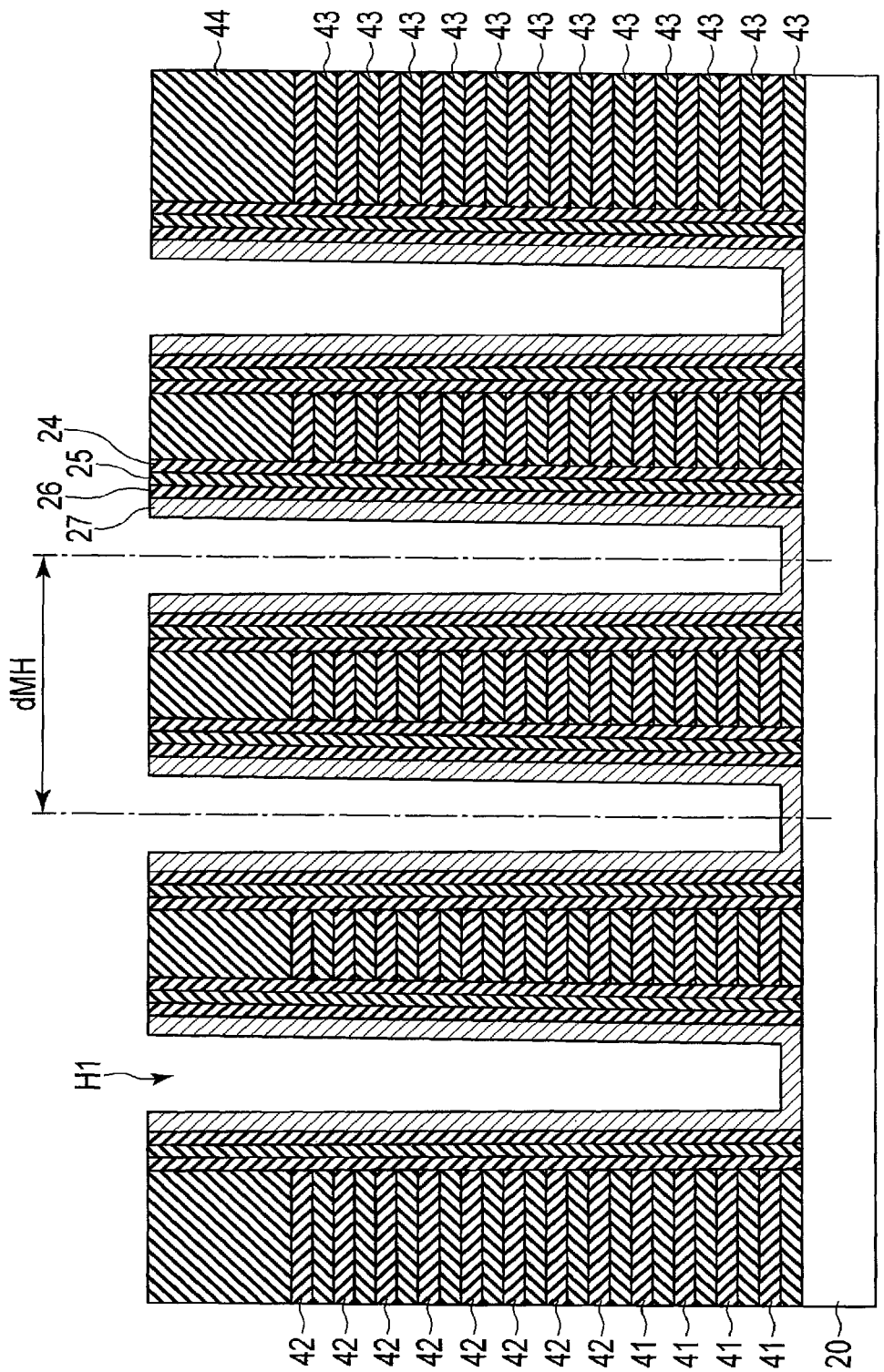
FIG. 5 is a cross-sectional view for explaining a manufacturing method of the memory cell array of the semiconductor memory according to the first embodiment.

First, replacement materials 41 and insulation films 43 are alternately stacked above the p-type well area 20, as shown in FIG. 5. Furthermore, replacement materials 42 and insulation films 43 are alternately stacked above a stack body of the replacement materials 41 and the insulation films 43. An insulation film 44 is further provided above the stack body of the replacement materials 42 and the insulation films 43. The replacement materials 41 and 42 include, for example, silicon nitride (SiN), and the insulation films 43 and 44 include, for example, a silicon dioxide ($SiO_2$).

In an area of the stack body of the replacement materials 41 and 42 and the insulation films 43 and 44 in which the memory pillar MH is to be formed, a hole H1 that penetrates the stack body and reaches the p-type well area 20 is formed by, for example, anisotropic etching. The holes H1 may be formed, for example, so as to be separated from each other at an equal distance dMH. A block insulation film 24, an insulation film 25, a tunnel oxide film 26, and a semiconductor film 27 are sequentially formed on the inner wall of the hole H1 by, for example, chemical vapor deposition (CVD).

Figure 6:
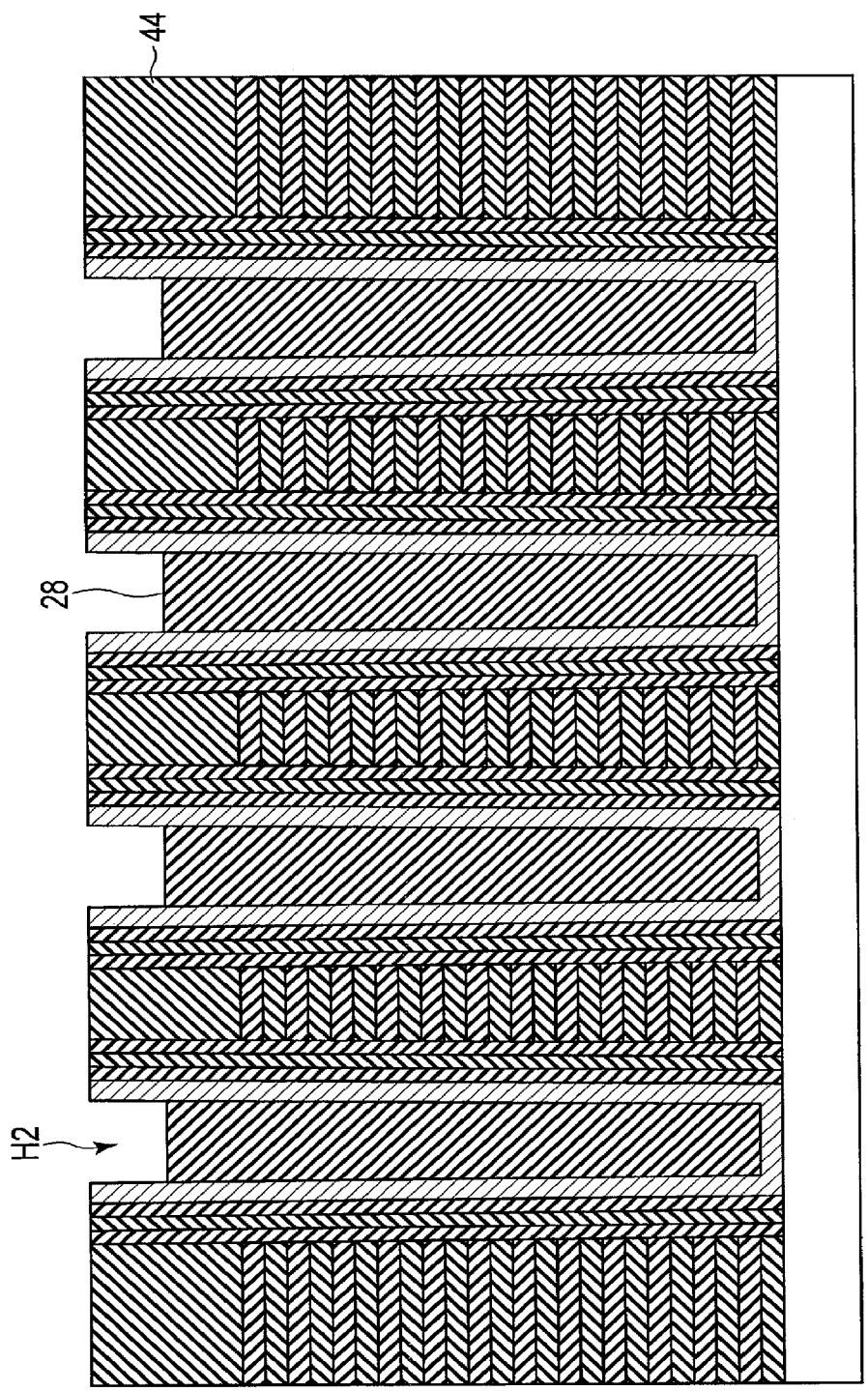
FIG. 6 is a cross-sectional view for explaining a manufacturing method of the memory cell array of the semiconductor memory according to the first embodiment.

Thereafter, an insulation film 28 is formed entirely, as shown in FIG. 6. The hole H1 is filled with the insulation film 28, leaving a space H2 for a semiconductor film 29 to be formed.

More specifically, the insulation film 28 is formed entirely so as to be buried inside the semiconductor film 27, while covering the upper surface of the insulation film 44. In accordance therewith, a void (not shown in the drawings), for example, is formed in a portion at which the hole H1 inside the semiconductor film 27 and the insulation film 44 intersect with each other. Thereafter, the insulation film 28 is etched back to the upper surface of the insulation film 44. In accordance therewith, the void becomes continuous with the space above the insulation film 28. Thereafter, the insulation film 28 is formed entirely again, and the hole H1 is filled with the insulation film 28, without a void formed therein. Thereafter, the insulation film 28 is etched back again, and a space H2 is formed in which a semiconductor film 29 is to be formed. Thereby, the upper surface of the insulation film 28 is formed flat, without being made uneven by a void.

Thereafter, as shown in FIG. 7, a semiconductor film 29 is formed entirely by, for example, CVD. Thereby, the semiconductor film 29 is formed on the upper surface of the insulation film 44, and the space H2 is filled with the semiconductor film 29. Thereafter, the semiconductor film 29 is etched back to the upper surface of the insulation film 44. Thereby, memory structures MST are formed.

Figure 8:
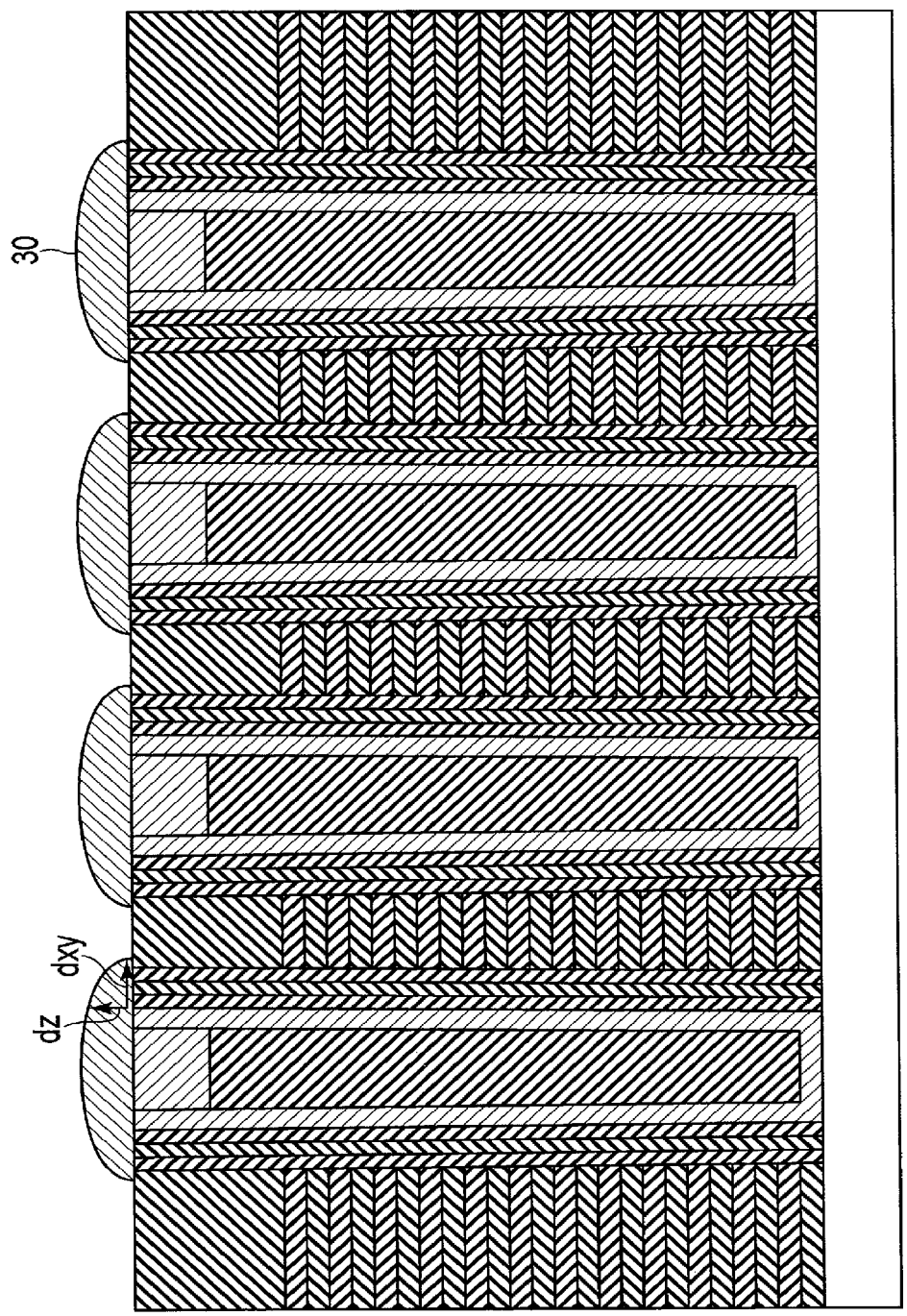
FIG. 8 is a cross-sectional view for explaining a manufacturing method of the memory cell array of the semiconductor memory according to the first embodiment.
Figure 9:
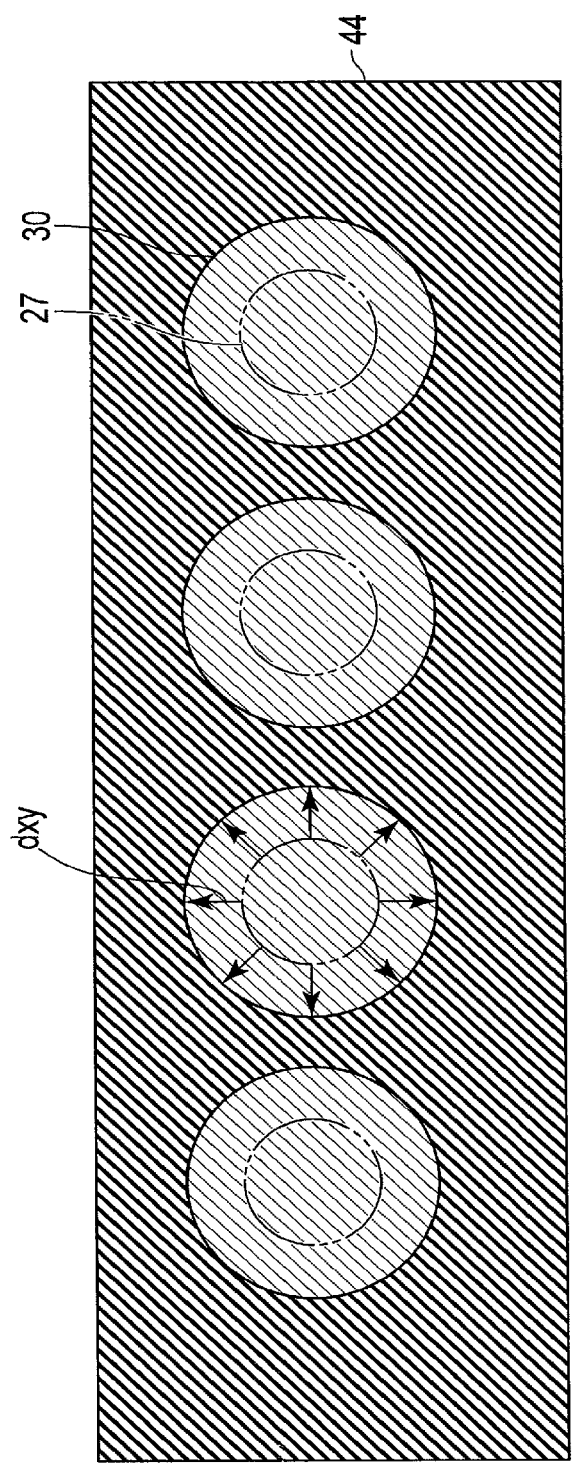
FIG. 9 is a plan view for explaining a manufacturing method of the memory cell array of the semiconductor memory according to the first embodiment.

Thereafter, as shown in FIG. 8, a dome-shaped semiconductor film 30 is formed by selective growth from the semiconductor films 27 and 29, for example, so as to correspond to each memory pillar MH. The semiconductor film 30 includes, for example, polysilicon. Thereby, memory pillars MH are formed, and the semiconductor film 30 is formed on an upper side of the memory pillar MH so as to extend outward by a width dxy from the semiconductor film 27 along the XY plane and to extend upward by a height dz from the upper surfaces of the semiconductor 27 and 29 along the Z direction. It is preferable that the lengths dxy and dz are within a range that does not cause the semiconductor films 30 on adjacent memory pillars MH to contact each other, for example, and are equal to or greater than 20 nanometers (nm).

The plan view as viewed from above in the manufacturing process shown in FIG. 8 is shown in FIG. 9. That is, FIG. 9 shows the shape of the semiconductor films 30 formed on the insulation film 44 and the semiconductor films 27 as viewed from above. The chain double-dashed lines shown in FIG. 9 show an outer periphery of the semiconductor films 27.

As described above, the semiconductor film 30 is formed by selective growth from the semiconductor films 27 and 29. Accordingly, as shown in FIG. 9, the outer periphery on the lower surface of the semiconductor film 30 is positioned at an equal distance in width (a position separated outward by the length dxy) from the outer periphery of the semiconductor film 27. That is, the semiconductor film 30 is formed without being deviated from the semiconductor film 27.

Figure 10:
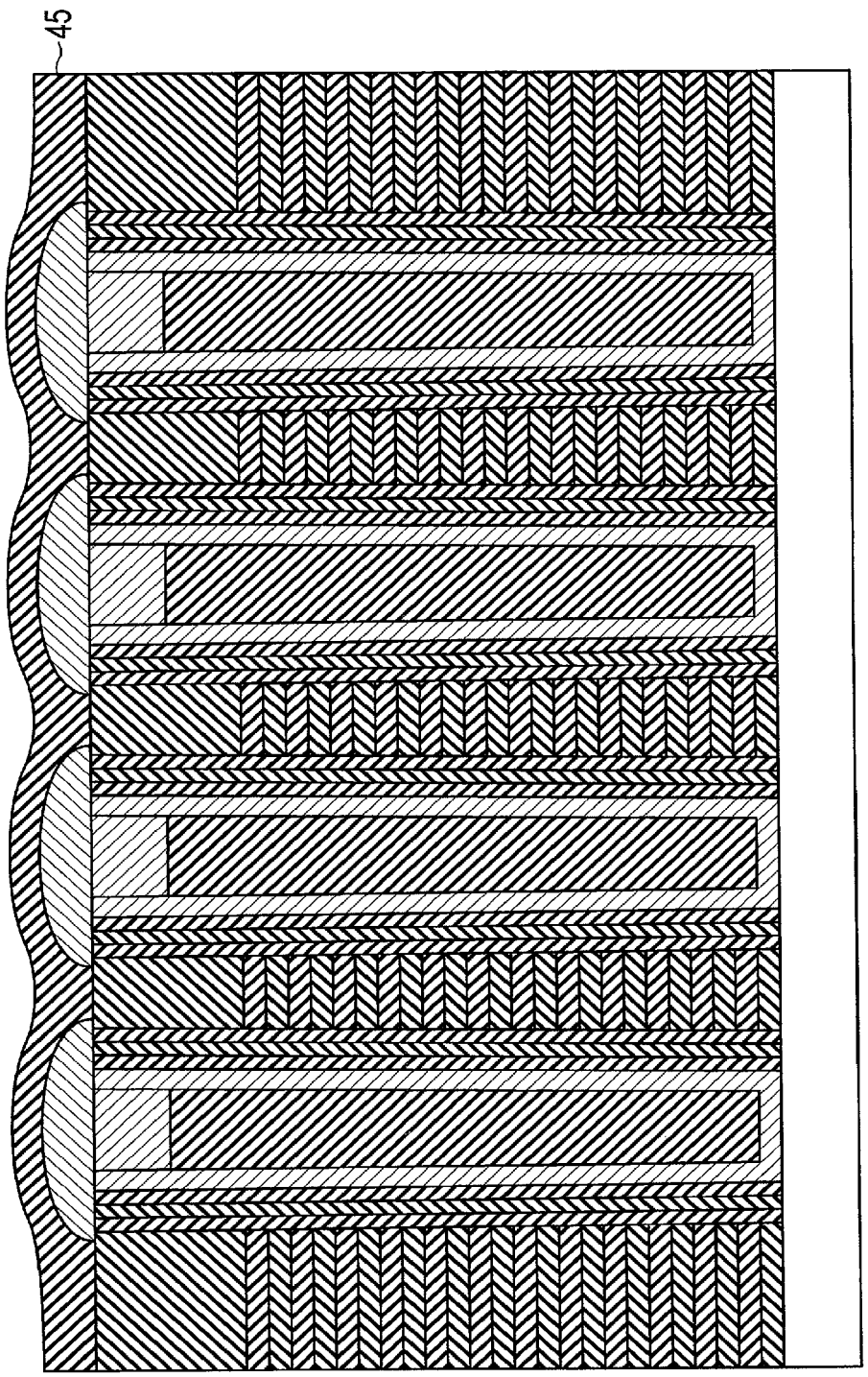
FIG. 10 is a cross-sectional view for explaining a manufacturing method of the memory cell array of the semiconductor memory according to the first embodiment.

Thereafter, as shown in FIG. 10, an oxide film 45 is formed so as to cover the semiconductor film 30 formed into the dome shape. Accordingly, the upper surface of the oxide film 45 may be in a smoothly raised shape. The oxide film 45 includes an oxide, for example, a silicon dioxide ($SiO_2$).

Figure 11:
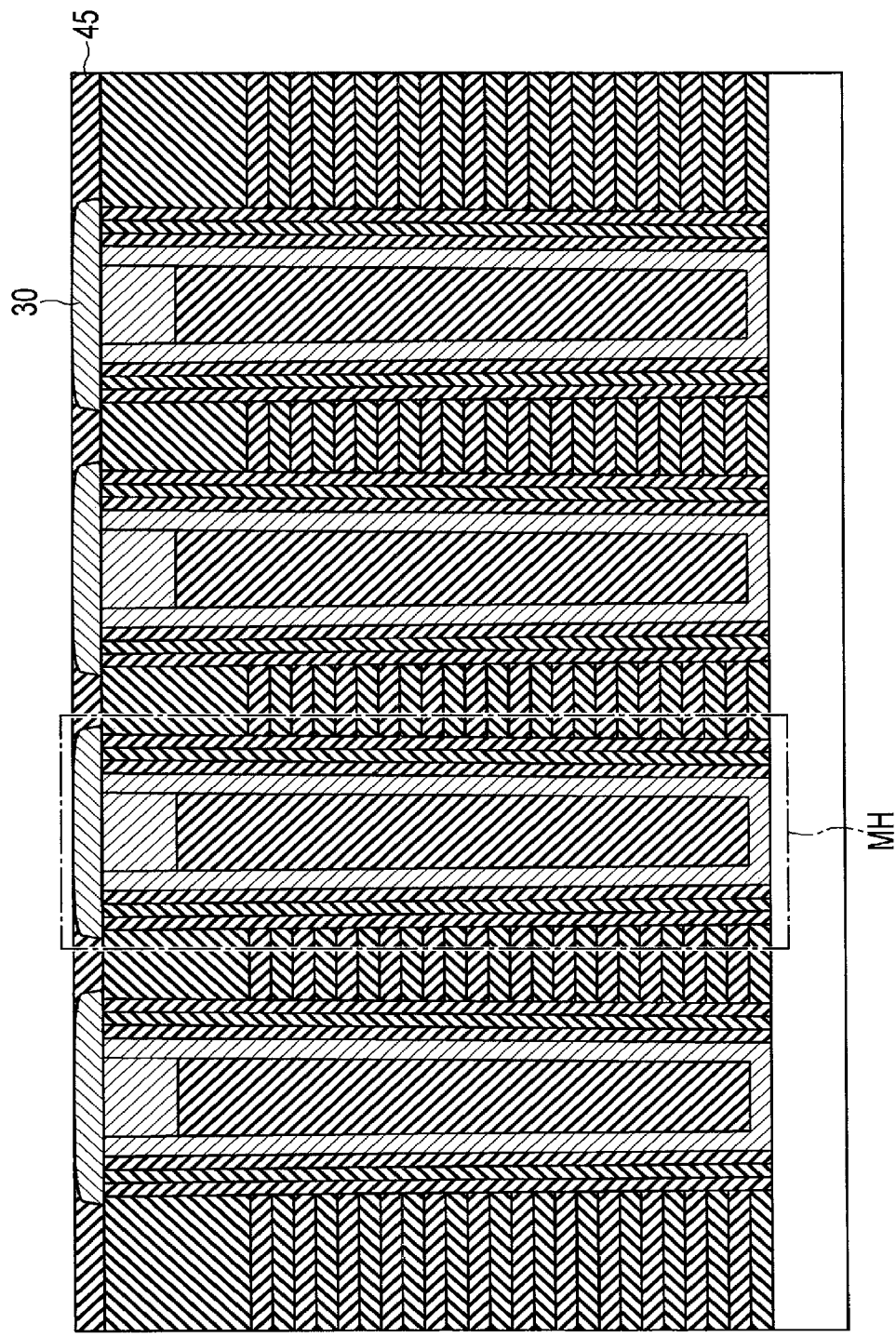
FIG. 11 is a cross-sectional view for explaining a manufacturing method of the memory cell array of the semiconductor memory according to the first embodiment.

Thereafter, as shown in FIG. 11, the oxide film 45 and the semiconductor film 30 are planarized by chemical mechanical polishing (CMP) and etch back. At this time, the oxide film 45 is removed from the upper surface of the planarized semiconductor film 30. Thereby, on the upper surface of the memory pillars MH and the insulation film 44, a layer in which an oxide film 45 including an oxide is buried is formed between the semiconductor films 30 formed for the respective memory pillars MH.

After the layer of the semiconductor films 30 and the oxide film 45 are formed, the semiconductor films 30 and 29 are doped with $N^+$-type impurities by ion implantation. Thereby, a contact resistance between the selection transistor ST1 and the memory cell transistor MT is further reduced.

Figure 12:
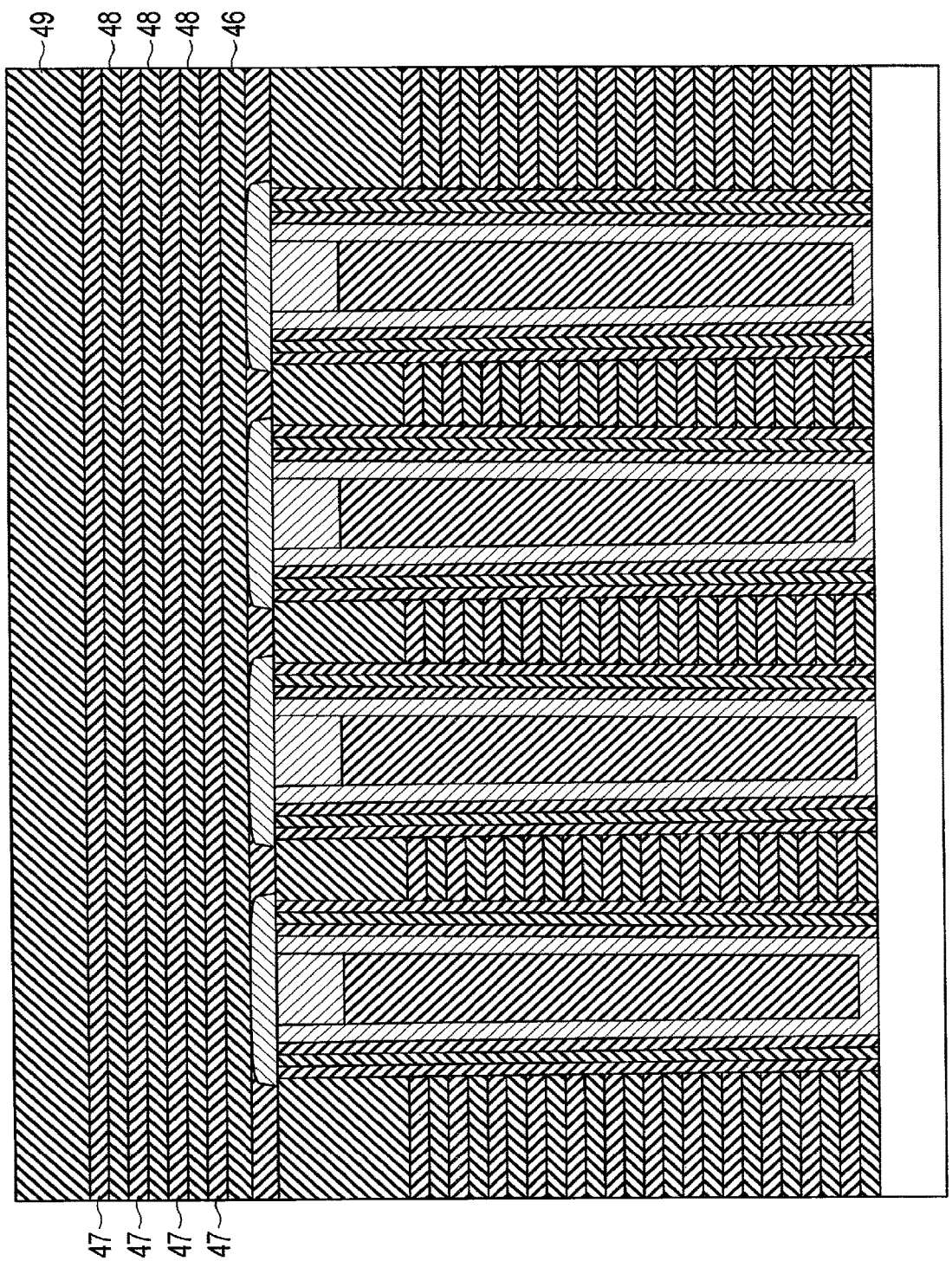
FIG. 12 is a cross-sectional view for explaining a manufacturing method of the memory cell array of the semiconductor memory according to the first embodiment.

Thereafter, as shown in FIG. 12, an insulation film 46 is provided on the oxide film 45 and the semiconductor films 30. Replacement materials 47 and insulation films 48 are alternately stacked on the insulation film 46. An insulation film 49 is additionally provided above the replacement material 47 at the uppermost layer. The replacement materials 47 include, for example, silicon nitride (SiN), and the insulation films 46, 48, and 49 include, for example, a silicon dioxide ($SiO_2$).

Figure 13:
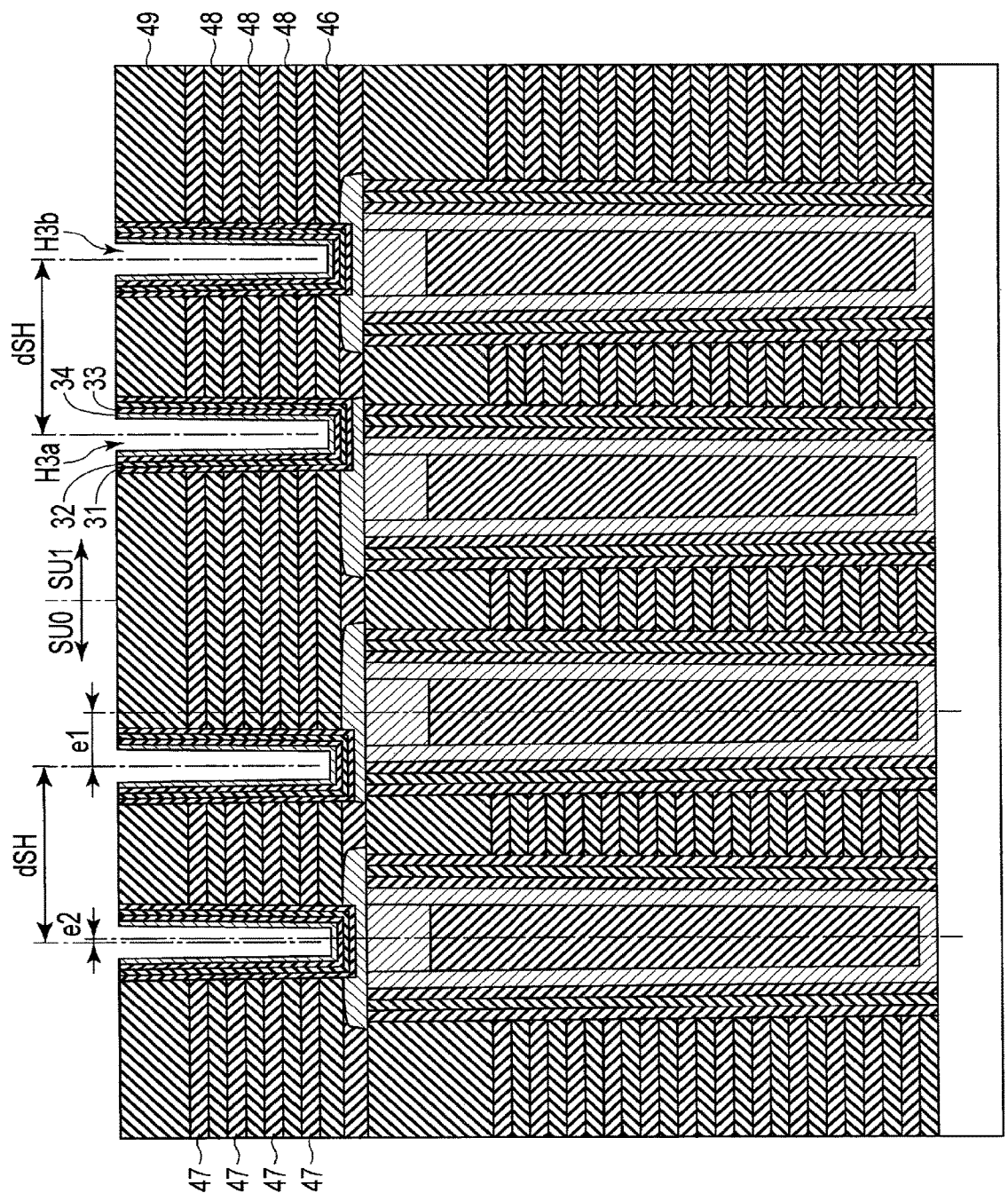
FIG. 13 is a cross-sectional view for explaining a manufacturing method of the memory cell array of the semiconductor memory according to the first embodiment.

Thereafter, as shown in FIG. 13, in an area of the stack body of the replacement materials 47, the insulation film 46, the insulation films 48, and the insulation film 49 in which selection transistor pillars SH are to be formed, holes H3 (H3a and H3b) each of that penetrate the stack body and reach the semiconductor film 30 are formed by, for example, anisotropic etching. The holes H3 formed in the same string unit SU may be separated from each other at an equal distance dSH, for example. The amount of deviation of the center of the hole H3 from the center of the memory pillar MH may differ according to the position of the hole H3.

In the example shown in FIG. 13, the hole H3a has a relatively large amount of deviation (deviation e1) from the corresponding memory pillar MH. On the other hand, the hole H3b has a relatively small amount of deviation (deviation e2) from the corresponding memory pillar NH. A block insulation film 31, an insulation film 32, a tunnel oxide film 33, and a semiconductor film 34 are sequentially formed in the hole H3.

Thereafter, as shown in FIG. 14, holes H4 that penetrate the semiconductor film 34, the tunnel oxide film 33, the insulation film 32, and the block insulation film 31 formed at the bottom of the holes H3 and that reach the semiconductor films 30 are formed by, for example, anisotropic etching.

Thereafter, as shown in FIG. 15, semiconductor films 35 are formed so as to fill in the holes H3 and H4. Thereby, the semiconductor films 34 and 35 are electrically coupled to the semiconductor films 27 and 29 via the semiconductor film 30.

Thereafter, as shown in FIG. 16, the replacement materials 41, 42, and 47 are respectively replaced with conductors 21 to 23. Since all of the replacement materials 41, 42, and 47 are nitride films, as described above, they can be removed simultaneously by wet etching, for example, which allows nitride films to display a higher selectivity than oxide films. Thereafter, the conductors 21 to 23 are formed in a space generated by removing the replacement materials 41, 42, and 47. The conductors 21 and 22 respectively function as a selection gate line SGS and word lines WL0 to WL7.

Thereafter, as shown in FIG. 17, a slit SHE for electrically decoupling the selection gate lines SGD between the string units SU is formed. Specifically, a trench (not shown in the drawings) for forming an insulation film 36 is formed in a position corresponding to a boundary of adjacent string units SU (string units SU0 and SU1 in the example of FIG. 17) by, for example, anisotropic etching. The trench penetrates the insulation films 48 and 49 and the conductors 23, and reaches a depth below the conductors 23 and above the memory pillar MH, for example. Thereafter, an insulation film 36 is buried in the trench. Thereby, the conductor 23 is divided into conductors 23a and 23b, which are electrically decoupled from each other. The conductors 23a and 23b function as a selection gate line SGD0 of the string unit SU0 and as a selection gate line SGD1 of the string unit SU1, respectively.

In the above-described manner, the process of forming the memory pillars MH and the selection transistor pillars SH is completed.

1. 3 Advantageous Effects of Present Embodiment

According to the first embodiment, it is possible to suppress an increase in contact resistance in the current path of the memory. This advantageous effect will be explained below.

A semiconductor film 30 is formed for the respective memory pillars MH by selective growth from a corresponding semiconductor film 29. The semiconductor film 30 covers the upper surfaces of the semiconductor films 29 and 27, and extends outward from the semiconductor films 29 and 27 on the upper side of the memory pillar MH. Subsequently, an oxide film 45 is formed to fill in the gaps between the semiconductor films 30 formed for the respective memory pillars MH, and the side surfaces of the semiconductor films 30 are covered with the oxide film 45. A selection transistor pillar SH is formed in such a manner so that its bottom reaches the semiconductor film 30, and a semiconductor film 35 is buried in a hole H4 that penetrates the bottom. Thereby, a semiconductor film 34 that functions as a channel of a selection transistor ST1 and a semiconductor film 27 that functions as a channel of a memory cell transistor MT and a selection transistor ST2 are electrically coupled via the semiconductor films 29, 30, and 35. Accordingly, it is possible to suppress an increase in contact resistance in the current path of a NAND string NS.

In addition, in the NAND string NS according to the first embodiment, a memory pillar MH in which the memory cell transistors MT are formed and a selection transistor pillar SH in which a selection transistor ST1 is formed are individually formed. Thereby, a slit SHE can be formed above the memory pillars MH. Accordingly, the memory pillars MH can be arranged at an equal distance (densely packed) on the semiconductor substrate, regardless of the arrangement of the slit SHE. However, since the memory pillars MH are densely packed, a margin of the area in which the selection transistor pillar SH is formed may be narrowed. In particular, it can be difficult to form a selection transistor pillar SHa adjacent to a slit SHE or SLT immediately above the semiconductor films 27 and 29 of a corresponding memory pillar MH. In this case, there is a possibility that a contact area between the semiconductor films 27 and 29 formed in the memory pillar MH and the semiconductor film 35 formed in the selection transistor pillar SH is reduced, thus causing an increase in contact resistance in the current path of the NAND string NS.

According to the first embodiment, a layer including semiconductor films 30 and an oxide film 45 is formed between memory pillars MH and selection transistor pillars SH. The semiconductor film 30 is formed to cover an area extending outward from the semiconductor film 27 along the XY plane on the upper side of the memory pillar MH, by selectively growing polysilicon from the semiconductor films 27 and 29. The semiconductor film 30 is formed to have a predetermined thickness in an upward direction as well, relative to the upper surface of the semiconductor films 27 and 29. Thereby, a contact area between the semiconductor film 35 and the semiconductor film 30 can be ensured even in the case of the selection transistor pillar SHa formed in a position greatly deviated from the center of the memory pillar MH, thus suppressing an increase in contact resistance.

Since the semiconductor film 30 is formed by selective growth from the semiconductor films 27 and 29, as described above, the semiconductor film 30 is formed to have isotropy relative to the center of the memory pillar MH. This eliminates the concern about the displacement relative to the lower layer, as in the fabrication process including lithography, and it is possible to grow the semiconductor film 30 so as to extend outward from the upper surface of the semiconductor film 27 with the same width (length dxy), without deviation from the center of the memory pillar MH. Accordingly, no matter in which direction the selection transistor pillar SH is deviated from the memory pillar MH, the contact area can be increased by the length dxy.

Since the semiconductor film 30 is formed by selective growth from the semiconductor films 27 and 29, the depth of the hole H1 in which the memory pillar MH is formed does not depend on the presence or absence of the semiconductor film 30. Accordingly, it is possible to decrease the depth of the hole H1 by the thickness of the semiconductor film 30, compared to the case where a layer corresponding to the semiconductor film 30 is formed by increasing the diameter of the opening portion of the hole H1 in which the memory pillar MH is formed. Therefore, it is possible to decrease the diameter of the upper surface of the hole H1, compared to the above-described case, thus allowing the memory pillars MH to be arranged with higher density.

An oxide film 45 including an oxide is formed on a side surface of the semiconductor film 30. An oxide has a lower dielectric constant than a nitride. Accordingly, it is possible to suppress an increase in parasitic capacitance in the wiring between the memory pillar MH and the selection transistor pillar SH, compared to the case where a nitride is formed on a side surface of the semiconductor film 30.

1. 4. Modifications

The semiconductor memory according to the first embodiment is not limited to the examples described above, and can be modified in various ways. For example, the NAND string NS according to the first embodiment has been explained about the case where the semiconductor film 30 is selectively grown in a dome-like shape and then its upper surface is planarized; however, the configuration is not limited thereto. In the following, an explanation will be given only of the configurations different from those of the first embodiment.

Figure 18:
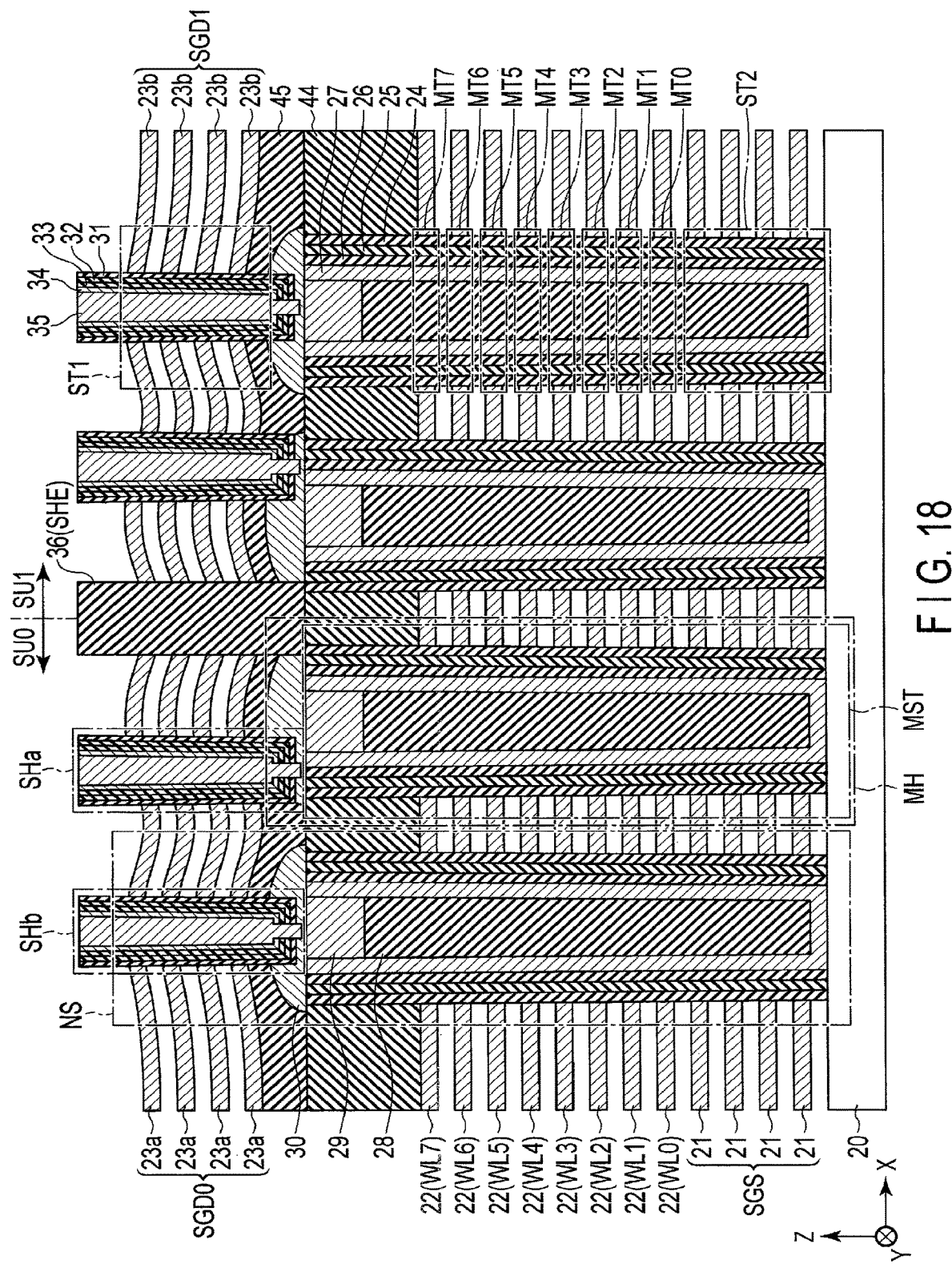
FIG. 18 is a cross-sectional view for explaining a configuration of a memory cell array of a semiconductor memory according to a modification of the first embodiment.

FIG. 18 is a cross-sectional view for explaining a configuration of a memory cell array of a semiconductor memory according to a modification of the first embodiment. FIG. 18 illustrates an example in which a stacked structure above the semiconductor film 30 is formed while the semiconductor film 30 is formed in a dome-like shape.

As shown in FIG. 18, the process of planarizing the semiconductor film 30, after selectively growing the semiconductor film 30 using the semiconductor film 29 as a seed, is omitted. Accordingly, the semiconductor film 30 has a dome shape whose thickness is greatest at the center of the memory pillar MH and is gradually reduced along the radial direction.

Also, an oxide film 45 is formed so as to cover the top of the dome-shaped semiconductor film 30. Accordingly, the upper surface of the oxide film 45 has a wave shape that swells at the portions above the semiconductor film 30. Similarly, the conductors 23 formed on the oxide film 45 and the interlayer insulation films formed between the conductors 23 have a wave shape that swells at a portion above the semiconductor film 30.

According to the first modification, a layer corresponding to the selection transistor ST1 is formed while the semiconductor film 30 maintains the dome shape. Thereby, it is possible to omit the process of planarizing the semiconductor film 30. Even though the semiconductor film 30 is in the dome shape, the semiconductor film 30 covers the outside of the semiconductor film 27 along the XY plane to an extent that the semiconductor film 30 does not contact another semiconductor film 30 adjacent thereto, as in the first embodiment. Thereby, it is possible to ensure a contact area between the semiconductor film 35 and the semiconductor film 30 even when the center of the selection transistor pillar SH is formed so as to be deviated from the center of the memory pillar MH. Therefore, it is possible to suppress an increase in contact resistance in the current path of the memory, as in the first embodiment.

2. Second Embodiment

Next, a semiconductor memory according to a second embodiment will be described. In the first embodiment, a semiconductor film 30 that extends outward from the semiconductor films 27 and 29 is formed by selective growth on the upper surface of the semiconductor films 27 and 29. A case has been described where the semiconductor films 34 and 27 are electrically coupled by forming holes H3 and H4 corresponding to the selection transistor pillars SH so as to reach the semiconductor film 30. The second embodiment is different from the first embodiment mainly in that holes corresponding to the selection transistor pillars SH are formed so as to reach the memory structures MST, and that at least portions of the holes formed in the memory structures MST are filled with a semiconductor film epitaxially grown from the semiconductor films 27 and 29.

In the explanation that follows, mainly those configurations and manufacturing processes that are different from those of the first embodiment will be described, and the explanation of similar configurations and manufacturing processes will be omitted.

2. 1 Configuration of Memory Cell Array

Figure 19:
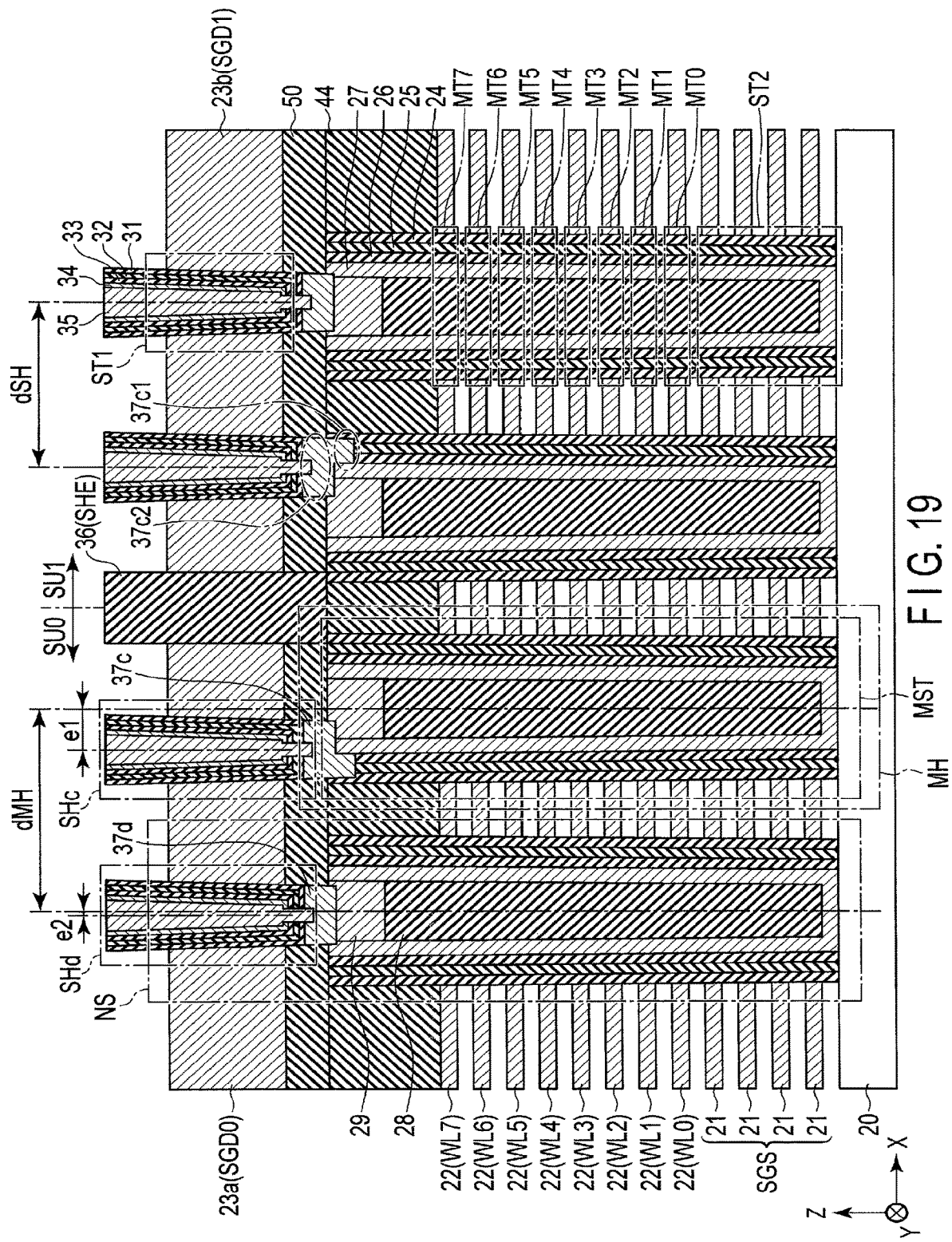
FIG. 19 is a cross-sectional view for explaining a configuration of a memory cell array of a semiconductor memory according to a second embodiment.

FIG. 19 is a cross-sectional view for explaining a configuration of a memory cell array of a semiconductor memory according to the second embodiment. FIG. 19 corresponds to FIG. 4 explained in the first embodiment. In FIG. 19, the illustration of interlayer insulation films is suitably omitted, except for the films between the conductors 22 and the conductor 23.

As shown in FIG. 19, four-layer conductors 21, eight-layer conductors 22, and a single-layer conductor 23, for example, are stacked in this order via interlayer insulation films above a p-type well area 20. Similar to the FIG. 4, memory structures MST each including a block insulator 24, an insulator 25, a tunnel oxide film 26, a semiconductor film 27, an insulation film 28, and a semiconductor film 29, each of which is a portion of the memory pillar MH, are provided to penetrate the conductors 22 and 21. Of the interlayer insulation films, insulation films 44 and 50 provided between the conductors 22 and 23 are shown in FIG. 19. An insulation film 50 is provided on the upper surface of the insulation film 44 and the memory structures MST, and fills in the space between the insulation film 44 and the conductor 23.

Each of semiconductor films 37 (37c and 37d) is provided on the corresponding semiconductor films 27 and 29 as an additional portion of the memory pillar MH. The semiconductor film 37 is provided in a hole formed on the corresponding memory pillar MH. The shape of the lower end of the hole may differ according to the amount of deviation of the center of the selection transistor pillar SH (SHc or SHd) from the center of the memory pillar MH (the center of the insulation film 28 which is a core portion of the memory pillar MH).

In the example of FIG. 19, the amount of deviation (deviation e1) of the selection transistor pillar SHc from the center of the insulation film 28 is relatively large. Accordingly, a hole is formed by etching the block insulation film 24, the insulation film 25, and the tunnel oxide film 26, in addition to the semiconductor films 27 and 29. The lower end of the hole has a step configured in such a manner so that the tops of the block insulation film 24, the insulation film 25, and the tunnel oxide film 26 are positioned below the tops of the semiconductor films 27 and 29. The semiconductor film 37c is formed to fill in the step at least at the lower end of the hole, and therefore includes a portion 37c1 that is raised sideways from a portion of the upper end portion of the outer side surface of the semiconductor film 27. In other words, the block insulation film 24, the insulation film 25, and the tunnel oxide film 26 are formed on the outer side surface and the lower surface of the portion 37c1 of the semiconductor film 37c.

On the other hand, the selection transistor pillar SHd has a relatively small amount of deviation (deviation e2) from the center of the insulation film 28. Accordingly, the semiconductor film 37d fills in the hole formed on the semiconductor films 27 and 29.

In the example of FIG. 19, the semiconductor film 37 is buried to a predetermined level above the memory structure MST and below the lower surface of the conductor 23, regardless of the shape of the lower end of the hole. That is, the semiconductor film 37c includes a portion 37c1 that is raised sideways from a portion of the upper end portion of the outer side surface of the semiconductor film 27, and a portion 37c2 that is coupled to the upper surface of the portion 37c1. The semiconductor film 37 is formed by epitaxial growth from the semiconductor films 27 and 29, and can therefore be regarded as a part of the semiconductor films 27 and 29. It is preferable that the semiconductor film 37 has a height equal to or greater than 40 nanometers (nm) relative to the upper surface of the semiconductor films 27 and 29, for example.

Selection transistor pillars SHc and SHd are provided on the semiconductor films 37c and 37d, respectively. The selection transistor pillar SH is provided to penetrate the conductor 23, so as to reach the semiconductor film 37, for example, from above the conductor 23. The selection transistor pillar SH includes, for example, a block insulation film 31, an insulation film 32, a tunnel oxide film 33, and semiconductor films 34 and 35.

A block insulation film 31 is provided on an inner wall of a hole in which the selection transistor pillar SH is to be formed, an insulation film 32 is provided on an inner wall of the block insulation film 31, a tunnel oxide film 33 is provided on an inner wall of the insulation film 32, and a semiconductor film 34 is provided on an inner wall of the tunnel oxide film 33. A semiconductor film 35, for example, is buried inside the semiconductor film 34.

Specifically, an additional hole that penetrates the films 34 to 31 and reaches the semiconductor film 37 is provided in the portion in which the semiconductor film 34, the tunnel oxide film 33, the insulation film 32, and the block insulation film 31 are stacked along the Z direction, and the semiconductor film 35 is buried in the additional hole. Thereby, the semiconductor films 34 and 35 are electrically coupled to the semiconductor films 27 and 29 via the semiconductor film 37. That is, the semiconductor film 37 functions as a contact that electrically couples the memory pillar MH and the selection transistor pillar SH.

2. 2 Manufacturing Method of Memory Cell Array

Next, a manufacturing method of the semiconductor memory according to the second embodiment will be described with reference to FIGS. 20 to 29. FIGS. 20 to 29 are cross-sectional views for explaining the manufacturing method of the semiconductor memory according to the second embodiment, in which mainly a process of forming a memory pillar MH and a selection transistor pillar SH, is shown. In the explanation that follows, let us assume that the string units SU0 and SU1 are formed substantially symmetrical to each other in the X direction, with the slit SHE formed at the center.

First, a process corresponding to FIGS. 5 to 7 explained in the first embodiment is performed. That is, a stack body including replacement materials 41 and 42 and insulation films 43 and 44 are formed above a p-type well area 20, and memory structures MST that penetrate the stack body are formed.

Thereafter, as shown in FIG. 20, an insulation film 50 is provided on the upper surface of the insulation film 44 and the memory structures MST. A single-layer conductor 23 is provided on the insulation film 50, and an insulation film 49 is further provided on the conductor 23.

Figure 21:
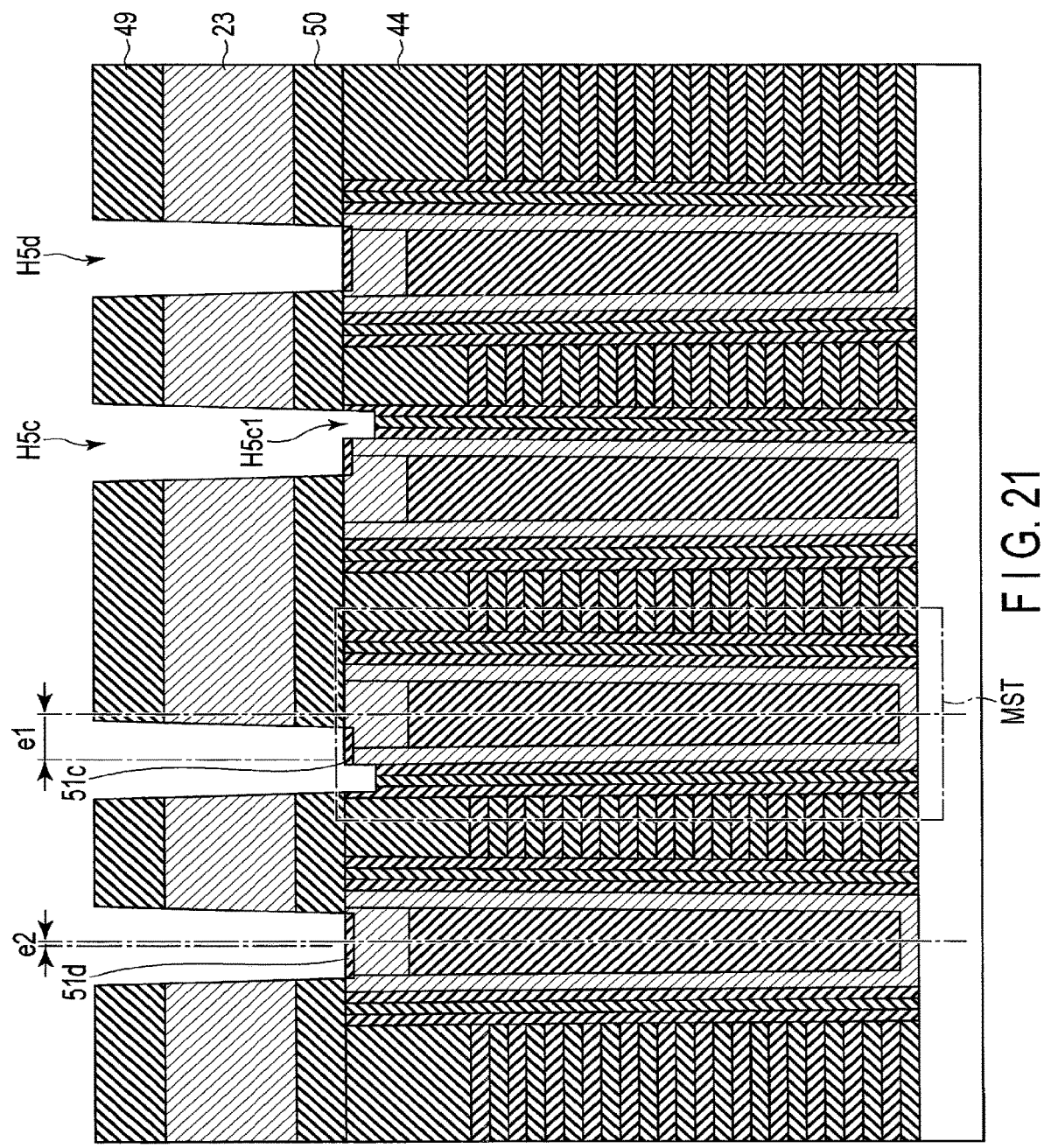
FIG. 21 is a cross-sectional view for explaining a manufacturing method of the memory cell array of the semiconductor memory according to the second embodiment.

Thereafter, as shown in FIG. 21, anisotropic etching is performed on areas in which the selection transistor pillars SHc and SHd are to be formed. Thereby, holes H5 (H5c and H5d) that penetrate the insulation film 49, the conductor 23, and the insulation film 50 and reach the interior of the memory structure MST are formed. The amount of deviation of the center of the hole H5 from the center of the insulation film 28 may differ according to the position of the hole H5.

In the example shown in FIG. 21, not only semiconductor films 27 and 29, but also a block insulation film 24, an insulation film 25, and a tunnel oxide film 26, which are more easily etched, are exposed to an etching gas at the lower end of the hole H5c having a relatively large deviation (deviation e1). Accordingly, at the lower end of the hole H5c, the surface to which the block insulation film 24, the insulation film 25, and the tunnel oxide film 26 are etched is positioned below the surface to which the semiconductor films 27 and 29 are etched. A hole H5c1 is formed in a portion of the lower end of the hole H5c in which the block insulation film 24, the insulation film 25, and the tunnel oxide film 26 are etched. Since the block insulation film 24, the insulation film 25, and the tunnel oxide film 26 are not etched at the lower end of the hole H5d having a relatively small amount of deviation (deviation e2), a flat surface is formed at the lower end of the hole H5d.

The semiconductor films 27 and 29 are damaged by being etched. Thereby, an oxide film is formed on the upper surface of the etched semiconductor films 27 and 29. More specifically, an oxide film 51c is formed on the semiconductor films 27 and 29 of the hole H5c, and an oxide film 51d is formed on the semiconductor films 27 and 29 of the hole H5d. Accordingly, there is a possibility that the semiconductor films 27 and 29 are not exposed at the lower end of the hole H5d immediately after the etching is completed. On the other hand, at the lower end of the hole H5c, the semiconductor film 27 may be exposed at a step portion (side surface of the hole H5c1) between the etching surface of the semiconductor films 27 and 29, and the etching surface of the block insulation film 24, the insulation film 25, and the tunnel oxide film 26.

Figure 22:
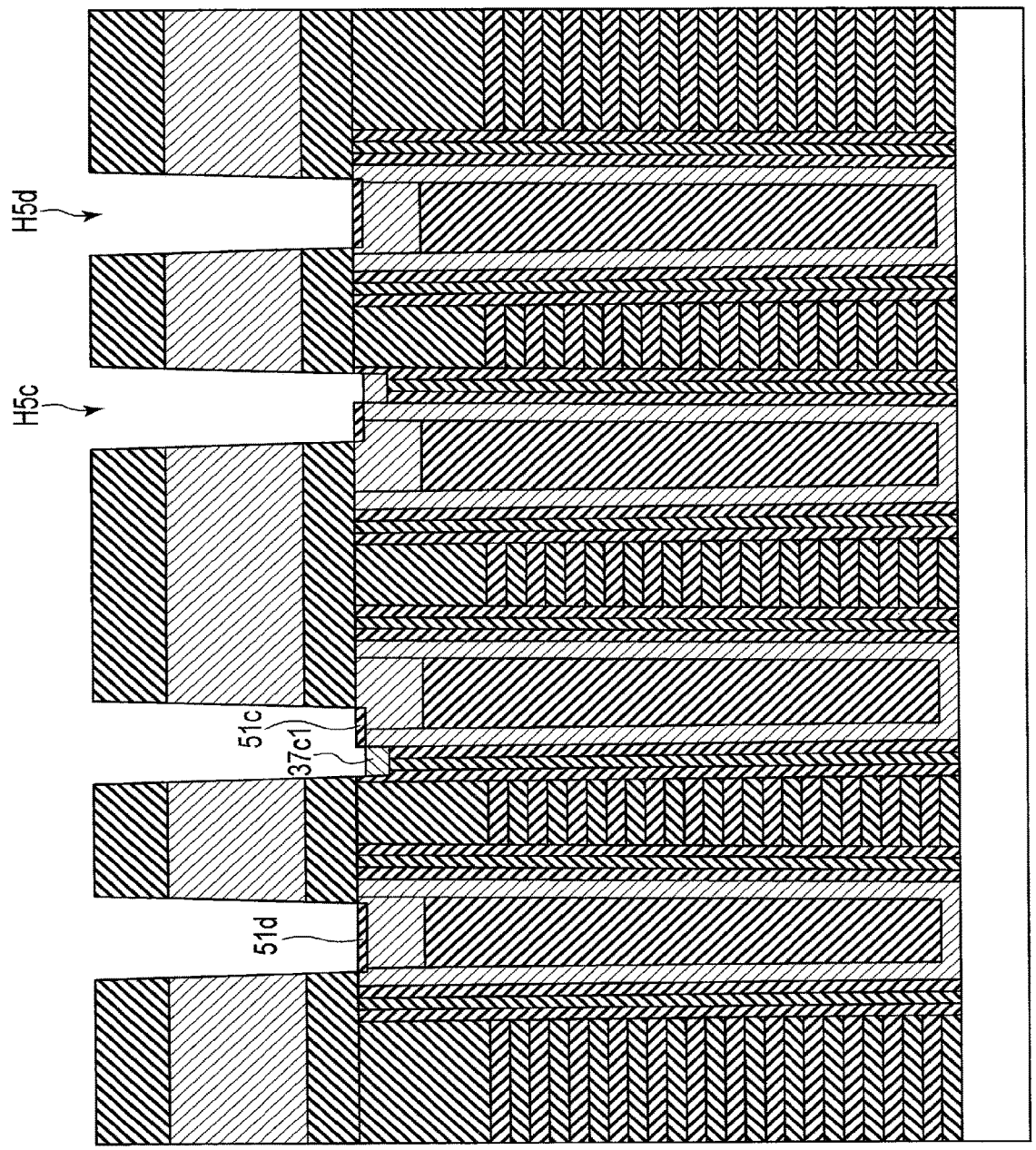
FIG. 22 is a cross-sectional view for explaining a manufacturing method of the memory cell array of the semiconductor memory according to the second embodiment.

Thereafter, as shown in FIG. 22, a portion 37c1 of the semiconductor film 37c is selectively epitaxially grown from the side surface of the hole H5c1 by selective CVD. The portion 37c1 of the semiconductor film 37c is grown along a direction vertical to the side surface of the semiconductor film 27 (i.e., in a lateral direction along the XY plane). Accordingly, the hole H5c1 is filled with the portion 37c1 of the semiconductor film 37c.

Figure 23:
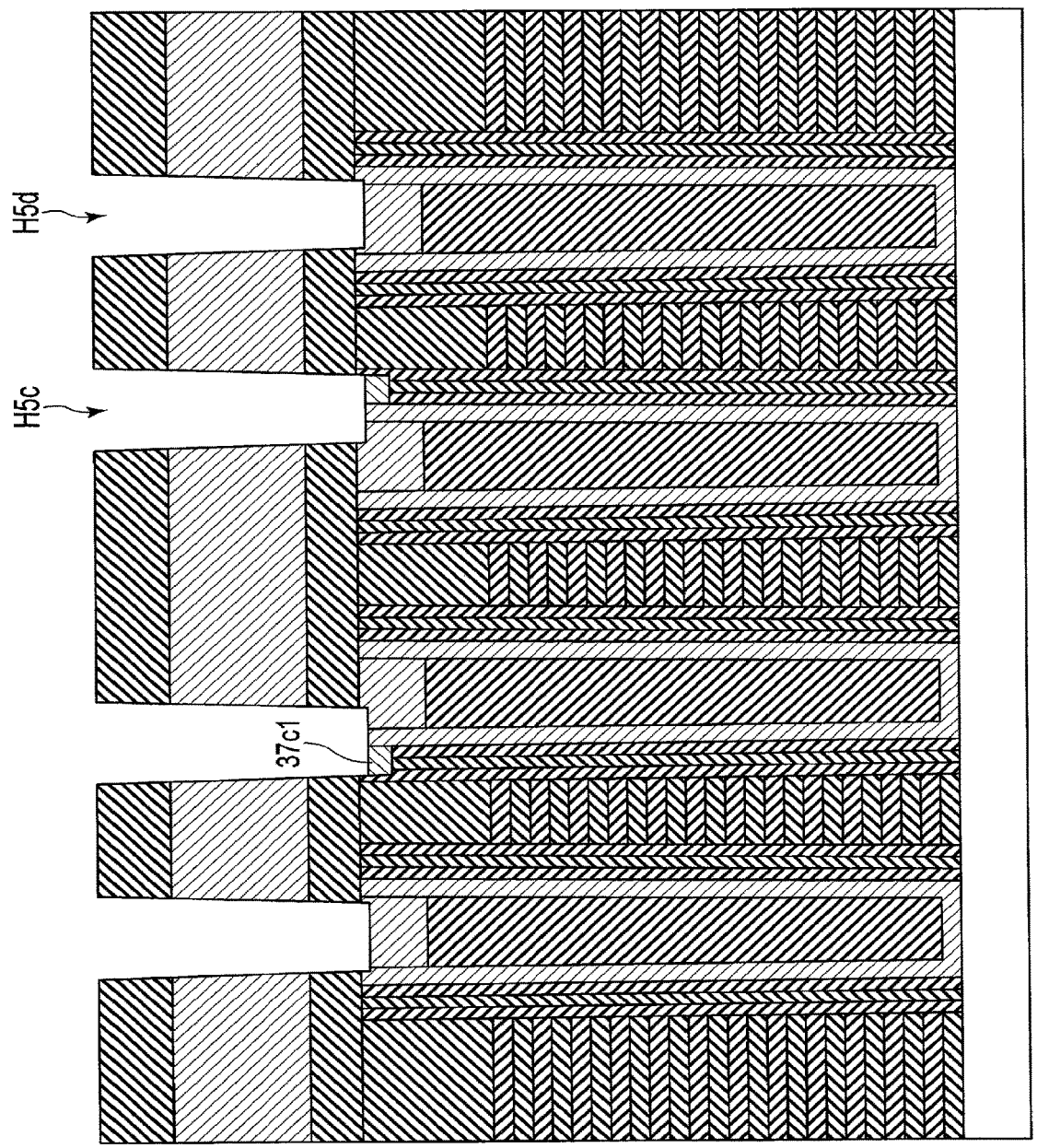
FIG. 23 is a cross-sectional view for explaining a manufacturing method of the memory cell array of the semiconductor memory according to the second embodiment.

Thereafter, as shown in FIG. 23, the oxide films 51c and 51d are removed.

Figure 24:
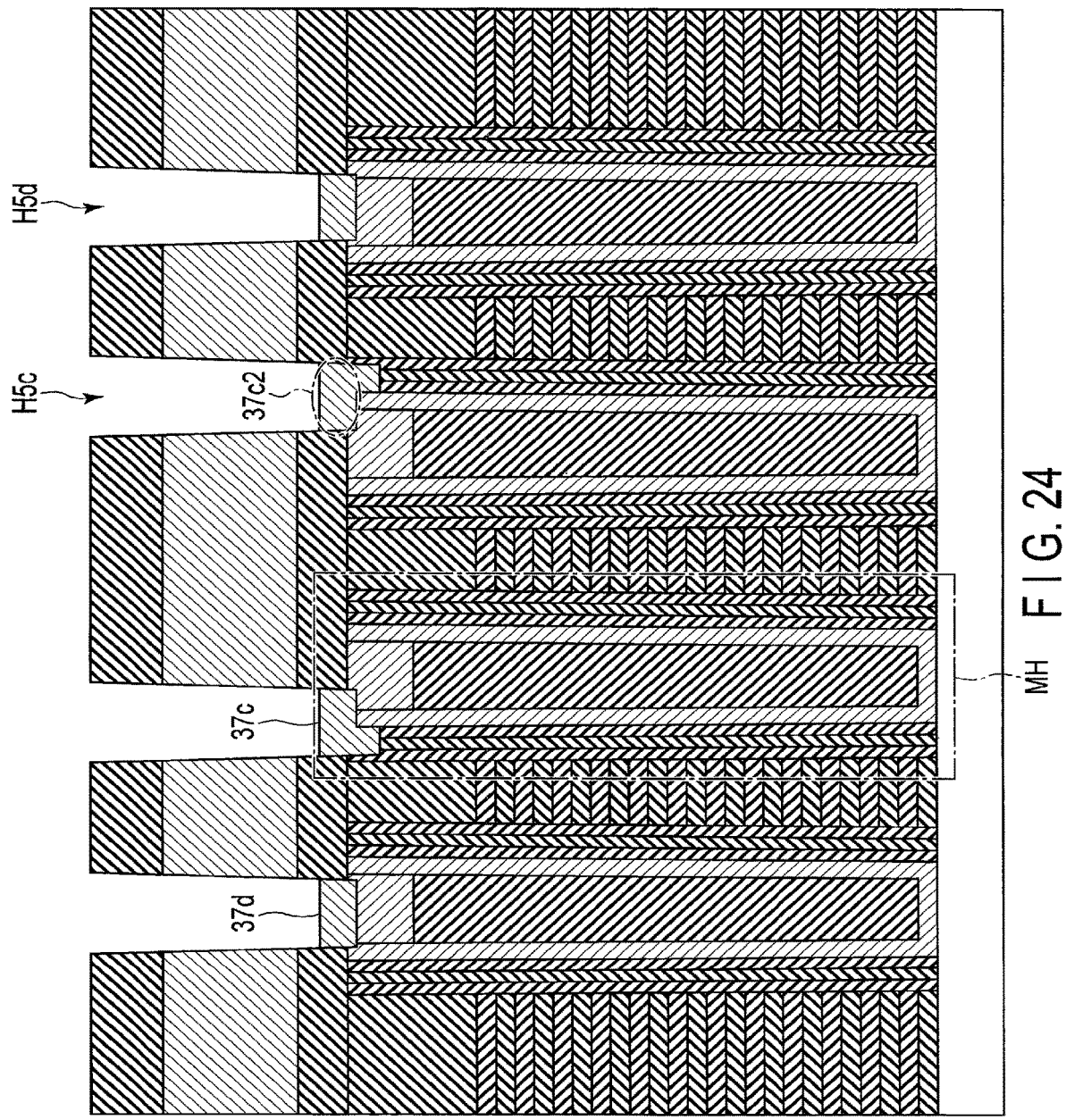
FIG. 24 is a cross-sectional view for explaining a manufacturing method of the memory cell array of the semiconductor memory according to the second embodiment.

Thereafter, as shown in FIG. 24, a portion 37c2 of the semiconductor film 37c is epitaxially grown from the semiconductor films 27 and 29 at the lower end of the hole H5c and the portion 37c1 of the semiconductor film 37c, and a semiconductor film 37d is epitaxially grown from the semiconductor films 27 and 29 at the lower end of the hole H5d, by selective CVD. Thereby, the memory pillars MH are formed, and semiconductor films 37c and 37d are respectively buried in the holes H5c and H5d to a level above the memory structures MST and below the conductor 23.

After the semiconductor film 37 is formed, the semiconductor films 37 and 29 are doped with $N^+$-type impurities by ion implantation, for example. Thereby, a contact resistance between the selection transistor ST1 and the memory cell transistor MT is further reduced.

Figure 25:
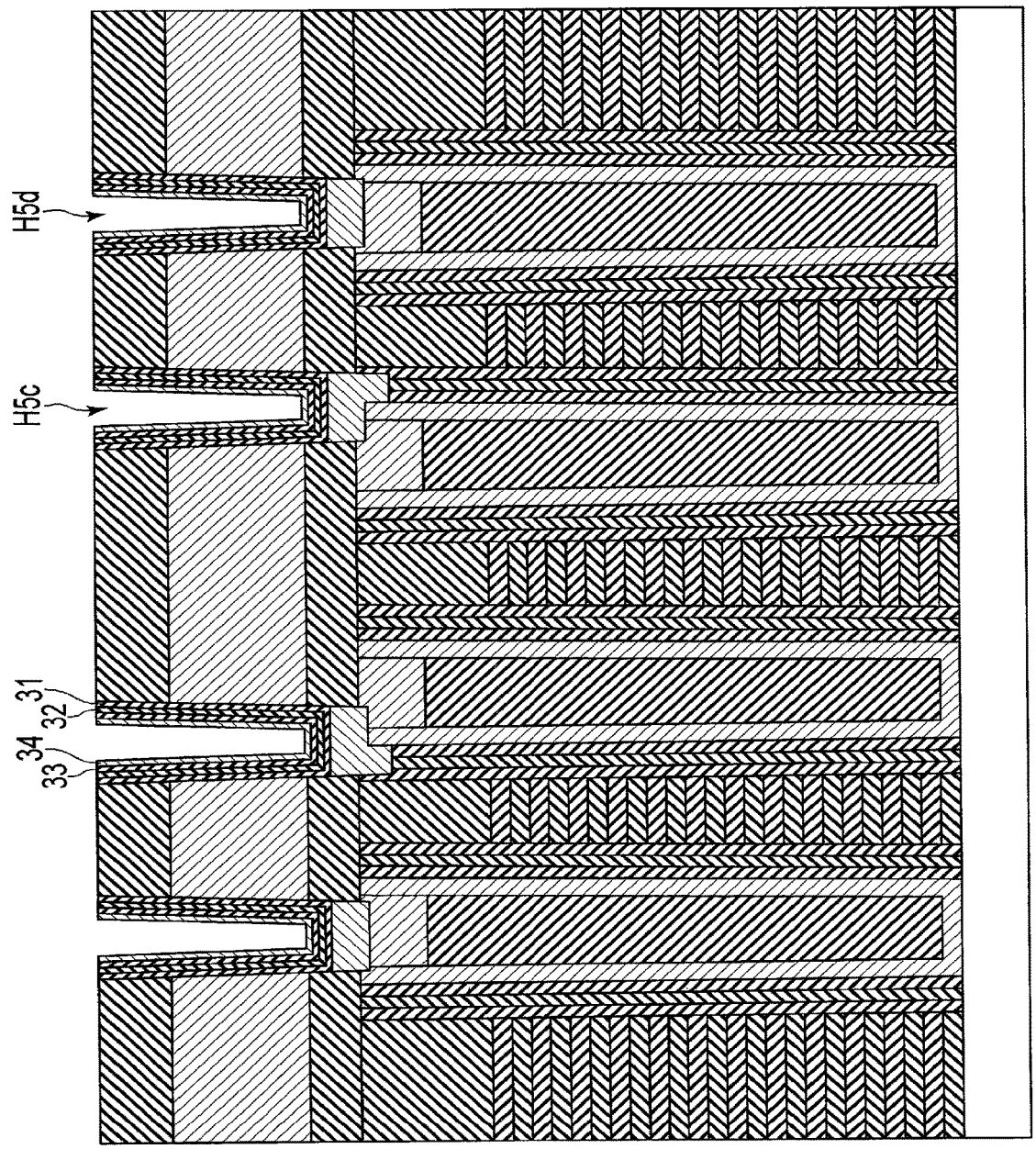
FIG. 25 is a cross-sectional view for explaining a manufacturing method of the memory cell array of the semiconductor memory according to the second embodiment.

Thereafter, as shown in FIG. 25, a block insulation film 31, an insulation film 32, a tunnel oxide film 33, and a semiconductor film 34 are sequentially formed by CVD, for example, in a space above the semiconductor film 37c in the hole H5c and in a space above the semiconductor film 37d in the hole H5d.

Figure 26:
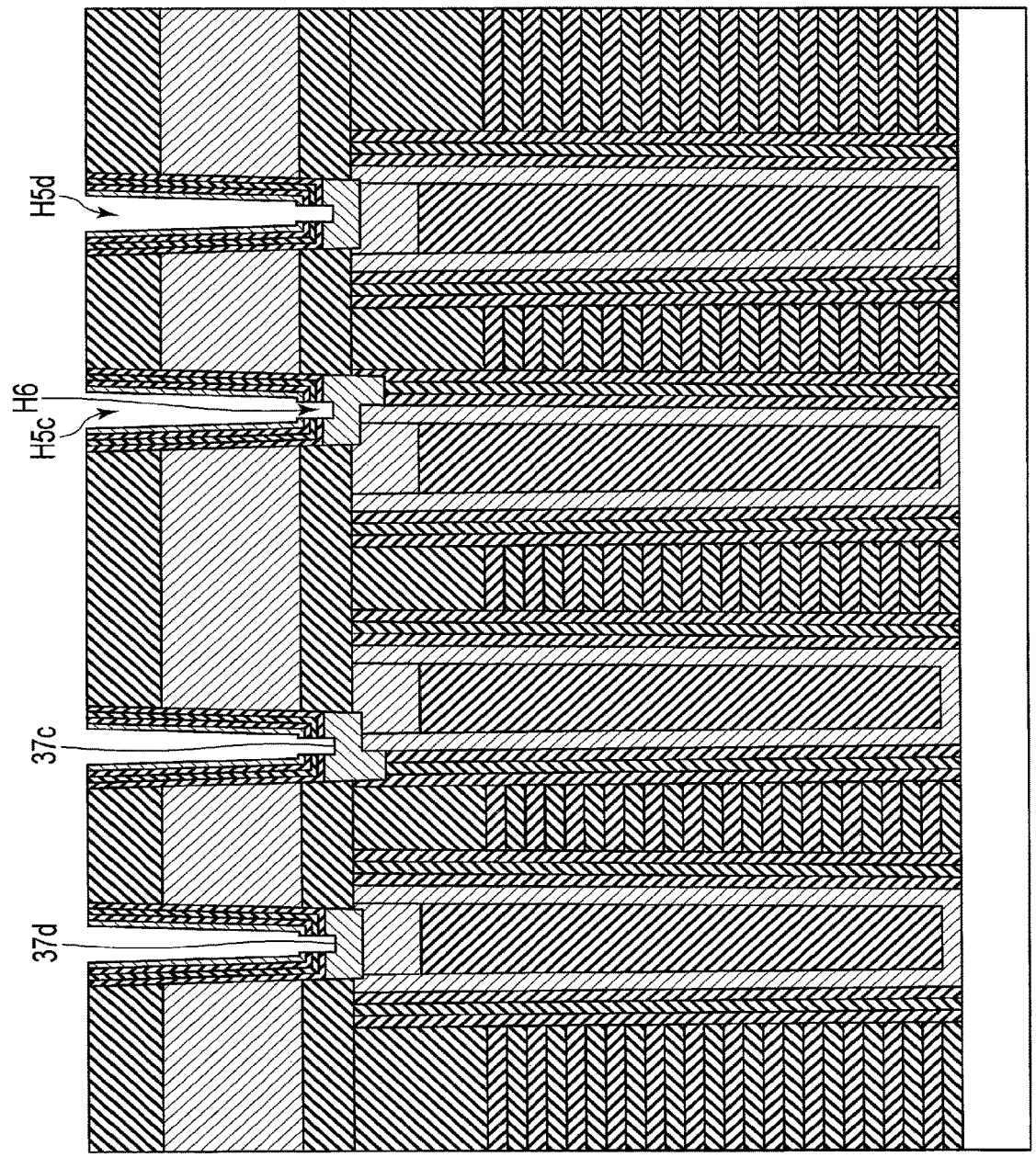
FIG. 26 is a cross-sectional view for explaining a manufacturing method of the memory cell array of the semiconductor memory according to the second embodiment.

Thereafter, as shown in FIG. 26, a hole H6 that penetrates the semiconductor film 34, the tunnel oxide film 33, the insulation film 32, and the block insulation film 31 and reaches the semiconductor film 37 is formed by, for example, anisotropic etching.

Figure 27:
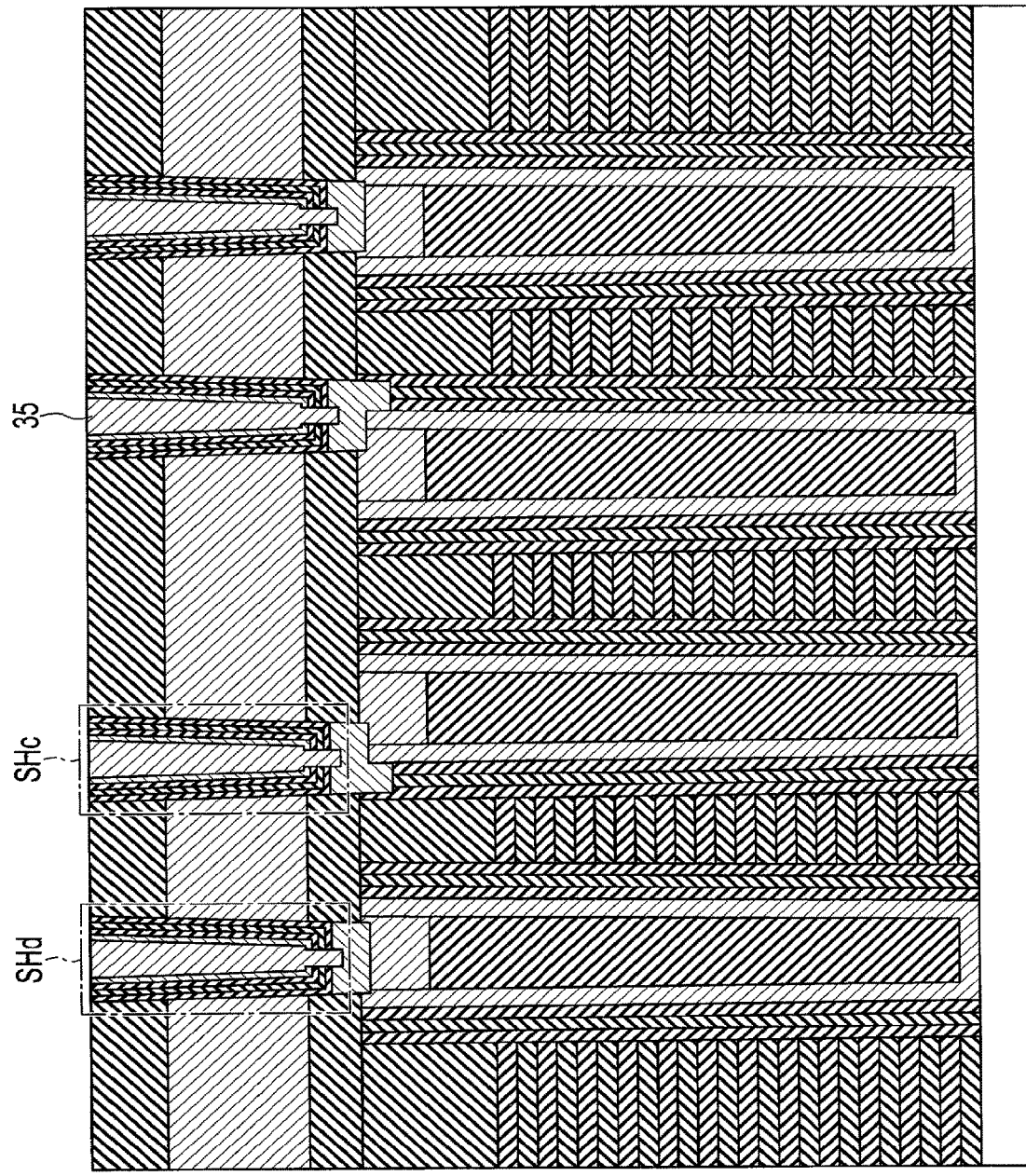
FIG. 27 is a cross-sectional view for explaining a manufacturing method of the memory cell array of the semiconductor memory according to the second embodiment.

Thereafter, as shown in FIG. 27, a semiconductor film 35 is formed by CVD, for example, so as to fill in the holes H6 and H5. Thereby, the semiconductor films 34 and 35 are electrically coupled to the semiconductor films 27 and 29 via the semiconductor film 37.

Figure 28:
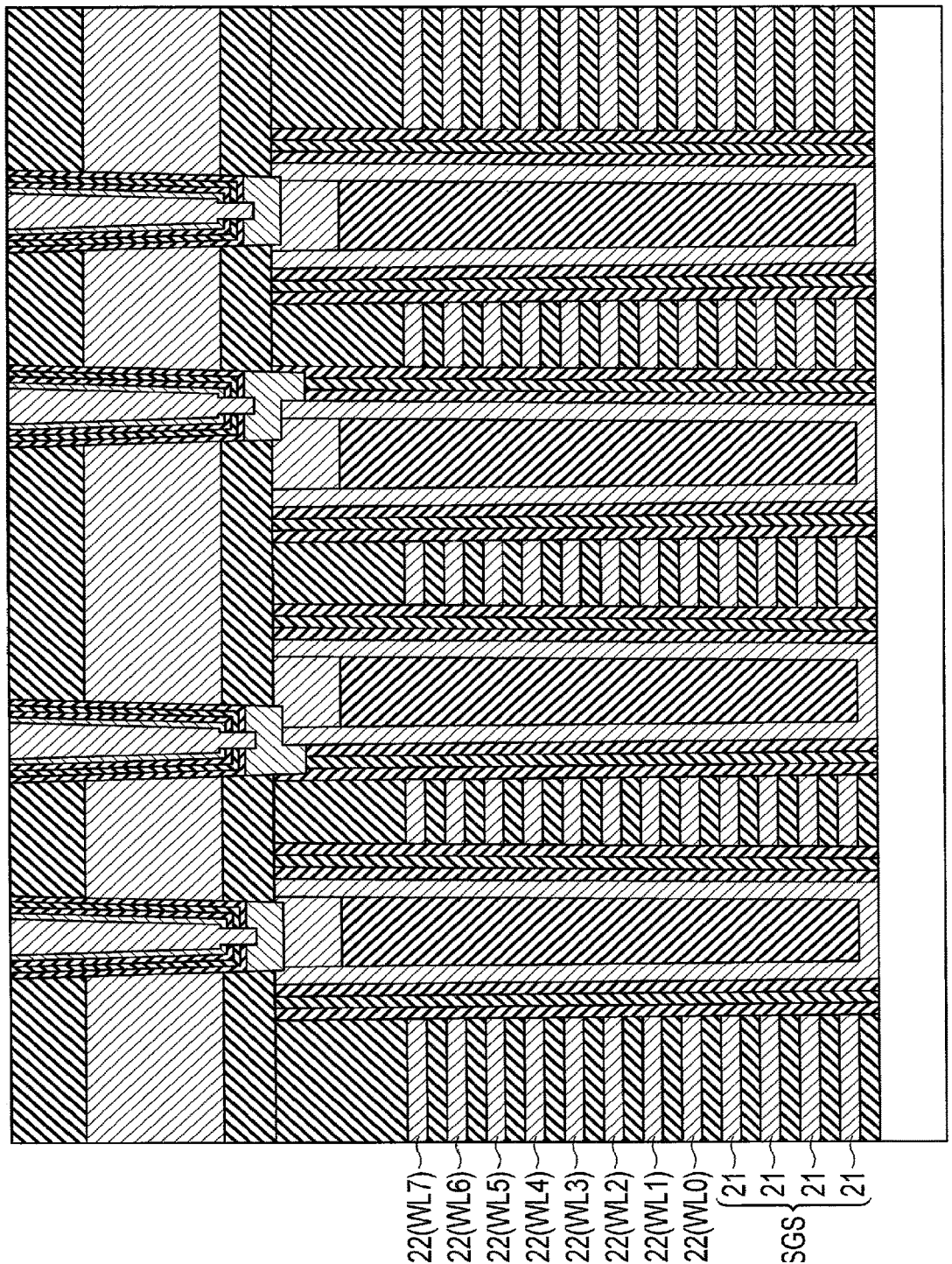
FIG. 28 is a cross-sectional view for explaining a manufacturing method of the memory cell array of the semiconductor memory according to the second embodiment.

Thereafter, as shown in FIG. 28, the replacement materials 41 and 42 are replaced with the conductors 21 and 22, respectively. Since the replacement materials 41 and 42 are nitrides, as described above, they can be removed simultaneously by wet etching, which allows the nitride films to display a higher selectivity than, for example, the insulation films 43, 44, 49, and 50, which are oxides. Thereafter, conductors 21 and 22 are formed in a space generated by removing the replacement materials 41 and 42. The conductors 21 and 22 respectively function as a selection gate line SGS and word lines WL0 to WL7.

Thereafter, as shown in FIG. 29, a slit SHE for electrically decoupling the selection gate lines SGD between the string units SU is formed. Specifically, a trench (not shown in the drawings) for forming an insulation film 36 is formed in a position corresponding to a boundary of adjacent string units SU (string units SU0 and SU1 in the example of FIG. 29) by anisotropic etching, for example. The trench penetrates the insulation film 49 and the conductor 23, and reaches the depth below the conductor 23 and above the memory structure MST. Thereafter, an insulation film 36 is buried in the trench. Thereby, the conductor 23 is divided into conductors 23a and 23b, which are electrically decoupled from each other. The conductors 23a and 23b function as a selection gate line SGD0 of the string unit SU0, and as a selection gate line SGD1 of the string unit SU1 respectively.

In the above-described manner, the process of forming the memory pillars MH and the selection transistor pillars SH is completed.

2. 3 Advantageous Effects of Present Embodiment

According to the second embodiment, holes H5 that reach memory structures MST are formed for formation of selection transistor pillars SH. When the selection transistor pillar SH is greatly deviated from the memory structure MST, a hole H5c1 is further formed in a hole H5c by etching a block insulation film 24, an insulation film 25, and a tunnel oxide film 26 to a level deeper than the semiconductor films 27 and 29. The hole H5c1 is filled in by a portion 37c1 of the semiconductor film 37c epitaxially grown from the semiconductor film 27 on a side surface of the hole H5c1. Thereby, it is possible to ensure a contact area between the semiconductor film 35 and the semiconductor film 37c, even in the case where the semiconductor film 35 is positioned immediately above the films 24 to 26 as a result of the deviation of the selection transistor pillar SH. Therefore, it is possible to suppress an increase in contact resistance in the NAND string NS.

Also, the semiconductor film 37c reaches a level above the memory structure MST and below the conductor 23, by further epitaxial growth from the state of filling in the hole H5c1. Thereby, it is possible to ease restrictions on the diameter of the hole H5, compared to the case where the semiconductor film 37 is not formed. In addition, it is preferable that the semiconductor film 37 exposed to the inside of the hole H6 in which the semiconductor film 35 is to be formed has a predetermined surface area, for the purpose of suppressing an increase in contact resistance. On the other hand, in order to improve the characteristics of the selection transistor ST1, it is preferable that the films 31 to 34 formed in the selection transistor pillar SH have a predetermined thickness, and the area of the semiconductor film 37 exposed to the bottom surface of the hole H6 may decrease as the thickness of the films 31 to 34 increases, under the condition where the hole H5 has a certain diameter.

According to the second embodiment, the films 31 to 34 are formed on the semiconductor film 37 epitaxially grown to a level above the memory structure MST. Thereby, the surface area of the semiconductor film 37 exposed to the inside of the hole H6 can be ensured on the side surface of the hole H6 by the height of the semiconductor film 37 along the Z direction, regardless of the diameter of the hole H5 or the thickness of the films 31 to 34. Accordingly, it is possible to form the films 31 to 34 with a larger thickness, while increasing the area of the semiconductor film 37 exposed to the hole H6. Therefore, it is possible to ease restrictions on the limit of the thickness of the films 34 to 31, while suppressing an increase in contact resistance in the NAND string NS.

3. Third Embodiment

Next, a semiconductor memory according to a third embodiment will be described. In the second embodiment, a case has been explained where a semiconductor film 37 is formed in a hole H5 in which a selection transistor pillar SH is to be formed, and then films 31 to 34 are formed. In the third embodiment, a block insulation film 31 and an insulation film 32 are formed in a hole in which a selection transistor pillar SH is to be formed, and an additional hole that penetrates its lower surface is formed. The difference from the second embodiment is that, after a semiconductor film 37 that fills in the additional hole is formed, a tunnel oxide film 33 and a semiconductor film 34 are formed on the semiconductor film 37.

In the explanation that follows, mainly those configurations and manufacturing processes that are different from those of the second embodiment will be explained, and the explanation of similar configurations and manufacturing processes will be omitted.

3. 1 Configuration of Memory Cell Array

Figure 30:
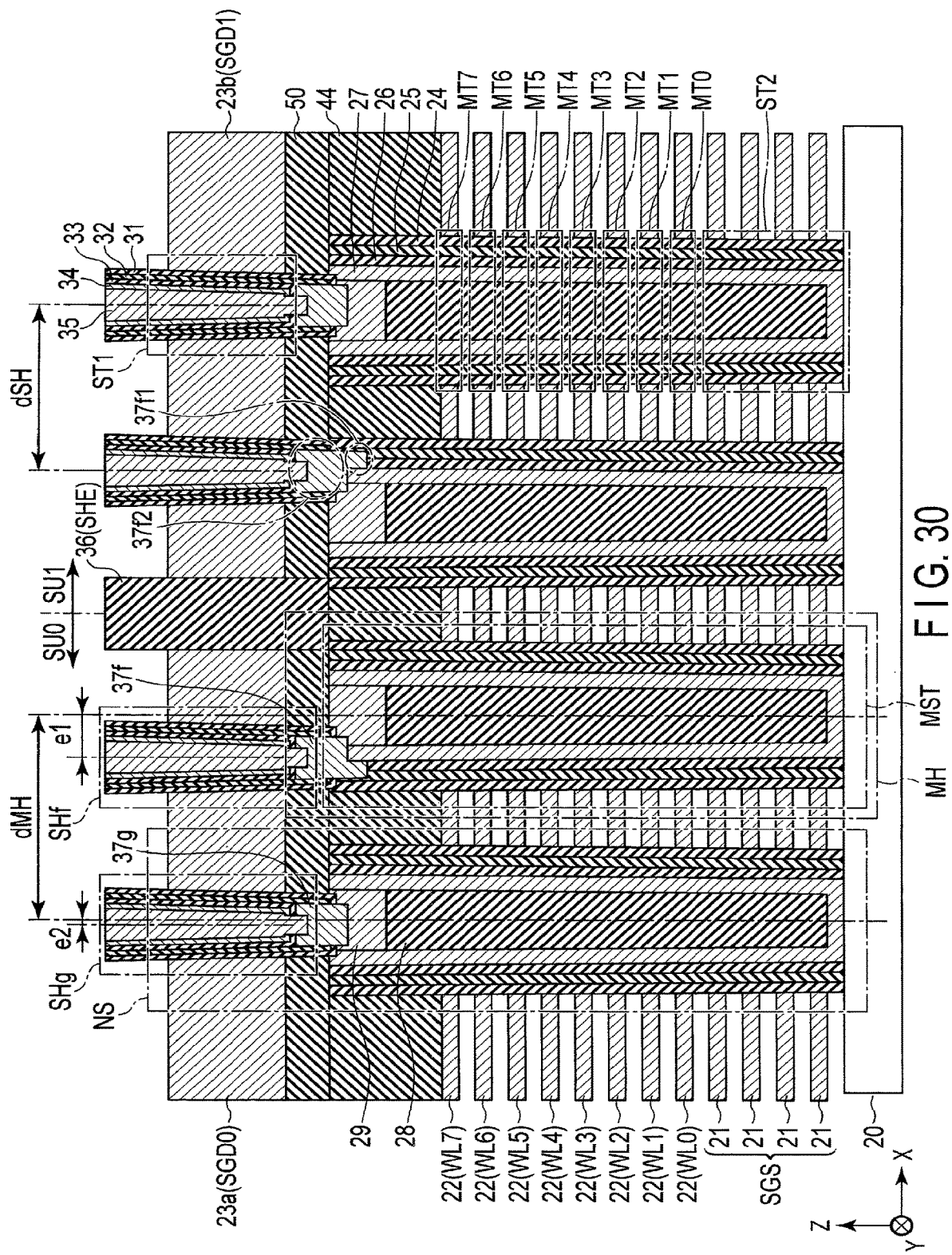
FIG. 30 is a cross-sectional view for explaining a configuration of a memory cell array of a semiconductor memory according to a third embodiment.

FIG. 30 is a cross-sectional view for explaining a configuration of a memory cell array of the semiconductor memory according to the third embodiment. FIG. 30 corresponds to FIG. 19 explained in the second embodiment. In FIG. 30, illustration of interlayer insulation films is suitably omitted, except for the films between the conductors 22 and the conductor 23.

As shown in FIG. 30, four-layer conductors 21, eight-layer conductors 22, and a single-layer conductor 23, for example, are stacked in this order via interlayer insulation films above a p-type well area 20, as in FIG. 19. Memory structures MST with a configuration similar to that of FIG. 19 each of which is a portion of the memory pillar MH are provided to penetrate the conductors 22 and 21. Of the interlayer insulation films, insulation films 44 and 50 provided between the conductors 22 and 23 are shown in FIG. 30. An insulation film 50 is provided on the upper surfaces of the insulation film 44 and the memory structures MST, and fills in the gaps between the memory structures MST and the conductor 23.

Semiconductor film 37 (37f or 37g) is provided on the corresponding memory structure MST as an additional portion of the memory pillar MH. The semiconductor film 37 is provided in a hole formed on the corresponding memory pillar MH. The shape of the lower end of the hole may differ according to the amount of deviation of the center of the selection transistor pillar SH (SHf or SHg) from the center of the memory pillar MH (the center of the insulation film 28 which is a core portion of the memory pillar MH).

In the example of FIG. 30, the selection transistor pillar SHf has a relatively large deviation (deviation e1) from the center of the insulation film 28. Accordingly, the hole is formed by etching the block insulation film 24, the insulation film 25, and the tunnel oxide film 26, in addition to the semiconductor films 27 and 29. The lower end of the hole has a step configured in such a manner so that the tops of the block insulation film 24, the insulation film 25, and the tunnel oxide film 26 are positioned below the tops of the semiconductor films 27 and 29. The semiconductor film 37f is formed to fill in the step at least at the lower end of the hole, and therefore includes a portion 37f1 that is raised sideways from a portion of the upper end portion of the outer side surface of the semiconductor film 27.

On the other hand, the selection transistor pillar SHg has a relatively small deviation (deviation e2) from the center of the insulation film 28. Accordingly, the semiconductor film 37g fills in the hole formed on the semiconductor films 27 and 29.

In the example of FIG. 30, the semiconductor film 37 is buried to a predetermined level above the memory structure MST and below the conductor 23, regardless of the shape of the lower end of the hole. That is, the semiconductor film 37f includes a portion 37f1 that is raised sideways from a portion of the upper end portion of the outer side surface of the semiconductor film 27 and a portion 37f2 that is coupled to the upper surface of the portion 37f1. As will be described later, the semiconductor film 37 is formed by epitaxial growth from the semiconductor films 27 and 29, and can be regarded as a part of the semiconductor films 27 and 29. It is preferable that the semiconductor film 37 has a height equal to or greater than 40 nanometers (nm) relative to the upper surface of the memory structure MST, for example.

A block insulation film 31 is provided on an inner wall of the hole, and an insulation film 32 is provided on an inner wall of the block insulation film 31. The semiconductor film 37 is formed in a hole in which the block insulation film 31 and the insulation film 32 are provided. A tunnel oxide film 33 is provided on an inner wall of the hole in which the semiconductor film 37 is formed, and a semiconductor film 34 is provided on an inner wall of the tunnel oxide film 33. A semiconductor film 35, for example, is buried inside the semiconductor film 34.

Specifically, an additional hole that penetrates the semiconductor film 34 and the tunnel oxide film 33 and reaches the semiconductor film 37, is provided in a portion in which the semiconductor film 34 and the tunnel oxide film 33 are stacked along the Z direction, and a semiconductor film 35 is buried in the additional hole. Thereby, the semiconductor films 34 and 35 are electrically coupled to the semiconductor films 27 and 29 via the semiconductor film 37. That is, the semiconductor film 37 functions as a contact that electrically couples the memory pillar MH and the selection transistor pillar SH.

3. 2 Manufacturing Method of Memory Cell Array

Next, a manufacturing method of the semiconductor memory according to the third embodiment will be described with reference to FIGS. 31 to 37. FIGS. 31 to 37 are cross-sectional views for explaining the manufacturing method of the semiconductor memory according to the third embodiment, in which mainly a process of forming a memory pillar MH and a selection transistor pillar SH, is shown. In the explanation that follows, let us assume that the string units SU0 and SU1 are formed substantially symmetrical to each other in the X direction, with the slit SHE formed at the center.

First, processes until the process corresponding to FIG. 20 explained in the second embodiment are executed. That is, a stack body including replacement materials 41 and 42 and insulation films 43 and 44 is formed above a p-type well area 20, and memory structures MST that penetrate the stack body are formed. An insulation film 50 is provided on the upper surface of the insulation film 44 and the memory structures MST. A single-layer conductor 23 is provided on the insulation film 50, and an insulation film 49 is further provided on the conductor 23.

Figure 31:
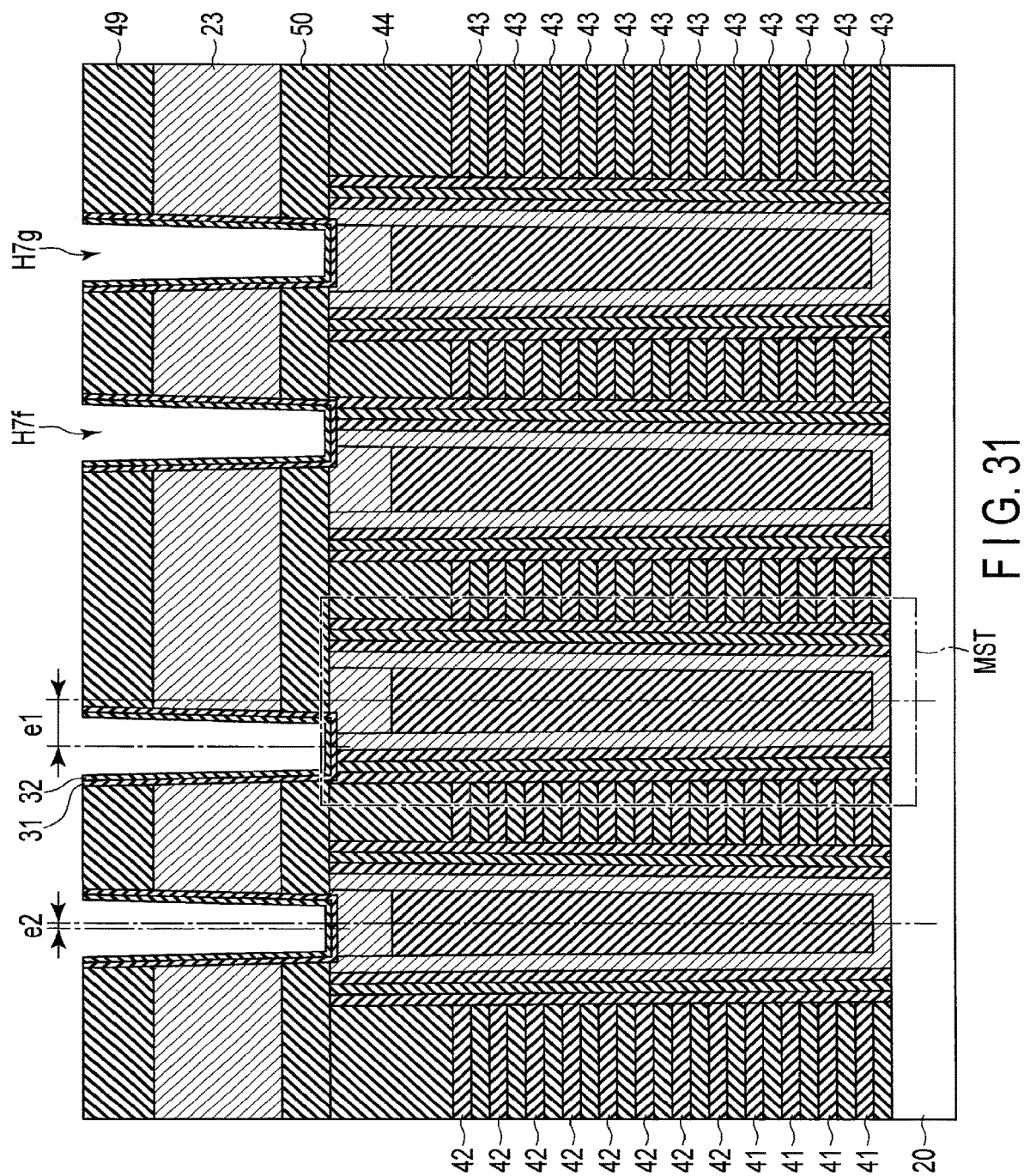
FIG. 31 is a cross-sectional view for explaining a manufacturing method of the memory cell array of the semiconductor memory according to the third embodiment.

Thereafter, as shown in FIG. 31, anisotropic etching is performed on areas in which selection transistor pillars SHf and SHg are to be formed. Thereby, holes H7 (H7f and H7g) that penetrate the insulation film 49, the conductor 23, and the insulation film 50, and reach the tops of the memory structures MST are formed. The amount of deviation of the center of the hole H7 from the center of the insulation film 28 may differ according to the position of the hole H7.

In the example shown in FIG. 31, the hole H7f has a relatively large amount of deviation (deviation e1) from the center of the corresponding insulation film 28. On the other hand, the hole H7g has a relatively small amount of deviation (deviation e2) from the center of the corresponding insulation film 28. A block insulation film 31 and an insulation film 32 are sequentially formed in the holes H7f and H7g.

Figure 32:
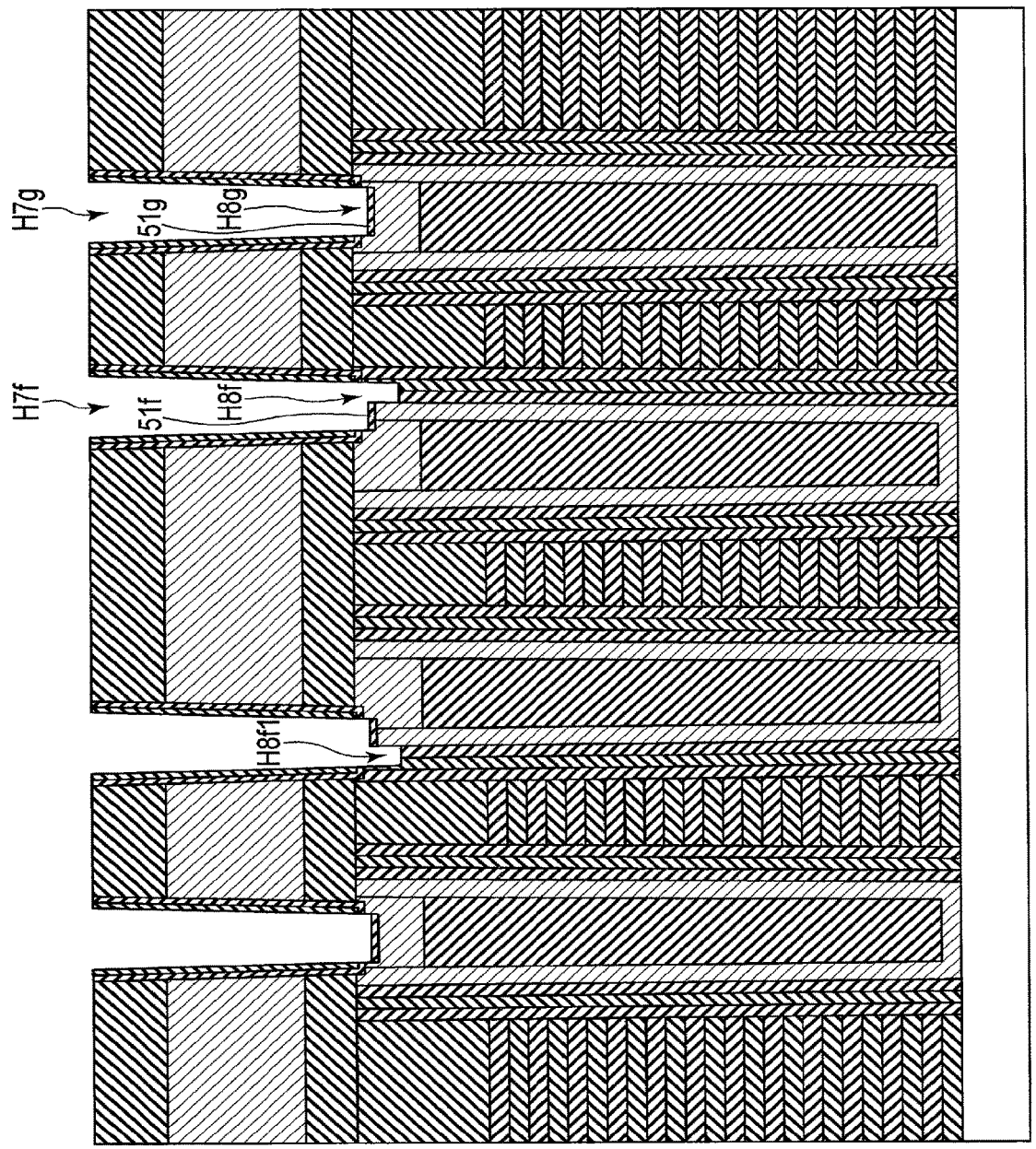
FIG. 32 is a cross-sectional view for explaining a manufacturing method of the memory cell array of the semiconductor memory according to the third embodiment.

Thereafter, as shown in FIG. 32, holes H8 (H8f and H8g) that reach the interior of the memory structures MST are further formed in the holes H7f and H7g, respectively, by anisotropic etching, for example. More specifically, the hole H8 is formed to penetrate the insulation film 32 and the block insulation film 31 in a portion of the hole H7 in which the block insulation film 31 and the insulation film 32 are stacked along the Z direction.

As described above, the hole H7f has a relatively large amount of deviation from the center of the insulation film 28. Accordingly, at the lower end of the hole H8f additionally formed in the lower surface of the hole H7f, a block insulation film 24, an insulation film 25, and a tunnel oxide film 26, which are easily etched, as well as the semiconductor films 27 and 29, are exposed to an etching gas. Therefore, at the lower end of the hole H8f, the surface to which the block insulation film 24, the insulation film 25, and the tunnel oxide film 26 are etched is positioned below the surface to which the semiconductor films 27 and 29 are etched. A hole H8/1 is formed in a portion of the lower end of the hole H8f in which the block insulation film 24, the insulation film 25, and the tunnel oxide film 26 are etched. As described above, the hole H7g has a relatively small amount of deviation from the center of the insulation film 28. Accordingly, at the lower end of the hole H8g additionally formed in the lower surface of the hole H7g, the block insulation film 24, the insulation film 25, and the tunnel oxide film 26 are not etched, and a flat surface is formed.

The semiconductor films 27 and 29 are damaged by being etched. Thereby, an oxide film is formed on each of the upper surfaces of the etched semiconductor films 27 and 29. More specifically, an oxide film 51f is formed on the semiconductor films 27 and 29 of the hole H8f, and an oxide film 51g is formed on the semiconductor films 27 and 29 of the hole H8g. Accordingly, there is a possibility that the semiconductor films 27 and 29 are not exposed at the lower end of the hole H8g immediately after the etching is completed. On the other hand, at the lower end of the hole H8f, the semiconductor film 27 may be exposed at a step portion (side surface of the hole H8/1) between the etching surface of the semiconductor films 27 and 29, and the etching surface of the block insulation film 24, the insulation film 25, and the tunnel oxide film 26.

Figure 33:
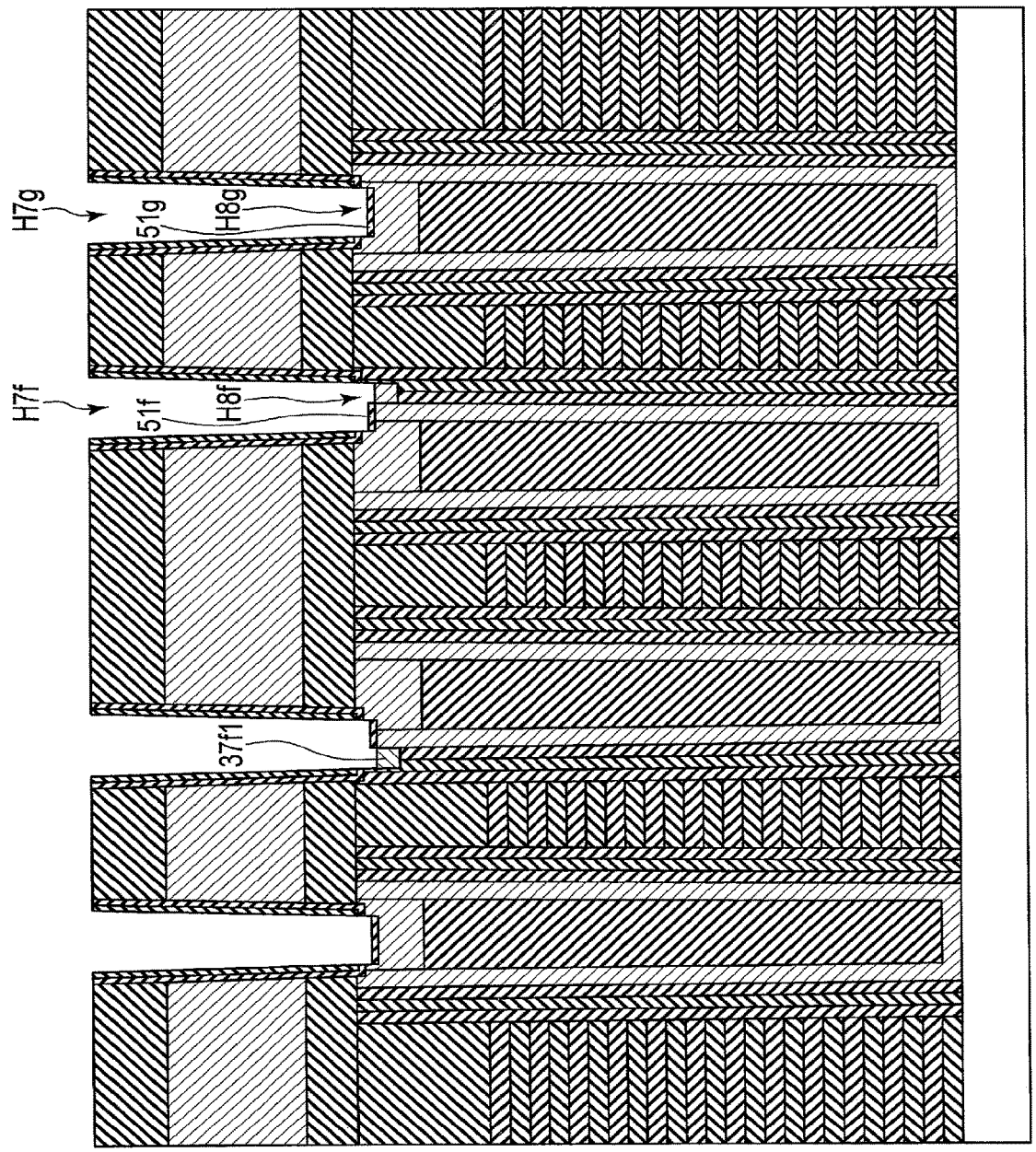
FIG. 33 is a cross-sectional view for explaining a manufacturing method of the memory cell array of the semiconductor memory according to the third embodiment.

Thereafter, as shown in FIG. 33, a portion 37/1 of the semiconductor film 37f is selectively epitaxially grown from the side surface of the hole H8/1 by selective CVD. The portion 37/1 of the semiconductor film 37f is grown in a direction vertical to the side surface of the semiconductor film 27 (i.e., in the lateral direction along the XY plane). Accordingly, the hole H8/1 is filled with the portion 37/1 of the semiconductor film 37f.

Figure 34:
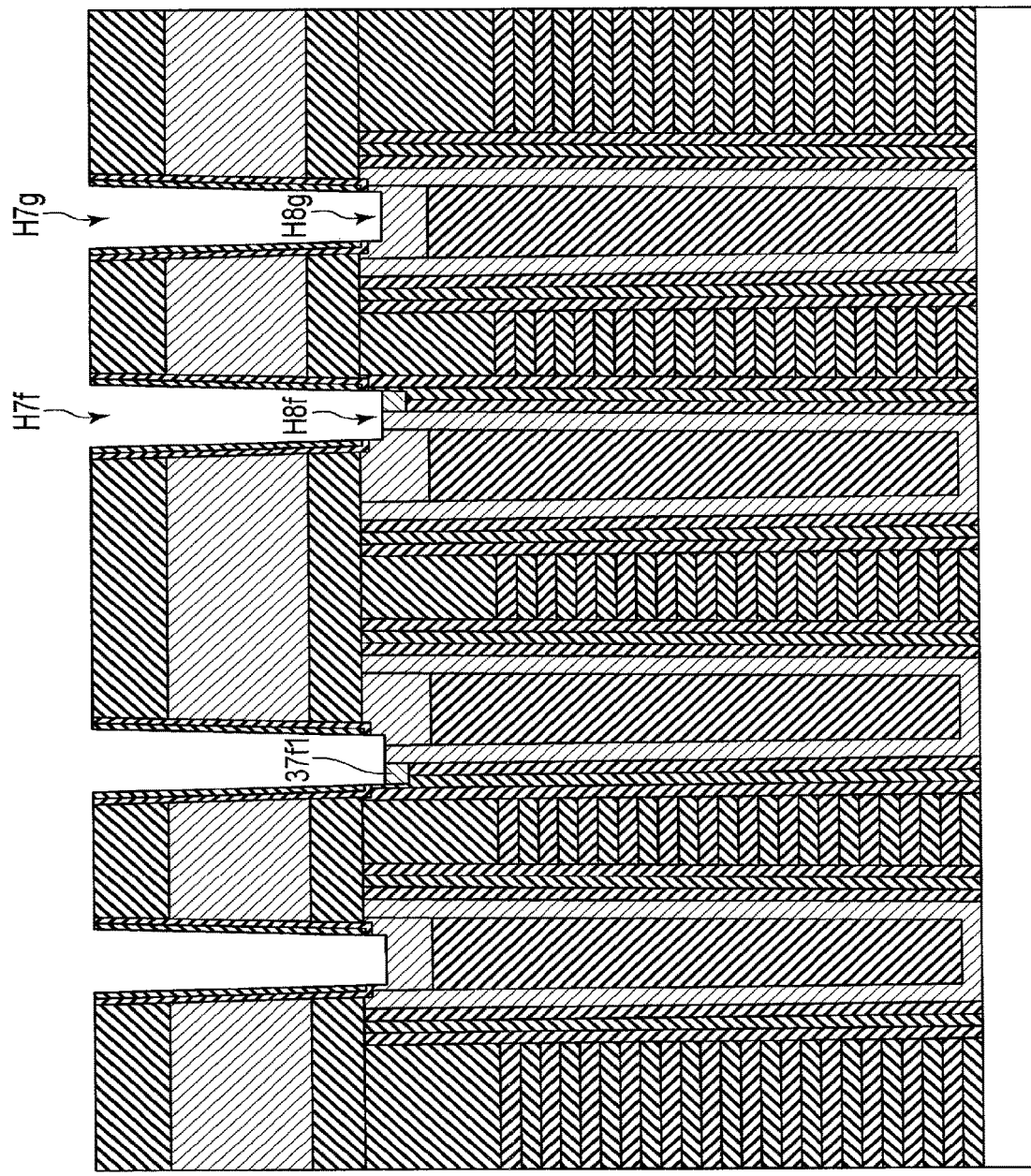
FIG. 34 is a cross-sectional view for explaining a manufacturing method of the memory cell array of the semiconductor memory according to the third embodiment.

Thereafter, as shown in FIG. 34, the oxide films 51f and 51g are removed.

Figure 35:
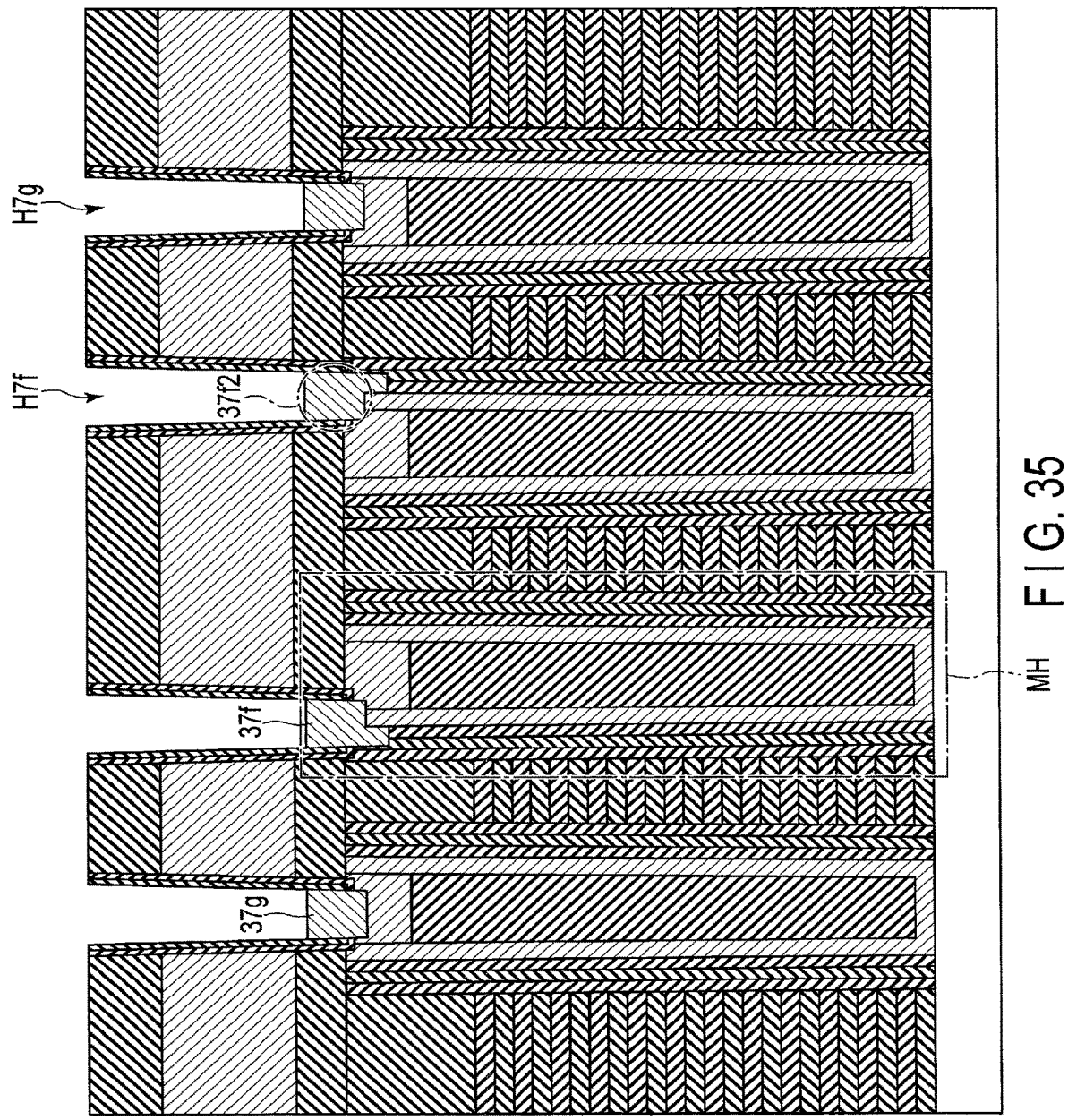
FIG. 35 is a cross-sectional view for explaining a manufacturing method of the memory cell array of the semiconductor memory according to the third embodiment.

Thereafter, as shown in FIG. 35, a portion 37/2 of the semiconductor film 37f is epitaxially grown from the semiconductor films 27 and 29 at the lower end of the hole H8f and the portion 37/1 of the semiconductor film 37f, and a semiconductor film 37g is epitaxially grown from the semiconductor films 27 and 29 at the lower end of the hole H8g, by selective CVD. Thereby, semiconductor films 37f and 37g are respectively buried in the holes H8f and H8g to a level above the memory structures MST and below the conductor 23, and the memory pillars MH are formed.

After the semiconductor film 37 is formed, the semiconductor films 37 and 29 are doped with $N^+$-type impurities by ion implantation, for example. Thereby, a contact resistance between the selection transistor ST1 and the memory cell transistor MT is further reduced.

Figure 36:
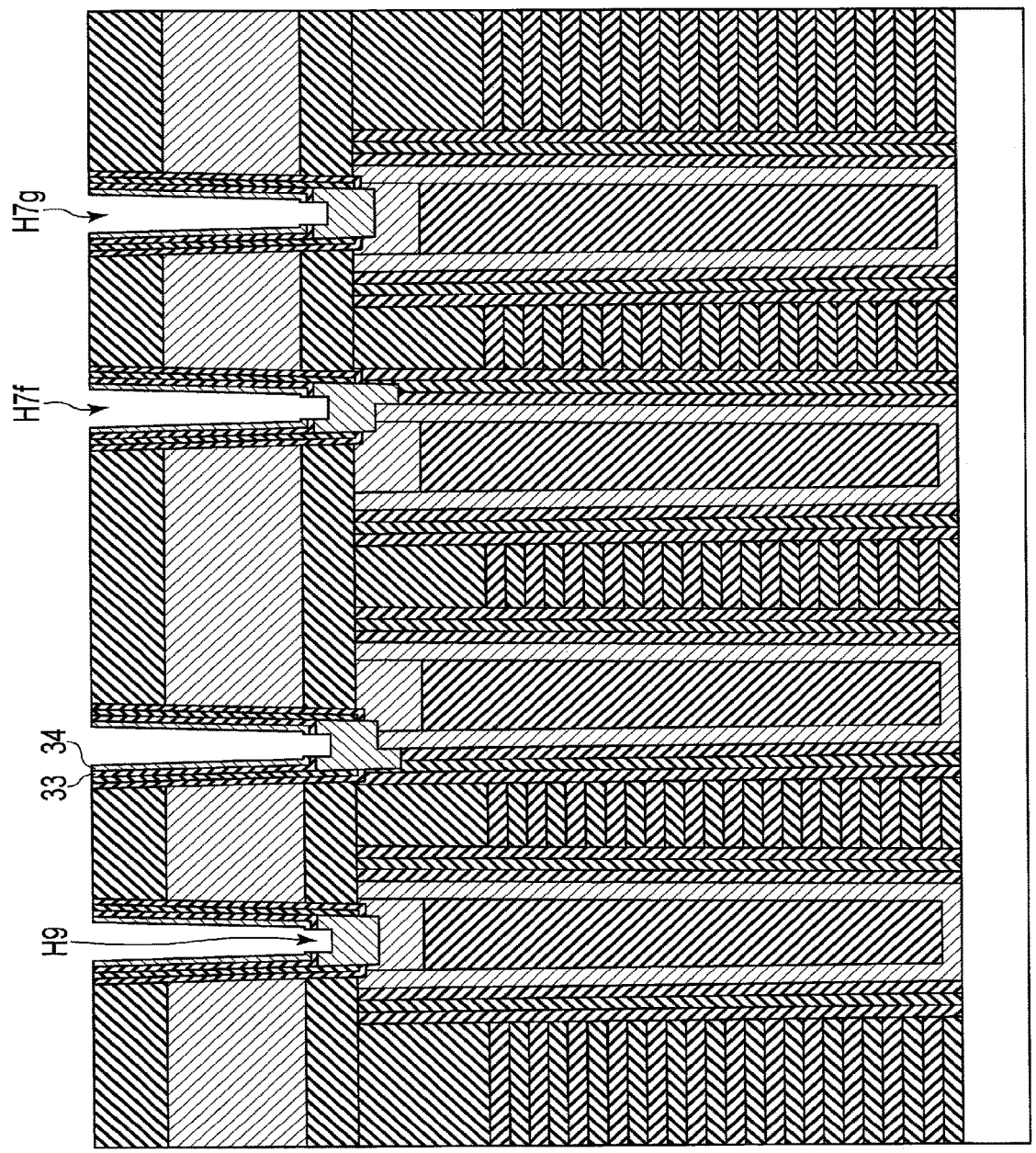
FIG. 36 is a cross-sectional view for explaining a manufacturing method of the memory cell array of the semiconductor memory according to the third embodiment.

Thereafter, as shown in FIG. 36, a tunnel oxide film 33 and a semiconductor film 34 are sequentially formed in a space on the semiconductor film 37f in the hole H7f and in a space on the semiconductor film 37g in the hole H7g. Thereafter, a hole H9 that penetrates the semiconductor film 34 and the tunnel oxide film 33 and reaches the semiconductor film 37 is formed by, for example, anisotropic etching.

Figure 37:
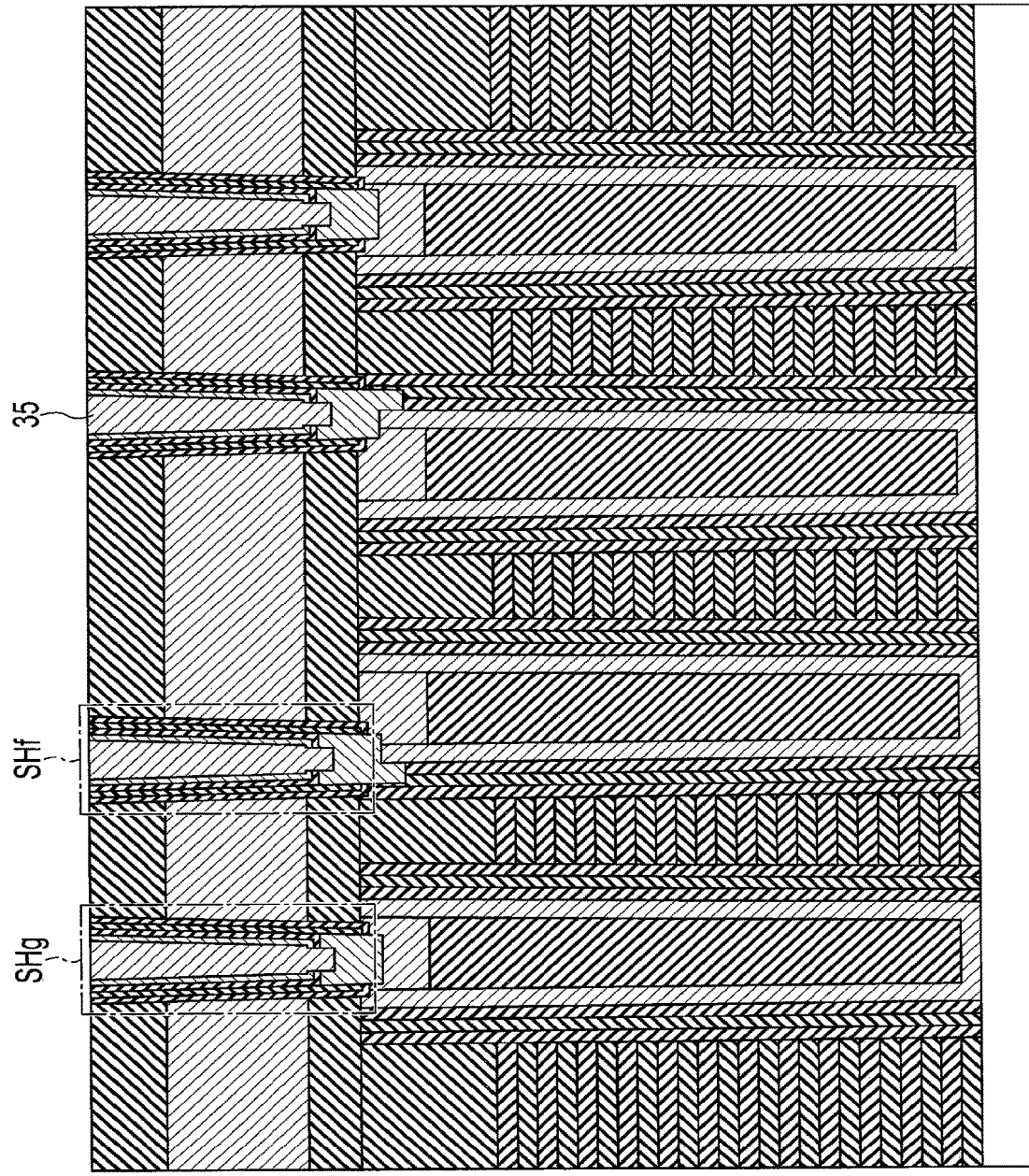
FIG. 37 is a cross-sectional view for explaining a manufacturing method of the memory cell array of the semiconductor memory according to the third embodiment.

Thereafter, as shown in FIG. 37, a semiconductor film 35 is formed so as to fill in the holes H9 and H7. The semiconductor film 35 may be formed by epitaxial growth or by CVD, for example. Thereby, the semiconductor films 34 and 35 are electrically coupled to the semiconductor films 27 and 29 via the semiconductor film 37.

Thereafter, replacement materials 41 and 42 are replaced with conductors 21 and 22, respectively, in a manner similar to FIG. 28 explained in the second embodiment. An insulation film 36 is formed in a position corresponding to a boundary of adjacent string units SU, in a manner similar to FIG. 29 explained in the second embodiment.

In the above-described manner, the process of forming the memory pillars MH and the selection transistor pillars SH is completed.

3. 3 Advantageous Effects of Present Embodiment

According to the third embodiment, holes H7 and H8 that reach memory structures MST are formed for formation of selection transistor pillars SH. When the center of the selection transistor pillar SH is greatly deviated from the center of the corresponding insulation film 28, a hole H8/1 is further formed in a hole. H8f by etching a block insulation film 24, an insulation film 25, and a tunnel oxide film 26 to a level deeper than the semiconductor films 27 and 29. The hole H8/1 is filled in by a portion 37/1 of the semiconductor film 37f epitaxially grown from the semiconductor film 27 on a side surface of the hole H8/1. Thereby, it is possible to ensure a contact area between the semiconductor film 35 and the semiconductor film 37f even in the case where the semiconductor film 35 is positioned immediately above the films 24 to 26 as a result of the deviation of the selection transistor pillar SH. Therefore, it is possible to suppress an increase in contact resistance in the NAND string NS.

Also, the semiconductor film 37f reaches a level above the memory structure MST and below the conductor 23, by further epitaxial growth from the state of filling in the hole H8/1. Thereby, it is possible to ease restrictions on the diameter of the hole H7, compared to the case where the semiconductor film 37 is not formed. In addition, in order to suppress an increase in contact resistance, it is preferable that the hole H9 in which the semiconductor film 35 is formed has a predetermined diameter. On the other hand, in order to improve the characteristics of the selection transistor ST1, it is preferable that the films 31 to 34 formed in the selection transistor pillar SH have a predetermined thickness.

More specifically, it is preferable that a stacked structure of a film of a high-dielectric material (e.g., an aluminum oxide (AlO)), for example, is applied to the block insulation film 31, in addition to a film of an oxide (e.g., a silicon dioxide ($SiO_2$). In this case, it is more preferable that the high dielectric material has a thickness of approximately three nanometers (nm), for example.

According to the third embodiment, a hole H8 that penetrates a block insulation film 31 and an insulation film 32 is formed after the block insulation film 31 and the insulation film 32 are sequentially formed on an inner wall of a hole H7. A semiconductor film 37 is formed by epitaxial growth in the hole H8 and a space of the hole H7 above the memory structure MST and below the conductor 23. That is, in the hole H7, the semiconductor film 37 is formed so as to be buried inside the block insulation film 31 and the insulation film 32. Subsequently, a tunnel oxide film 33 and a semiconductor film 34 are sequentially formed on an inner wall of a space above the semiconductor film 37. Thus, the block insulation film 31 and the insulation film 32 do not need to be formed on top of the semiconductor film 37. Thereby, the surface area of the semiconductor film 37 exposed to the inside of the hole H9 can be ensured on the side surface of the hole. H9 by the thickness of the block insulation film 31 and the insulation film 32, which are not formed on top of the semiconductor film 37, in addition to the height along the Z direction of the semiconductor film 37. Accordingly, it is possible to easily apply a configuration in which the block insulation film 31 includes a high-dielectric material, while increasing the area of the semiconductor film 37 exposed to the hole H9. Therefore, it is possible to improve the characteristics of the selection transistor ST1, while suppressing an increase in contact resistance of the NAND string NS.

Also, as described above, the block insulation film 31 and the insulation film 32 have been formed on the inner wall of the hole H7, at the time of formation of the semiconductor film 37. Thereby, the conductor 23 is covered with a block insulation film 31 and an insulation film 32 when the semiconductor film 37 is epitaxially grown. Accordingly, the effect caused by the epitaxial growth process on the conductor 23 can be reduced, thus reducing contamination in the NAND string NS.

3. 4. Modifications

The semiconductor memory according to the third embodiment is not limited to the examples described above, and can be modified in various ways. For example, the NAND string NS according to the third embodiment has been explained regarding the case where the semiconductor film 37 is formed to extend to a level above the memory structure MST and below the conductor 23; however, the configuration is not limited thereto. In the following, an explanation will be given only of the configurations different from the third embodiment.

Figure 38:
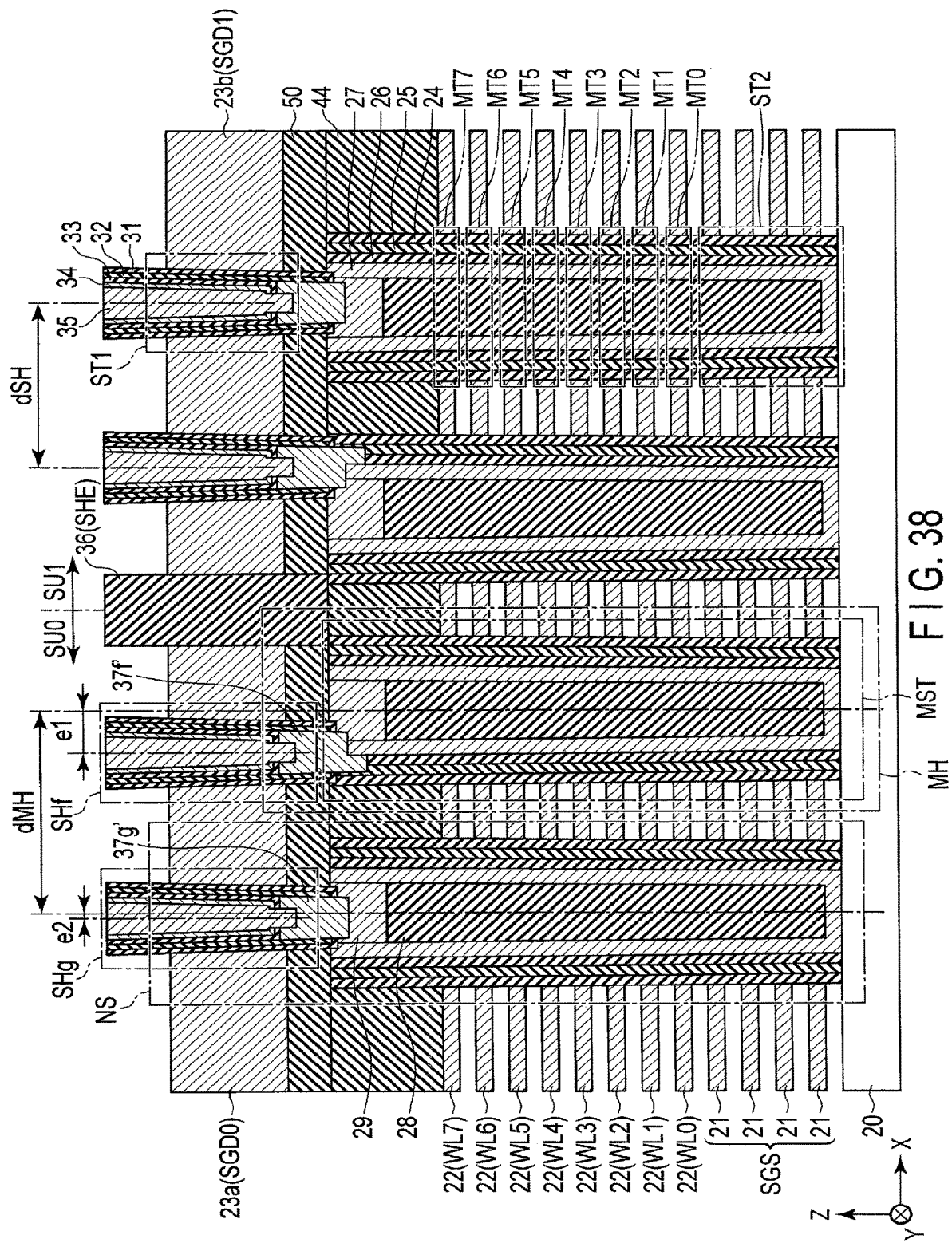
FIG. 38 is a cross-sectional view for explaining a configuration of a memory cell array of a semiconductor memory according to a modification of the third embodiment.

FIG. 38 is a cross-sectional view for explaining a configuration of a memory cell array of a semiconductor memory according to a modification of the third embodiment. FIG. 38 shows a case where a semiconductor film 37 reaches the interior of the conductor 23.

As shown in FIG. 38, the semiconductor film 37 is formed to a level that intersects with the conductor 23, penetrating the level that intersects with an insulation film 50. As described above, a block insulation film 31 and an insulation film 32 are formed in the hole in which the selection transistor pillar SH is to be formed, before the semiconductor film 37 is formed. Thereby, the conductor 23 and the semiconductor film 37 are electrically decoupled by the block insulation film 31 and the insulation film 32, even by forming the semiconductor film 37 to a level that intersects with the conductor 23. Accordingly, it is possible to further increase the surface area of the semiconductor film 35 that contacts the semiconductor film 37, while maintaining the function as a selection transistor ST1.

4. Fourth Embodiment

Next, a semiconductor memory according to a fourth embodiment will be described. In the first to third embodiments, a case has been explained where a semiconductor film 34 and a semiconductor film 27 are electrically coupled via a semiconductor film 35 that penetrates the portion stacked in the Z direction, of the insulation films formed on the inner wall of the hole in which the selection transistor pillar SH is to be formed. The fourth embodiment is different from the first to third embodiments mainly in that the semiconductor film 34 and the semiconductor film 27 are electrically coupled via a semiconductor film that penetrates a laterally stacked portion of the insulation films that are formed on the inner wall of the hole in which the selection transistor pillar SH is to be formed.

In the explanation that follows, mainly those configurations and manufacturing processes that are different from those of the first to third embodiments will be explained, and the explanation of similar configurations and manufacturing processes will be omitted.

4. 1 Configuration of Memory Cell Array

Figure 39:
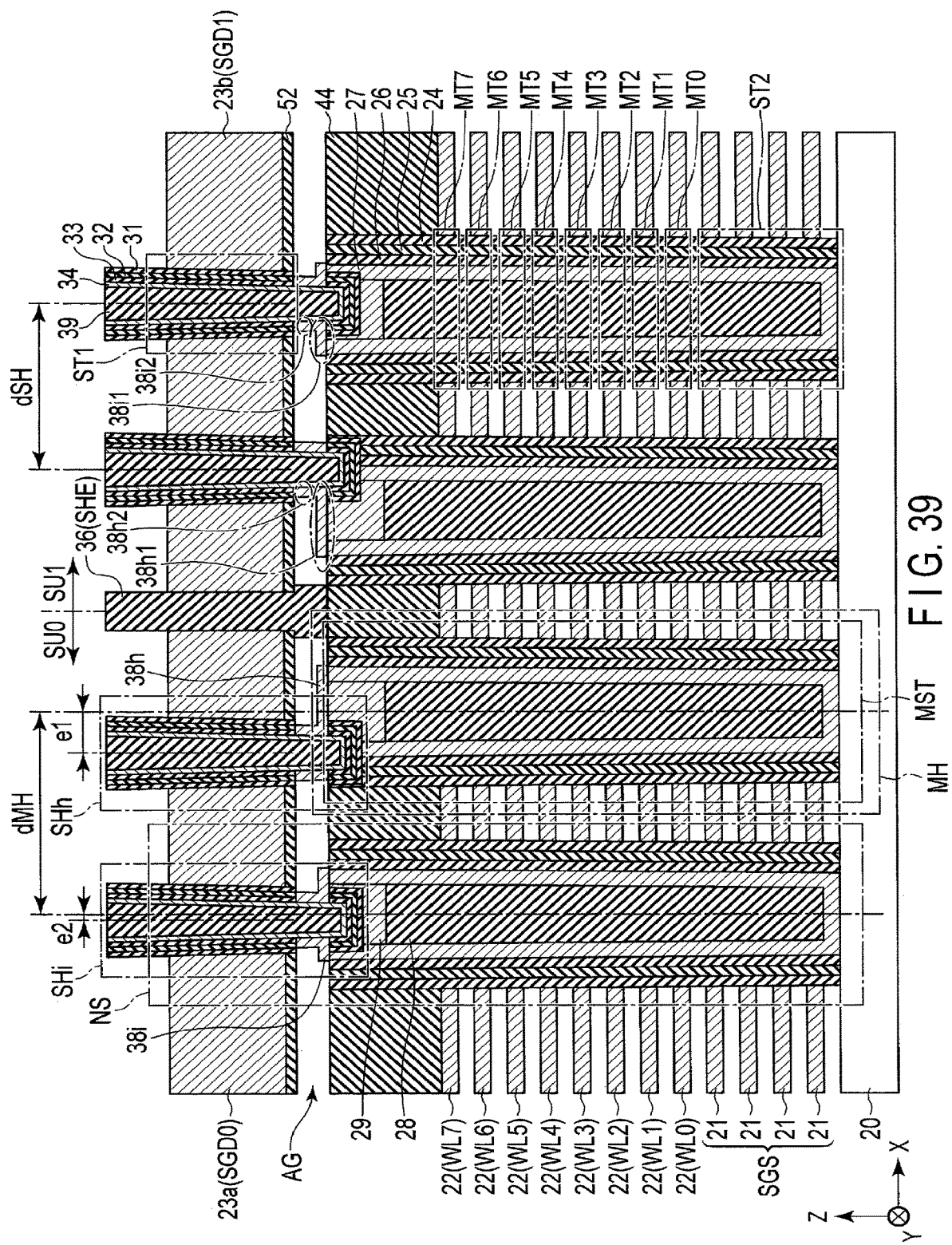
FIG. 39 is a cross-sectional view for explaining a configuration of a memory cell array of a semiconductor memory according to a fourth embodiment.

FIG. 39 is a cross-sectional view for explaining a configuration of a memory cell array of the semiconductor memory according to the fourth embodiment. FIG. 39 corresponds to, for example, FIG. 4 explained in the first embodiment. In FIG. 39, the illustration of the interlayer insulation films is suitably omitted, except for the film between the conductor 22 and the conductor 23.

As shown in FIG. 39, four-layer conductors 21, eight-layer conductors 22, and a single-layer conductor 23, for example, are stacked in this order via interlayer insulation films above a p-type well area 20. Memory structures MST with a configuration similar to that of FIG. 4 each of which is a portion of the memory pillar MH are provided to penetrate the conductors 22 and 21. Of the interlayer insulation films, insulation films 44 and 52 provided between the conductors 22 and the conductor 23 are shown in FIG. 39. The insulation film 52 is provided on the lower surface of the conductor 23. An air gap AG is formed between the insulation film 44 and the insulation film 52.

Each of selection transistor pillars SH (SHh and SHi) is provided on the corresponding memory structure MST. The selection transistor pillars SH are provided to penetrate the conductor 23, the insulation film 52, and the air gap AG, so as to reach the memory structure MST from above the conductor 23, for example. That is, the lower portion of the selection transistor pillar SH is buried on the corresponding memory structure MST. The selection transistor pillar SH includes, for example, a block insulation film 31, an insulation film 32, a tunnel oxide film 33, a semiconductor film 34, and an insulation film 39.

More specifically, holes in which the selection transistor pillars SHh and SHi are to be formed reach the memory structures MST, for example. In the example of FIG. 39, the selection transistor pillar SHh has a relatively large amount of deviation (deviation e1) from the center of the insulation film 28 which is a core portion of the memory pillar MH. Accordingly, the lower end of the hole in which the selection transistor pillar SHh is formed is positioned not only immediately above the semiconductor films 27 and 29, but also immediately above the block insulation film 24, the insulation film 25, and the tunnel oxide film 26. On the other hand, the selection transistor pillar SHi has a relatively small amount of deviation (deviation e2) from the center of the insulation film 28. Accordingly, the lower end of the hole in which the selection transistor pillar SHi is formed is not positioned immediately above the block insulation film 24, the insulation film 25, and the tunnel oxide film 26, but are positioned immediately above the semiconductor films 27 and 29.

The lower ends of the holes in which the selection transistor pillars SHh and SHi are formed may be in the shape of the lower end of the holes in which the selection transistor pillars SHc and SHd are formed in the second embodiment; however, the illustration thereof is omitted in the fourth embodiment for convenience in explanation.

A block insulation film 31 is provided on an inner wall of the hole in which each of the selection transistor pillars SHh and SHi is to be formed, an insulation film 32 is provided on an inner wall of the block insulation film 31, a tunnel oxide film 33 is provided on an inner wall of the insulation film 32, and a semiconductor film 34 is provided on an inner wall of the tunnel oxide film 33. An insulation film 39 is buried inside the semiconductor film 34.

The block insulation film 31, the insulation film 32, and the tunnel oxide film 33 are removed from portions of the selection transistor pillars SH between the insulation film 44 and the insulation film 52. In the area between the insulation film 44 and the insulation film 52, the semiconductor film 34 of the selection transistor pillar SHh and the semiconductor film 27 of the corresponding memory pillar MH are electrically coupled by a semiconductor film 38h. More specifically, the semiconductor film 38h electrically couples the semiconductor films 34 and 27, as a result of coupling between a portion 38h1 coupled to upper surfaces of the semiconductor films 27 and 29 which is an additional portion of the memory pillar MH, and a portion 38h2 coupled to an outer side surface of the semiconductor film 34 which is an additional portion of the selection transistor pillar SHh.

Similarly, in the area between the insulation film 44 and the insulation film 52, the semiconductor film 34 of the selection transistor pillar SHi and the semiconductor film 27 of a corresponding memory pillar MH are electrically coupled by a semiconductor film 38i. More specifically, the semiconductor film 38i electrically couples the semiconductor films 34 and 27, as a result of coupling between a portion 38i1 coupled to upper surfaces of the semiconductor films 27 and 29 which is an additional portion of the memory pillar MH, and a portion 38i2 coupled to an outer side surface of the semiconductor film 34 which is an additional portion of the selection transistor pillar SHi.

Each of the portions 38h1 and 38i1 of the semiconductor film 38 is formed by selective growth from the semiconductor films 27 and 29, as will be described below, and may therefore be regarded as portion of the semiconductor films 27 and 29. Each of the portions 38h2 and 38i2 of the semiconductor film 38 is formed by selective growth from the semiconductor film 34, and may therefore be regarded as portion of the semiconductor film 34.

The semiconductor film 38 may have an L-shaped cross section that couples the semiconductor film 34 and the semiconductor film 27 in a cross section parallel to the Z direction. The semiconductor film 38 includes, for example, polysilicon doped with N$^+$-type impurities. It is preferable that the semiconductor film 38 has a thickness of 5 to 10 nanometers (nm), for example. Thereby, the semiconductor film 34 is electrically coupled to the semiconductor films 27 and 29 via the semiconductor film 38. That is, the semiconductor film 38 functions as a contact that electrically couples the memory pillar MH and the selection transistor pillar SH.

In the area between the insulation film 44 and the insulation film 52, an air gap AG is formed lateral to the semiconductor film 38. A stack body above the insulation film 52 is supported by the selection transistor pillar SH and the insulation film 36.

4. 2 Manufacturing Method of Semiconductor Memory

Next, a manufacturing method of the semiconductor memory according to the fourth embodiment will be described in FIGS. 40 to 48. FIGS. 40 to 48 are cross-sectional views for explaining the manufacturing method of the semiconductor memory according to the fourth embodiment, in which mainly a process of forming a memory pillar MH and a selection transistor pillar SH, is shown. In the explanation that follows, let us assume that the string units SU0 and SU1 are formed substantially symmetrical to each other in the X direction, with the slit SHE formed at the center.

First, a process corresponding to FIGS. 5 to 7 described in the first embodiment is executed. That is, a stack body including replacement materials 41 and 42 and insulation films 43 and 44 is formed above a p-type well area 20, and memory structure MST that penetrates the stack body are formed.

Figure 40:
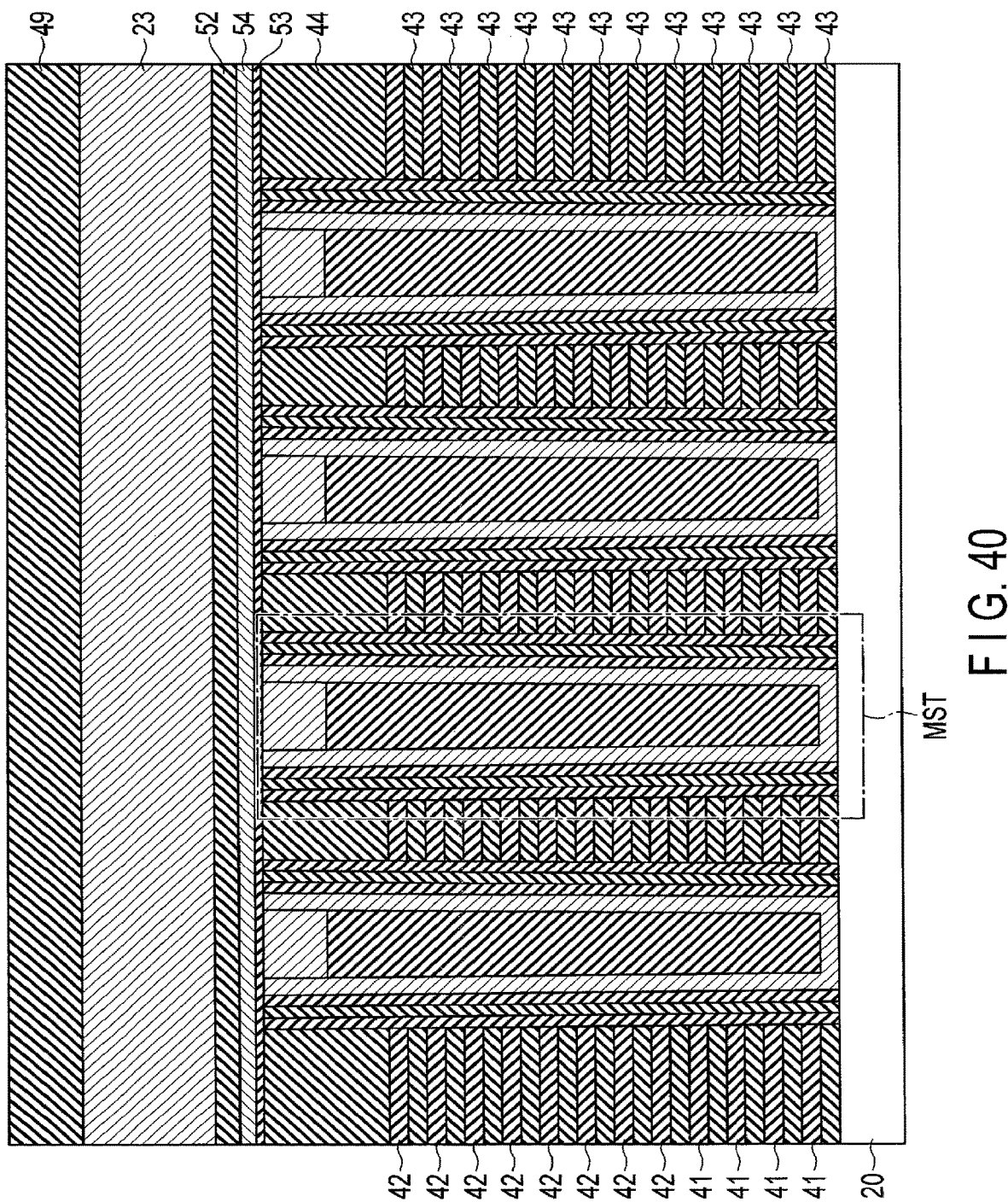
FIG. 40 is a cross-sectional view for explaining a manufacturing method of the memory cell array of the semiconductor memory according to the fourth embodiment.

Thereafter, as shown in FIG. 40, an insulation film 53, a semiconductor film 54, and an insulation film 52 are stacked in this order on the upper surfaces of the insulation film 44 and the memory structures MST. The insulation films 52 and 53 include, for example, an oxide (e.g., a silicon dioxide ($SiO_2$)), and the semiconductor film 54 includes, for example, amorphous silicon. A single-layer conductor 23 is provided on the insulation film 52, and an insulation film 49 is further provided on the conductor 23.

Figure 41:
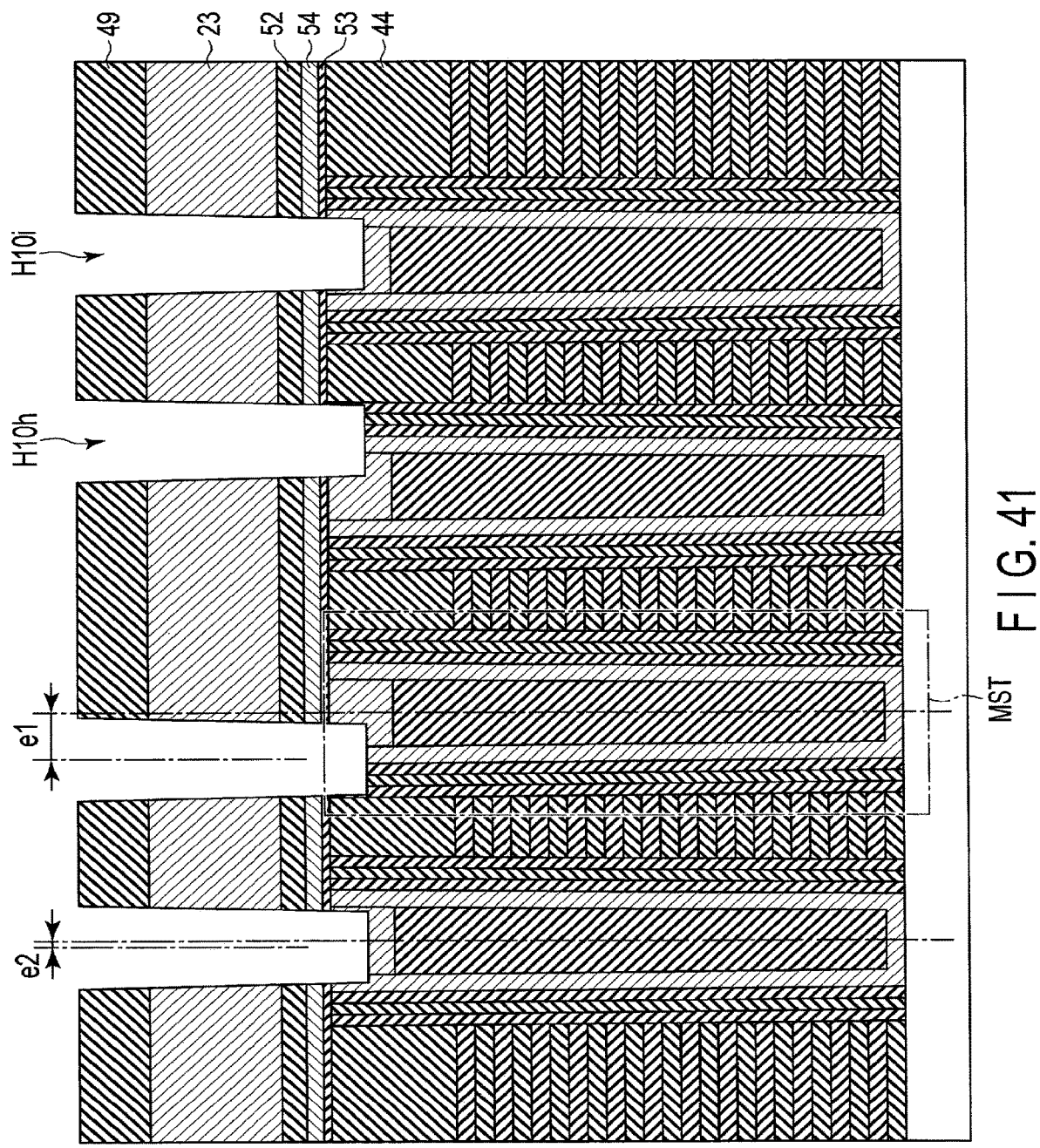
FIG. 41 is a cross-sectional view for explaining a manufacturing method of the memory cell array of the semiconductor memory according to the fourth embodiment.

Thereafter, as shown in FIG. 41, anisotropic etching is performed on areas in which selection transistor pillars SHh and SHi are to be formed. Thereby, holes H10 (H10h and H10i) that penetrate the insulation film 49, the conductor 23, the insulation film 52, the semiconductor film 54, and the insulation film 53, and reach the interior of the corresponding memory structure MST, are formed. The amount of deviation of the center of the hole H10 from the center of the insulation film 28 may differ according to the position of the hole H10. In the example shown in FIG. 41, the hole H10h has a relatively large amount of deviation (deviation e1) from center of the insulation film 28. On the other hand, the hole H10i has a relatively small amount of deviation (deviation e2) from the center of the insulation film 28. As described above, the illustration of the difference in etching depth between the semiconductor films 27 and 29, and the block insulation film 24, the insulation film 25, and the tunnel oxide film 26 is omitted.

Figure 42:
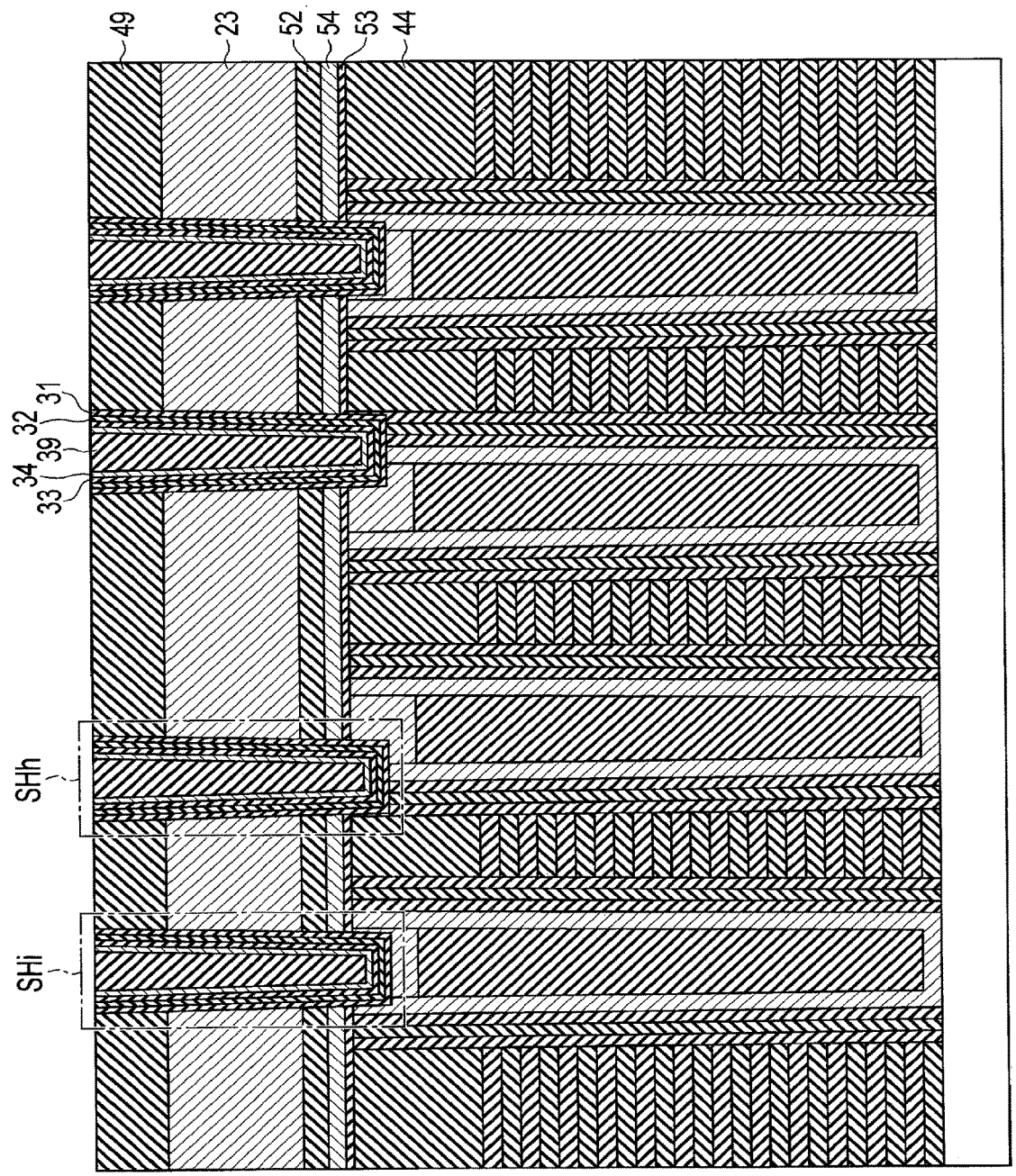
FIG. 42 is a cross-sectional view for explaining a manufacturing method of the memory cell array of the semiconductor memory according to the fourth embodiment.

Thereafter, as shown in FIG. 42, a block insulation film 31, an insulation film 32, a tunnel oxide film 33, and a semiconductor film 34 are sequentially formed in the hole H10. An insulation film 39 is buried inside the semiconductor film 34. Thereby, a structure which is a core portion of the selection transistor pillar SH is formed; however, the selection transistor pillar SH and the memory pillar MH are not electrically coupled at this point in time.

Figure 43:
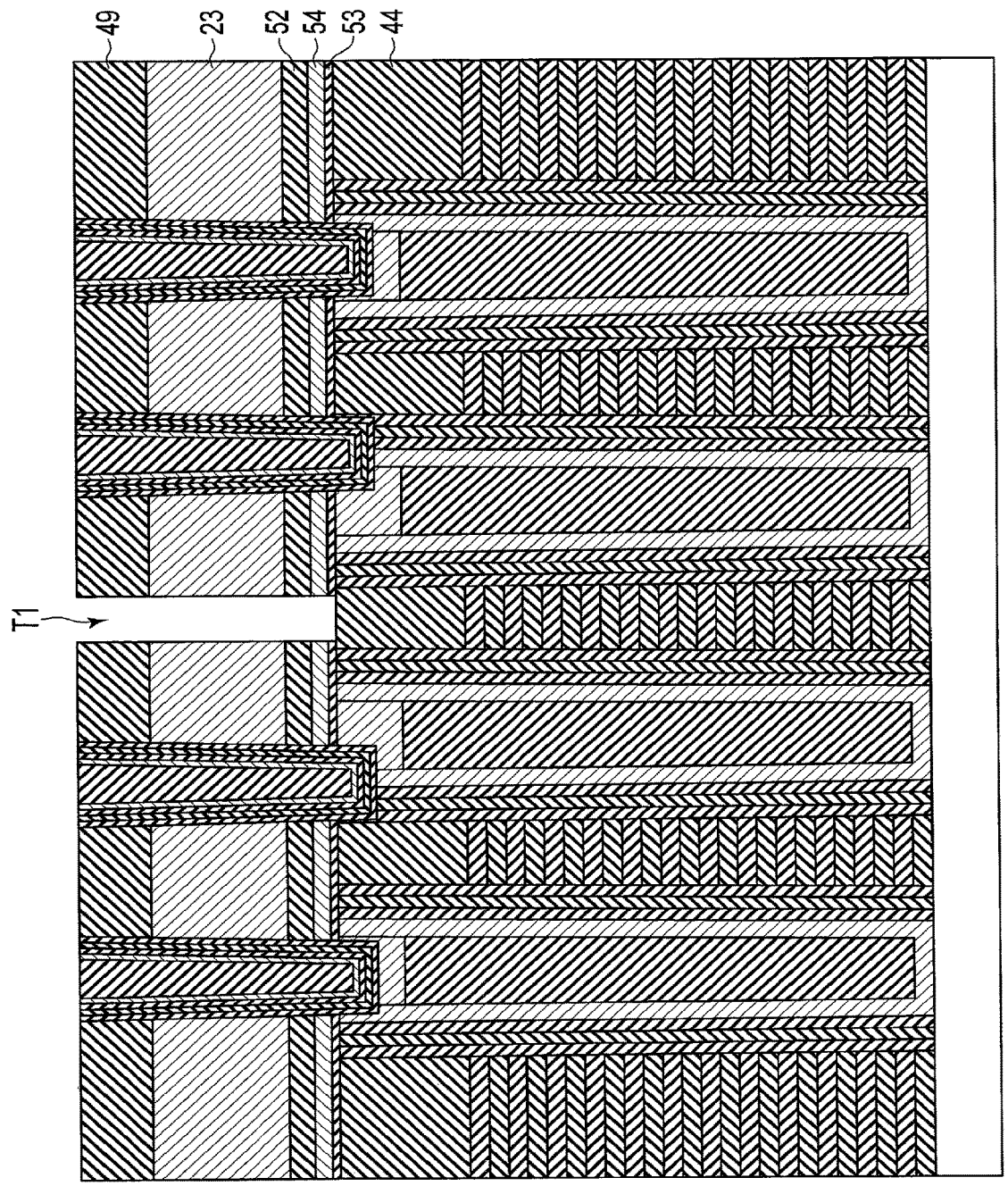
FIG. 43 is a cross-sectional view for explaining a manufacturing method of the memory cell array of the semiconductor memory according to the fourth embodiment.

Thereafter, as shown in FIG. 43, anisotropic etching is performed on areas in which a slit SHE is to be formed. Thereby, a trench T1 that penetrates the insulation film 49, the conductor 23, the insulation film 52, the semiconductor film 54, and the insulation film 53 and reaches the insulation film 44, for example, is formed.

Figure 44:
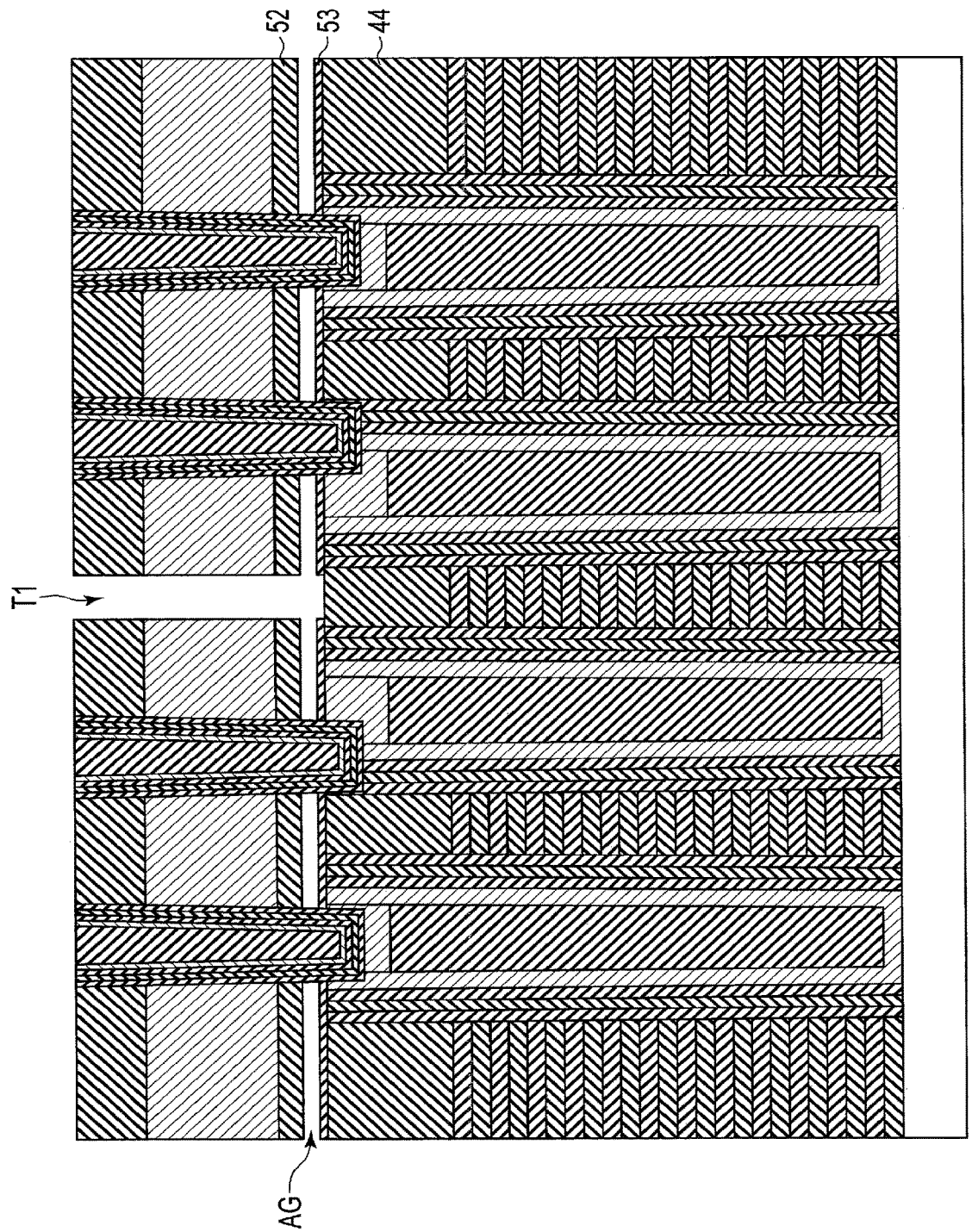
FIG. 44 is a cross-sectional view for explaining a manufacturing method of the memory cell array of the semiconductor memory according to the fourth embodiment.

Thereafter, as shown in FIG. 44, a semiconductor film 54 is removed via the trench T1. The semiconductor film 54 is removed by, for example, wet etching, which allows silicon to be selectively removed. Thereby, an air gap AG is formed in the layer in which the semiconductor film 54 was provided. The layers provided above the air gap AG are supported by a selection transistor pillar SH buried below the air gap AG.

Figure 45:
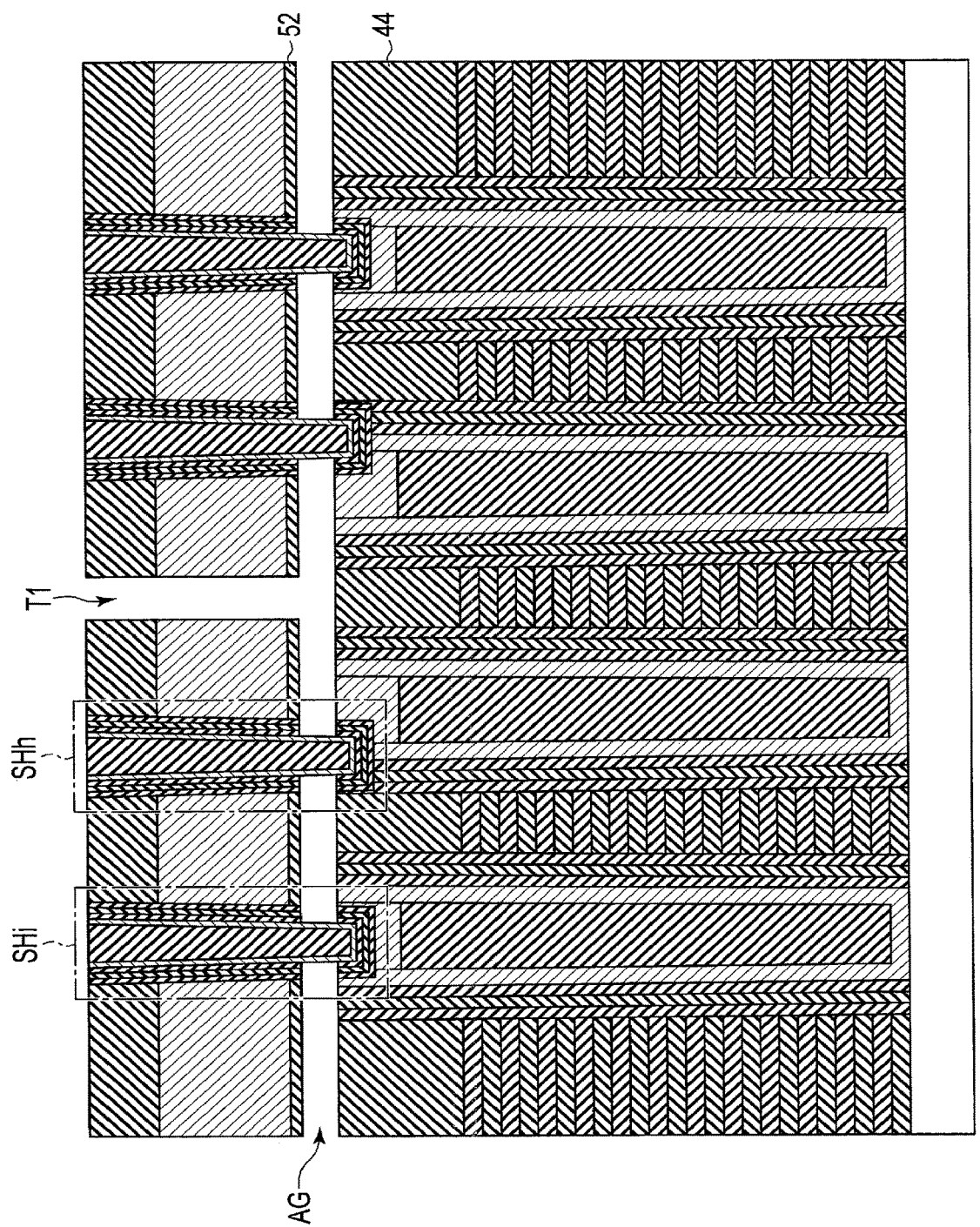
FIG. 45 is a cross-sectional view for explaining a manufacturing method of the memory cell array of the semiconductor memory according to the fourth embodiment.

Thereafter, as shown in FIG. 45, wet etching, which allows oxides to be selectively removed, is performed via the trench T1. Thereby, the portion of the layer in which the air gap AG is formed is removed from the block insulation film 31, the insulation film 32, and the tunnel oxide film 33 forming the selection transistor pillar SH, and the semiconductor film 34 is exposed. In accordance therewith, a portion of the insulation film 52 contacting the upper surface of the air gap AG is removed, the insulation film 53 contacting the lower surface of the air gap AG is removed, and the upper surfaces of the insulation film 44 and the memory structure MST are exposed.

As described above, the center of the selection transistor pillar SHh has a relatively large amount of deviation from the center of the corresponding insulation film 28. Accordingly, in the example of FIG. 45, the semiconductor film 27 (and 29) is exposed on one side of the selection transistor pillar SHh on the upper surface of the memory structure MST corresponding to the selection transistor pillar SHh. As described above, the center of the selection transistor pillar SHi has a relatively small amount of deviation from the center of the corresponding insulation film 28. Accordingly, in the example of FIG. 45, the semiconductor film 27 (and 29) is exposed on both sides interposing the selection transistor pillar SHi on the upper surface of the memory structure MST corresponding to the selection transistor pillar SHi.

Figure 46:
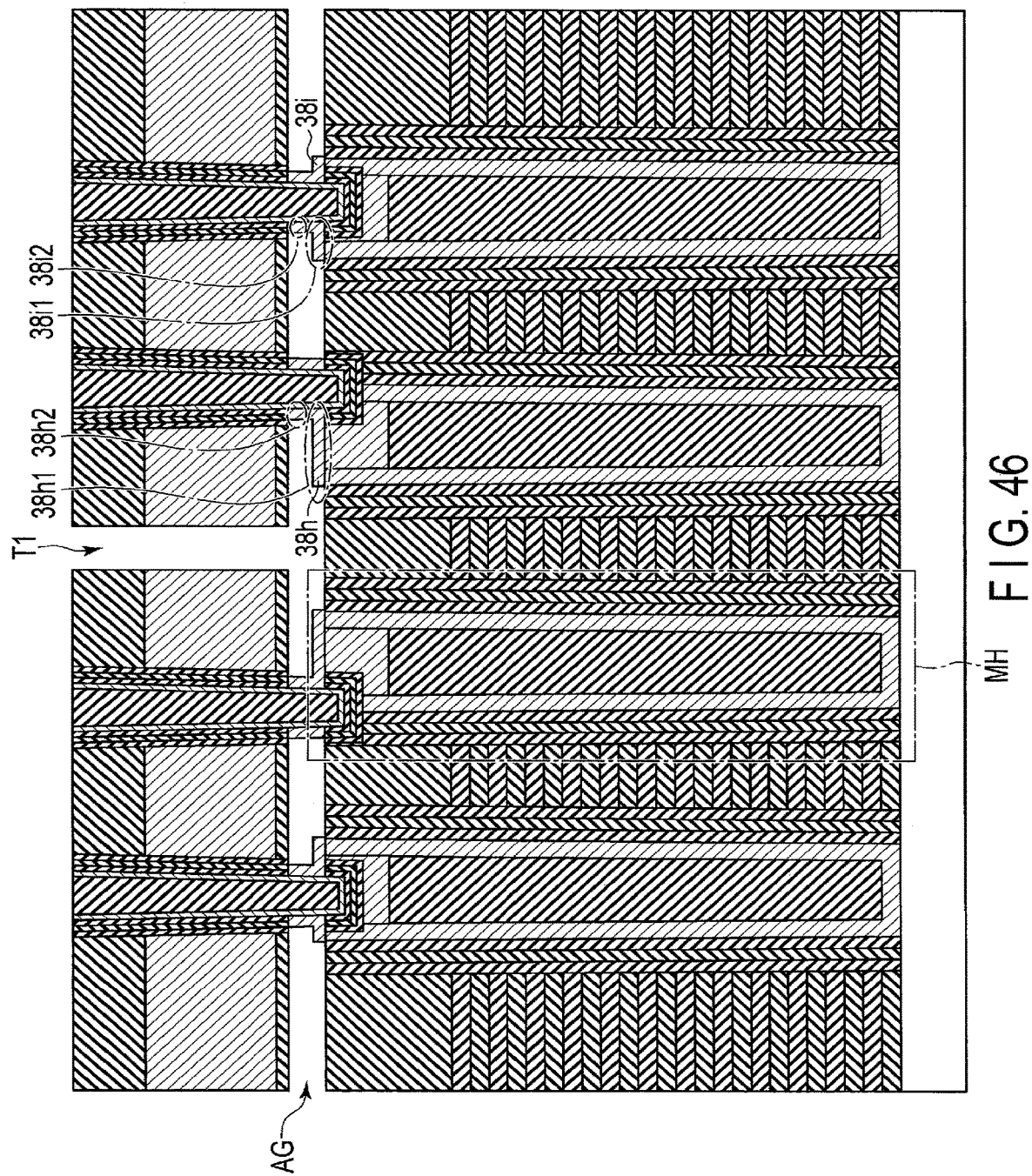
FIG. 46 is a cross-sectional view for explaining a manufacturing method of the memory cell array of the semiconductor memory according to the fourth embodiment.

Thereafter, as shown in FIG. 46, polysilicon is selectively formed by selective CVD via a trench T1. Thereby, semiconductor films 38 (38h and 38i) are formed in a self-aligned positional relationship, on the semiconductor films 27 and 29 exposed to the upper surface of the memory structure MST, and on the semiconductor film 34 exposed to the side surface of the selection transistor pillar SH. More specifically, the portion 38h1 of the semiconductor film 38h that grows along the Z direction from the semiconductor films 27 and 29, and the portion 38h2 of the semiconductor film 38h that grows along the lateral direction from the semiconductor film 34, may be integrally formed as the growth advances. Similarly, the portion 38i1 of the semiconductor film 38i and the portion 38i2 of the semiconductor film 38i may be integrally formed as the growth advances. Thereby, both of the semiconductor films 38h and 38i include an L-shaped portion in a cross section taken along the Z direction. Accordingly, the semiconductor film 34 can be electrically coupled to the semiconductor film 27 via the semiconductor films 38 and 29. Thereby, the memory pillars MH, and the selection transistor pillars SHh and SHi are formed.

The semiconductor film 29 is formed by being doped with $N^+$-type impurities by ion implantation, for example, and the semiconductor film 38 is formed while being doped with $N^+$-type impurities (in-situ), for example. Thereby, a contact resistance between the selection transistor ST1 and the memory cell transistor MT is further reduced.

Figure 47:
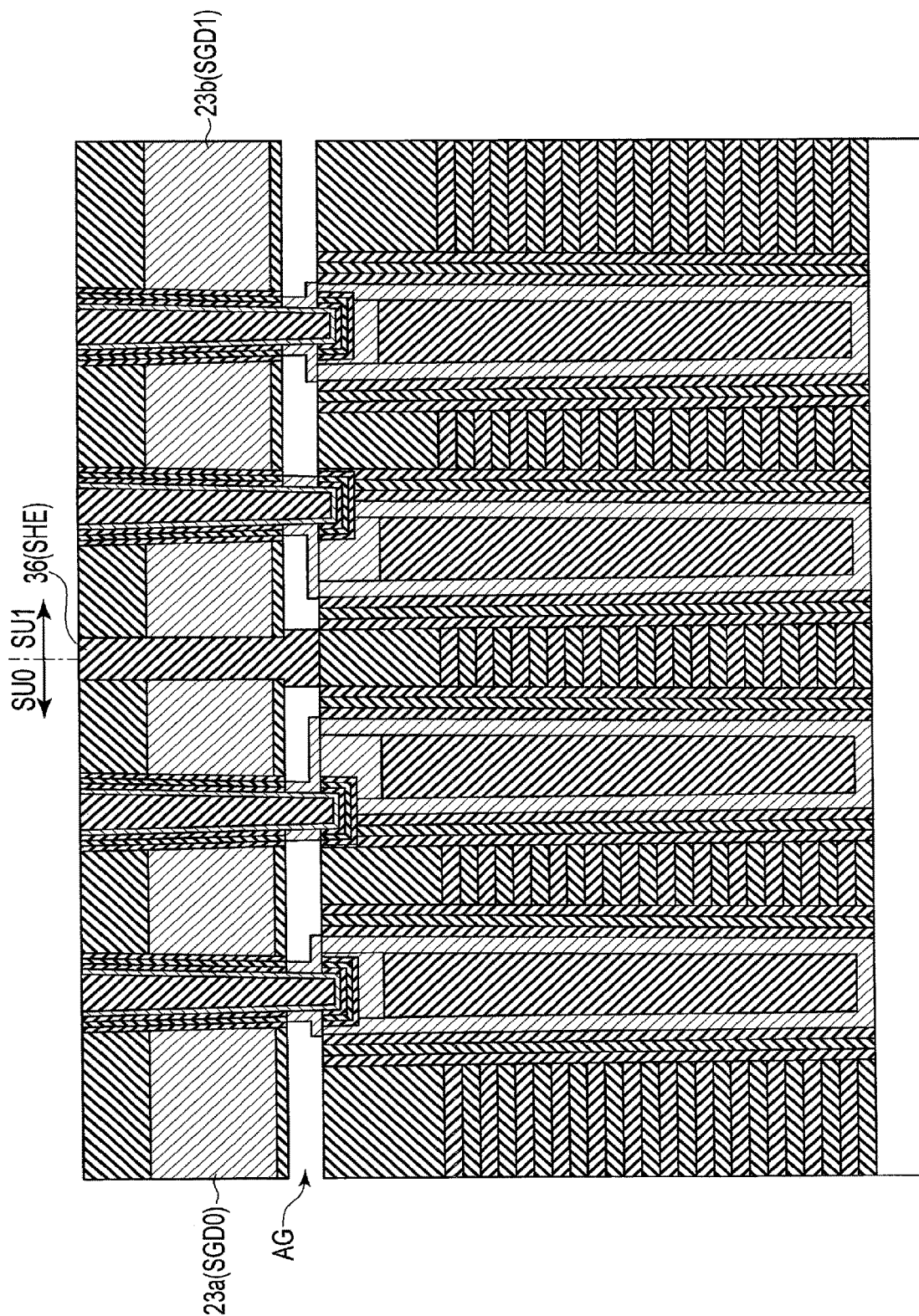
FIG. 47 is a cross-sectional view for explaining a manufacturing method of the memory cell array of the semiconductor memory according to the fourth embodiment.

Thereafter, an insulation film 36 is buried in the trench T1, as shown in FIG. 47. The air gap AG is not filled in simultaneously with the trench T1, and is maintained. Thereby, the conductor 23 is divided into conductors 23a and 23b, which are electrically decoupled from each other. The conductors 23a and 23b function as a selection gate line SGD0 of the string unit SU0 and as a selection gate line SGD1 of the string unit SIll, respectively.

Figure 48:
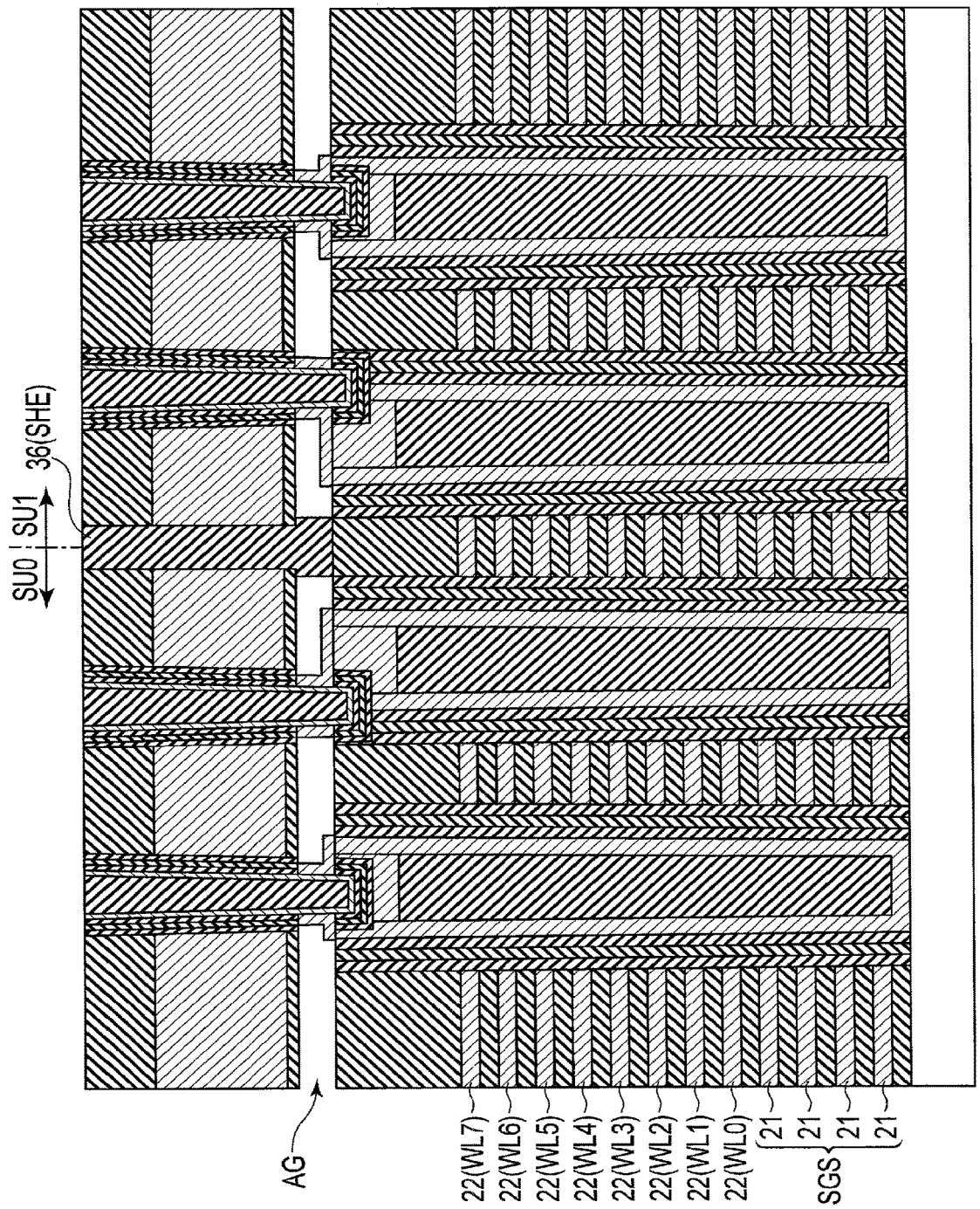
FIG. 48 is a cross-sectional view for explaining a manufacturing method of the memory cell array of the semiconductor memory according to the fourth embodiment.

Thereafter, as shown in FIG. 48, the replacement materials 41 and 42 are replaced with the conductors 21 and 22, respectively. Since the replacement materials 41 and 42 are nitride films, as described above, they can be removed simultaneously by wet etching, which allows nitride films to display a higher selectivity than the insulation films 43, 44, 49 and 52, which are oxide films, for example. Thereafter, conductors 21 and 22 are formed in a space generated by removing the replacement materials 41 and 42. The conductors 21 and 22 respectively function as a selection gate line SGS and word lines WL0 to WL7.

In the above-described manner, the process of forming the memory pillars MH and the selection transistor pillars SH is completed.

4. 3 Advantageous Effects of Present Embodiment

According to the fourth embodiment, the semiconductor film 38 contacts the semiconductor film 34 in the area above the memory structure MST and below the conductor 23, and contacts the semiconductor films 27 and 29 on the upper surface of the memory structure MST. Accordingly, the semiconductor films 27 and 29 are electrically coupled to the semiconductor film 34 via the semiconductor film 38. Therefore, it is possible to ensure a contact area between the selection transistor pillar SH and the memory pillar MH without forming a hole in the lower surface of the selection transistor pillar SH, thus suppressing an increase in contact resistance in the NAND string NS.

The semiconductor film 38 grows sideways of the selection transistor pillar SH from the semiconductor film 34, and grows upward from the semiconductor films 27 and 29. Thereby, the portion 38h1 of the semiconductor film 38h formed on the semiconductor film 34 and the portion 38h2 of the semiconductor film 38h formed on the semiconductor films 27 and 29 are integrally formed, and the cross section taken along the vertical direction of the surface of the semiconductor substrate takes an L shape.

In the area above the memory structure MST and below the conductor 23, an air gap AG is formed lateral to the semiconductor film 38. Thereby, it is possible to form a low-dielectric layer between the memory pillar MH and the selection transistor pillar SH, thus reducing the parasitic capacitance.

5. Others

The above-described first to fourth embodiments of the present invention can be modified as in the following, for example.

The conductor 23 is explained in the first embodiment as being formed of four layers; however, the configuration is not limited thereto. For example, the conductor 23 in the first embodiment may be formed of a single layer, in which case, the conductor 23 is formed during the stacking process until the formation of the insulation film 49 shown in FIG. 12. The conductor 23 is explained in the second to fourth embodiments as being formed of a single layer; however, the configuration is not limited thereto. For example, the conductor 23 in the second to fourth embodiments may be formed in multiple layers, in which case, the conductor 23 may be formed by replacement simultaneously with the replacement of the conductors 21 and 22 with the replacement materials 41 and 42. In the case where the conductor 23 is formed of multiple layers in a modification of the third embodiment, the conductor 23 at the lowermost layer may function as a dummy electrode.

The oxide film 51 is explained in the second and third embodiments as being formed on the semiconductor films 27 and 29; however, the configuration is not limited thereto. For example, when the oxide film 51 is negligible in the second and third embodiments, the process explained in the second embodiment with reference to FIGS. 22 and 23 and the process explained in the third embodiment with reference to FIGS. 33 and 34 may be omitted.

Part or all of the above-described embodiments may be expressed as in the following descriptions, but the configuration is not limited thereto.

[Description 1]

A manufacturing method of a semiconductor device, comprising:

forming, above a substrate, a first stack body in which a first material and a first insulation layer are alternately stacked, and forming a first hole that penetrates the first stack body in a direction in which the first material and the first insulation layer are stacked;

forming, in the first hole, a first structure including a first insulator, a first portion of a first semiconductor that covers an upper surface and an outer side surface of the first insulator, and a second insulator that covers an outer side surface of the first portion of the first semiconductor;

forming a second portion of the first semiconductor having a lower surface greater than an upper surface of the first portion of the first semiconductor by selectively growing the first semiconductor from the upper surface of the first portion of the first semiconductor;

forming, above the second portion of the first semiconductor, a second stack body in which a second material and a second insulation layer are stacked, and forming a second hole that penetrates the second stack body in a direction in which the second material and the second insulation layer are stacked and that reaches the second portion of the first semiconductor; and forming, in the second hole, a pillar including a second semiconductor electrically coupled to the first semiconductor and a third insulator that covers an outer side surface of the second semiconductor.

[Description 2]

A manufacturing method of a semiconductor device, comprising:

forming, above a substrate, a first stack body in which a first material and a first insulation layer are alternately stacked, and forming a first hole that penetrates the first stack body in a direction in which the first material and the first insulation layer are stacked;

forming, in the first hole, a structure including a first insulator, a first portion of a first semiconductor that covers an upper surface and an outer side surface of the first insulator, and a second insulator that covers an outer side surface of the first portion of the first semiconductor;

forming, above the structure, a second stack body in which a second material and a second insulation layer are stacked, and forming a second hole that penetrates the second stack body in a direction in which the second material and the second insulation layer are stacked and that reaches the structure, the second hole including a step portion configured in such a manner so that an upper surface of the second insulator is positioned below an upper surface of the first portion of the first semiconductor at a lower end of the second hole;

forming a second portion of the first semiconductor on a side surface of the first portion of the first semiconductor in the step portion, and filling in the step portion by the second portion of the first semiconductor; and forming, in the second hole with the filled-in step portion, a pillar including a second semiconductor electrically coupled to the first semiconductor and a third insulator that covers an outer side surface of the second semiconductor.

[Description 3]
A manufacturing method of a semiconductor device, comprising:
  forming, above a substrate, a first stack body in which a first material and a first insulation layer are alternately stacked, and forming a first hole that penetrates the first stack body in a direction in which the first material and the first insulation layer are stacked;
  forming, in the first hole, a first structure including a first insulator, a first portion of a first semiconductor formed on an upper surface and an outer side surface of the first insulator, and a second insulator that covers an outer side surface of the first portion of the first semiconductor;
  forming a sacrificial material on the first stack body and the first structure;
  forming, above the sacrificial material, a second stack body in which the second material and the second insulation layer are stacked, and forming a second hole that penetrates the second stack body and the sacrificial material in a direction in which the second material and the second insulation layer are stacked and that reaches the first structure;
  forming, in the second hole, a second structure including a first portion of a second semiconductor that extends in a direction in which the second material and the second insulation layer are stacked, and a third insulator that covers an outer side surface of the first portion of the second semiconductor;
  removing the sacrificial material and a portion of the third insulator positioned between the sacrificial material and the first portion of the second semiconductor; and
  forming a second portion of the first semiconductor on the first portion of the first semiconductor that is exposed by removal of the sacrificial material, and forming a second portion of the second semiconductor on the first portion of the second semiconductor that is exposed by removal of the portion of the third insulator, and coupling the second portion of the first semiconductor and the second portion of the second semiconductor.

While certain embodiments have been described, these embodiments have been presented by way of example only, and are not intended to limit the scope of the embodiments. Indeed, the novel embodiments described herein may be embodied in a variety of other forms; furthermore, various omissions, substitutions and changes in the form of the embodiments described herein may be made without departing from the spirit. The embodiments and modifications are included in the scope and gist of the invention, and also included in the invention recited in the claims and the scope of equivalents of the invention.

What is claimed is:
1. A semiconductor device comprising:
a substrate;
a first stack body which is provided above the substrate and in which a first insulation layer and a first conductive film are alternately stacked;
a first pillar provided to penetrate the first stack body in a direction in which the first insulation layer and the first conductive film are stacked, the first pillar including a first insulator, a first portion of a first semiconductor provided on an upper surface and an outer side surface of the first insulator, a second insulator provided on an outer side surface of the first portion of the first semiconductor, and a second portion of the first semiconductor that is provided above the first stack body, that is coupled to an upper surface of the first portion of the first semiconductor, and that includes a lower surface greater than the upper surface of the first portion of the first semiconductor;
an oxide film provided on a side surface of the second portion of the first semiconductor;
a second stack body which is provided above the second portion of the first semiconductor and the oxide film and in which a second insulation layer and a second conductive film are stacked; and
a second pillar provided to penetrate the second stack body in a direction in which the second insulation layer and the second conductive film are stacked, the second pillar including a second semiconductor electrically coupled to the first semiconductor and a third insulator provided on an outer side surface of the second semiconductor.

2. The device of claim 1, wherein
an outer periphery of the lower surface of the second portion of the first semiconductor is positioned at a substantially equal distance in width from an outer periphery of the upper surface of the first portion of the first semiconductor.

3. The device of claim 1, wherein
the second portion of the first semiconductor and the oxide film are provided in a same layer.

4. The device of claim 1, wherein
the second portion of the first semiconductor has a dome shape.

5. The device of claim 1, wherein
the second portion of the first semiconductor includes a polysilicon doped with $N^+$-type impurities.

6. The device of claim 1, wherein
the third insulator includes:
  a first oxide provided on an outer side surface of the second semiconductor;
  a first nitride provided on an outer side surface of the first oxide; and
  a second oxide provided on an outer side surface of the first nitride.

7. The device of claim 1, wherein
a center of the first pillar and a center of the second pillar are deviated from each other.

8. The device of claim 7, wherein
a first string, a second string, and a third string are provided on the substrate, each of the first string, the second string, and the third string including the first pillar and the second pillar, and
wherein the second conductive film includes a first portion of the second conductive film that intersects with the second pillar of the first string and the second pillar of the second string, and a second portion of the second conductive film that intersects with the second pillar of the third string and that is electrically decoupled from the first portion of the second conductive film, and
the first pillar of the first string, the first pillar of the second string, and the first pillar of the third string are arranged at a substantially equal distance above the substrate.

9. The device of claim 8, further comprising:
a fourth insulator formed above the first pillar of the second string and the first pillar of the third string, and configured to electrically decouple the first portion of the second conductive film and the second portion of the second conductive film.

* * * * *